(12) United States Patent
Carichner et al.

(10) Patent No.: US 7,548,125 B2
(45) Date of Patent: *Jun. 16, 2009

(54) FREQUENCY CALIBRATION FOR A MONOLITHIC CLOCK GENERATOR AND TIMING/FREQUENCY REFERENCE

(75) Inventors: Gordon Carichner, Saline, MI (US); Michael Shannon McCorquodale, Ann Arbor, MI (US); Scott Michael Pernia, Pinckney, MI (US); Sundus Kubba, Saline, MI (US)

(73) Assignee: Mobius Microsystems, Inc., Sunnyvale, CA (US)

( * ) Notice: Subject to any disclaimer, the term of this patent is extended or adjusted under 35 U.S.C. 154(b) by 79 days.

This patent is subject to a terminal disclaimer.

(21) Appl. No.: 11/805,427

(22) Filed: May 23, 2007

(65) Prior Publication Data

US 2007/0222529 A1 Sep. 27, 2007

Related U.S. Application Data

(63) Continuation-in-part of application No. 11/232,409, filed on Sep. 20, 2005, now Pat. No. 7,248,124, which is a continuation-in-part of application No. 11/084,962, filed on Mar. 21, 2005, now Pat. No. 7,227,423.

(60) Provisional application No. 60/555,193, filed on Mar. 22, 2004.

(51) Int. Cl.
*G01R 23/00* (2006.01)
*H03B 5/12* (2006.01)

(52) U.S. Cl. .................................... 331/44; 331/179
(58) Field of Classification Search ................ 331/1 A, 331/10, 11, 14, 16–18, 25, 34, 36 R, 36 C, 331/36 L, 44, 175, 177 R, 177 V, 179–181
See application file for complete search history.

(56) References Cited

U.S. PATENT DOCUMENTS 7,248,124 B2 * 7/2007 McCorquodale et al. ...... 331/44

* cited by examiner

*Primary Examiner*—David Mis
(74) *Attorney, Agent, or Firm*—Nancy R. Gamburd; Gamburd Law Group LLC

(57) ABSTRACT

Exemplary embodiments of the invention provide a system, method and apparatus for frequency calibration of a free-running, reference harmonic oscillator. An exemplary system comprises the harmonic oscillator, a frequency divider, a comparator, and a reactance modulator. The reference harmonic oscillator includes a plurality of switchable reactance modules controlled by corresponding coefficients, and provides an oscillation signal having an oscillation frequency, which is divided or multiplied by the frequency divider to provide an output signal having an output frequency. The comparator compares the output frequency to an externally supplied reference frequency using first and second predetermined levels of discrimination, and provides first or second comparison signals when the output frequency is higher or lower than the reference frequency. The reactance modulator determines a plurality of coefficients to control switching of the plurality of switchable reactance modules to increase or decrease a reactance of the oscillator in response to the first and second comparison signals.

59 Claims, 37 Drawing Sheets

300

TEMPERATURE/BIAS DEPENDENCE

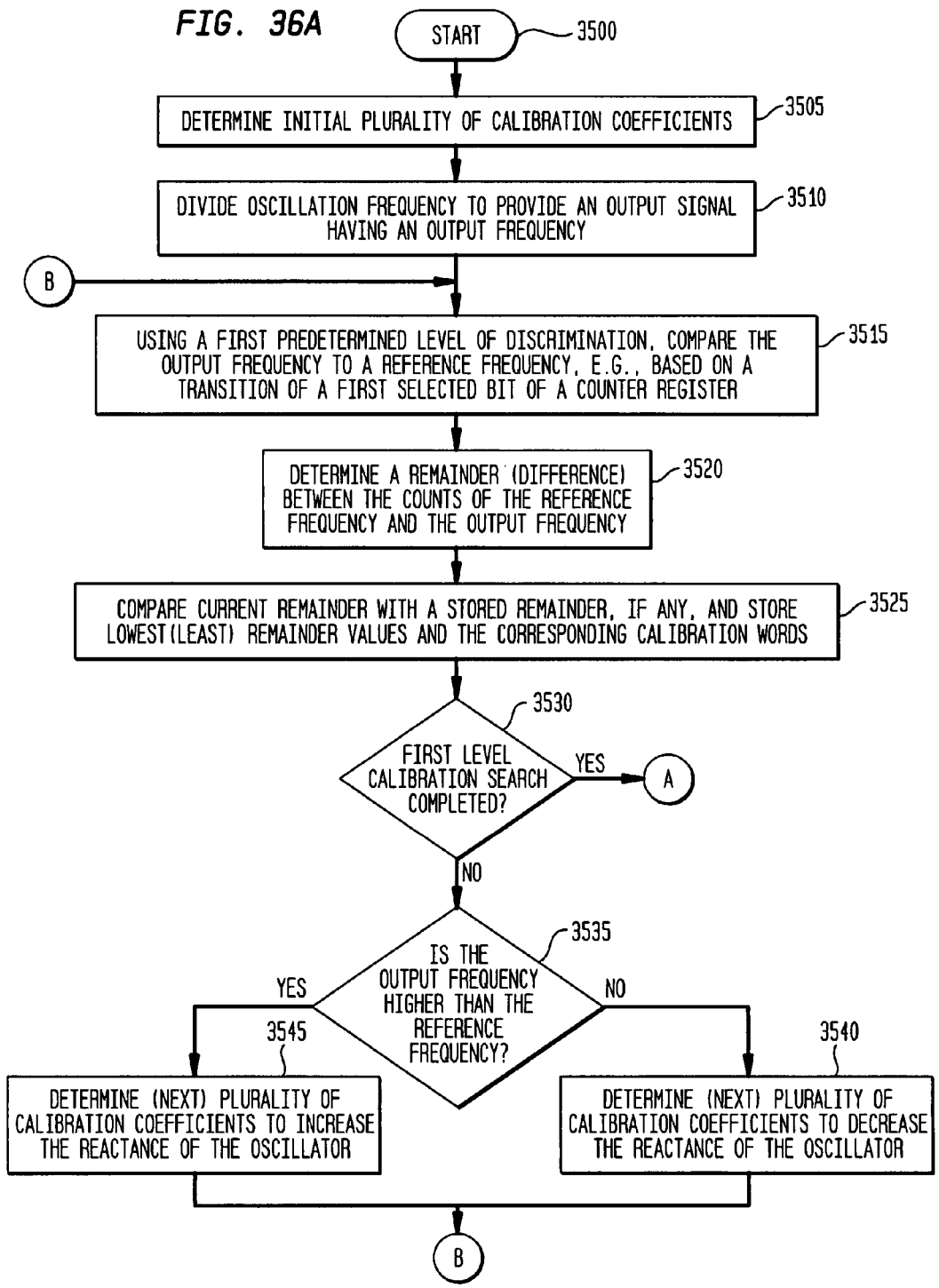

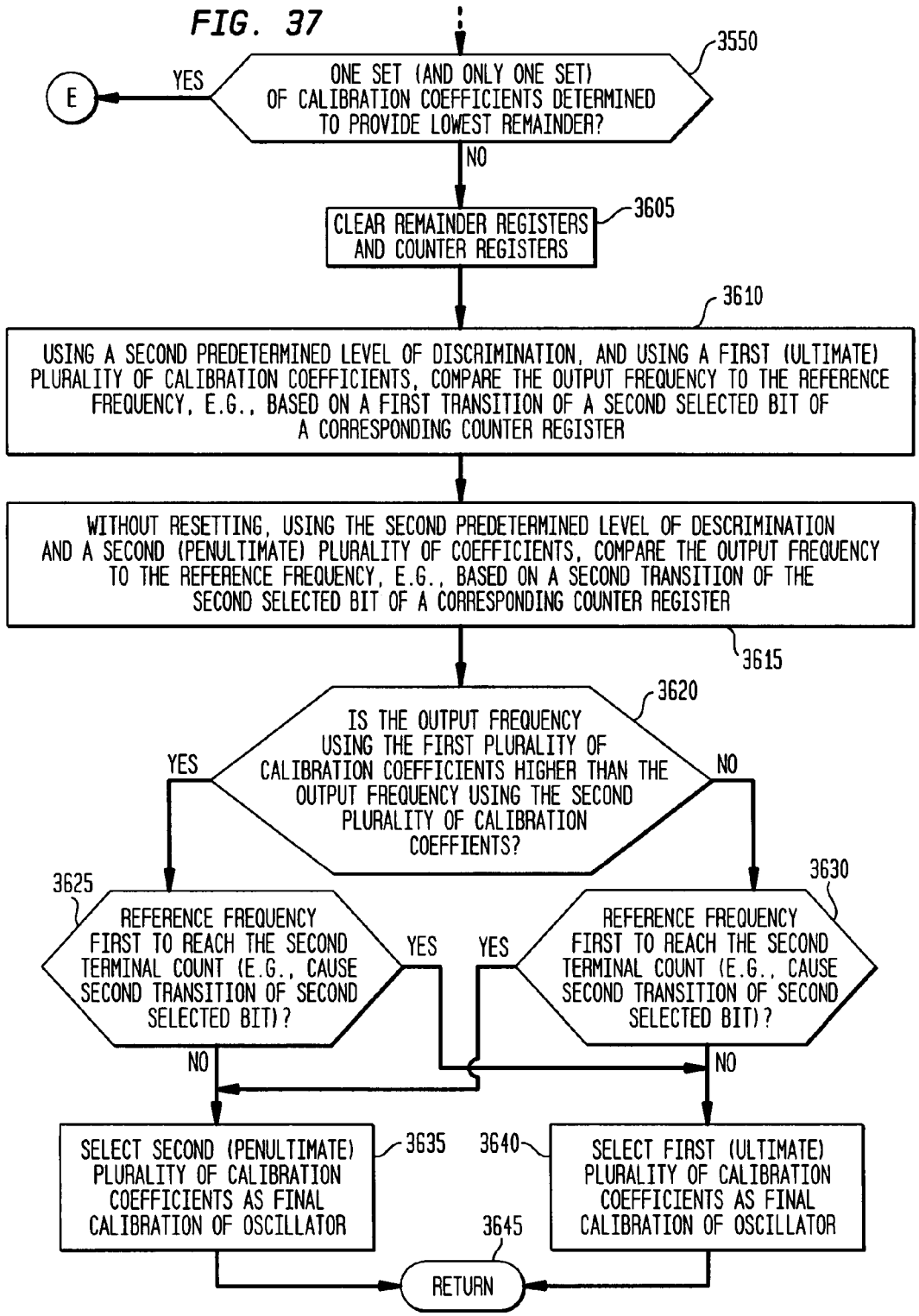

FREQUENCY CALIBRATION FOR A MONOLITHIC CLOCK GENERATOR AND TIMING/FREQUENCY REFERENCE

CROSS-REFERENCE TO RELATED APPLICATIONS

This application is a continuation-in-part of and claims priority to U.S. patent application Ser. No. 11/232,409, filed Sep. 20, 2005, and issued Jul. 24, 2007 as U.S. Pat. No. 7,248,124 B2, inventors Michael Shannon McCorquodale, Scott Michael Pernia, Sundus Kubba, and Amar Sarbbaseh Basu, entitled "Frequency Calibration for a Monolithic Clock Generator and Timing/Frequency Reference" (the "first related application"), which is commonly assigned herewith, the contents of which are incorporated herein by reference, and with priority claimed for all commonly disclosed subject matter, which is a continuation-in-part of and further claims priority to U.S. patent application Ser. No. 11/084,962, filed Mar. 21, 2005, now U.S. Pat. No. 7,227,423 inventors Michael Shannon McCorquodale, Scott Michael Pernia, and Amar Sarbbaseh Basu, entitled "Monolithic Clock Generator and Timing/Frequency Reference" (the "second related application"), and further claims priority to U.S. Provisional Patent Application Ser. No. 60/555,193, filed Mar. 22, 2004, inventor Michael Shannon McCorquodale, entitled "Monolithic and Top-Down Clock Synthesis with Micromachined Radio Frequency Reference" (the "third related application"), which is commonly assigned herewith, the contents of which are incorporated herein by reference, and with priority claimed for all commonly disclosed subject matter.

This application is also a continuation-in-part of and claims priority to U.S. patent application Ser. No. 11/384,605, filed Mar. 20, 2006, inventors Michael Shannon McCorquodale, Scott Michael Pernia, and Sundus Kubba, entitled "Inductor and Capacitor-Based Clock Generator and Timing/Frequency Reference" (the "fourth related application"), which is commonly assigned herewith, the contents of which are incorporated herein by reference, and with priority claimed for all commonly disclosed subject matter, and which further claims priority to the second and third related applications.

FIELD OF THE INVENTION

The present invention, in general, relates to oscillation or clocking signal generation, and more particularly, relates to a frequency calibration for a clock signal generator and timing/frequency reference.

BACKGROUND OF THE INVENTION

Accurate clock generators or timing references have generally relied upon crystal oscillators, such as quartz oscillators, which provide a mechanical, resonant vibration at a particular frequency. The difficulty with such crystal oscillators is that they cannot be fabricated as part of the same integrated circuit ("IC") that is to be driven by their clock signal. Microprocessors, for example, require a separate clock IC. As a consequence, virtually every circuit requiring an accurate clock signal requires an off-chip clock generator.

There are several consequences for such non-integrated solutions. For example, because such a processor must be connected through outside circuitry (such as on a printed circuit board (PCB)), power dissipation is comparatively increased. In applications which rely on a finite power supply, such as battery power in mobile communications, such additional power dissipation is detrimental.

In addition, such non-integrated solutions, by requiring an additional IC, increase space and area requirements, whether on the PCB or within the finished product, which is also detrimental in mobile environments. Moreover, such additional components increase manufacturing and production costs, as an additional IC must be fabricated and assembled with the primary circuitry (such as a microprocessor).

Other clock generators which have been produced as integrated circuits with other circuits are generally not sufficiently accurate, particularly over fabrication process, voltage, and temperature ("PVT") variations. For example, ring, relaxation and phase shift oscillators may provide a clock signal suitable for some low-sensitivity applications, but have been incapable of providing the higher accuracy required in more sophisticated electronics, such as in applications requiring significant processing capability or data communications. In addition, these clock generators or oscillators often exhibit considerable frequency drift, jitter, have a comparatively low Q-value, and are subject to other distortions from noise and other interference.

As a consequence, a need remains for a clock generator or timing reference which may be integrated monolithically with other circuitry, as a single IC, and which is highly accurate over PVT variations. Such a clock generator or timing reference should be free-running and self-referencing, and should not require locking or referencing to another reference signal. Such a clock generator or timing reference should exhibit minimal frequency drift and have comparatively low jitter, and should be suitable for applications requiring a highly accurate system clock. Such a clock generator or timing reference should also provide multiple operating modes, including a clock mode, a reference mode, a power conservation mode, and a pulsed mode. Lastly, such a clock generator or timing reference should provide for calibration of and control over output frequency, to provide a stable and desired frequency in response to variation in ambient or junction temperature or variation in other parameters such as voltage, fabrication process, frequency, and age.

SUMMARY OF THE INVENTION

In various exemplary embodiments, the invention provides for frequency calibration for a free-running, "master" harmonic oscillator which will be utilized as a reference oscillator, such as to provide a clock signal. The exemplary frequency calibration methods, systems and apparatuses provide fast, efficient, automatic and accurate calibration, and may be included on-chip with the inventive oscillator, or provided on a fabrication board for calibrating oscillator integrated circuits. The harmonic oscillator apparatus generally comprises a resonator, which may be implemented using one or more inductors and capacitors (as an "LC-tank"), a transconductance amplifier, and a frequency controller (generally also comprising a temperature compensator) for use in providing open-loop frequency control and selection for a low-jitter, free-running and self-referencing clock generator and/or a timing and frequency reference which is highly accurate over PVT and aging (time) variations and which can be integrated monolithically with other circuitry, to form a singular integrated circuit. No separate reference oscillator is required, and the exemplary embodiments are not phase-locked, delay-locked or otherwise locked to any other frequency reference. Instead, the exemplary embodiments are themselves "master" or reference oscillators which generate a reference signal, to which other "slave" devices may be locked by one or more phase-locked or delay-locked loops. Various exemplary embodiments of the invention include features for highly accurate frequency generation over fabrication process, voltage, and temperature ("PVT") variations. These features include frequency tuning and selection, and compensation for frequency variations which may be caused due to temperature and/or voltage fluctuations, fabrication process variations, and variations due to aging of the integrated circuitry.

Exemplary frequency calibration systems, apparatuses and methods of the present invention may be applied to any type of oscillator. For applications potentially requiring a high Q value, low jitter and low phase noise, the resonator typically comprises one or more inductors and capacitors, forming one or more LC-tanks or LC resonators. In a first embodiment, a double-balanced, differential LC oscillator topology is utilized. In other exemplary embodiments, differential or single-ended LC oscillator topologies may be utilized, such as a differential n-MOS cross-coupled topology; a differential p-MOS cross-coupled topology; a single-ended Colpitts LC oscillator, a single-ended Hartley LC oscillator, a differential Colpitts LC oscillator (both common base and common collector versions), a differential Hartley LC oscillator (also both common base and common collector versions), a single-ended Pierce LC oscillator, a quadrature oscillator (e.g., formed from at least two double-balanced, differential LC oscillators). In any of these embodiments, an active inductor may be utilized in the LC oscillator or in the other reactive components. Any of these LC topologies may be implemented to be balanced, cross-coupled, differential, or single-ended, and may utilize any type of transistors, such as n-MOS, p-MOS, or BJT, for example. Additional LC oscillator topologies, now known or which become known, are considered equivalent and within the scope of the present invention. The various LC topologies are described in detail in the fourth related applications, incorporated herein by reference.

The exemplary embodiments of the frequency controller of the present invention also provide several different levels and types of control. For example, both discrete and continuous control are provided, in real time, for control over output frequency of the free-running oscillator in light of such variations. In addition, such control is provided generally as an open-loop, without requiring or necessitating a feedback connection and without requiring continuous locking of the oscillator to another reference signal.

Significantly, various exemplary embodiments of the invention generate a significantly and comparatively high frequency, such as in the hundreds of MHz and GHz range, which is then divided to a plurality of lower frequencies. Each such division by "N" (a rational number, as a ratio of integers) results in a significant noise reduction, with phase noise reduced by N and phase noise power reduced by $N^2$. As a consequence, exemplary embodiments of the invention result in significantly less relative period jitter than other oscillators that generate their output directly or through frequency multiplications.

Various apparatus embodiments include a resonator, an amplifier, and a frequency controller, which may include various components or modules such as a temperature compensator, a process variation compensator, a voltage isolator and/or voltage compensator, an age (time) variation compensator, a frequency divider, and a frequency selector. The resonator provides a first signal having a resonant frequency. A temperature compensator adjusts the resonant frequency in response to temperature, and the process variation compensator adjusts the resonant frequency in response to fabrication process variation. In addition, the various embodiments may also include a frequency divider to divide the first signal having the resonant frequency into a plurality of second signals having a corresponding plurality of frequencies which are substantially equal to or lower than the resonant frequency; and a frequency selector to provide an output signal from the plurality of second signals. The frequency selector may further include a glitch-suppressor. The output signal may be provided in any of various forms, such as differential or single-ended, and substantially square-wave or sinusoidal, or spread-spectrum.

In a first exemplary embodiment, a method is provided for frequency calibration of a reference oscillator, with the reference oscillator having a plurality of switchable reactance modules and the reference oscillator providing an oscillation signal. The exemplary method comprises: (1) using the oscillation signal, providing an output signal having an output frequency; (2) using a first predetermined level of discrimination, comparing the output frequency to a reference frequency; (3) providing a first comparison signal when the output frequency is higher than the reference frequency; (4) providing a second comparison signal when the output frequency is lower than the reference frequency; and (5) determining a plurality of coefficients to control switching of the plurality of switchable reactance modules to increase a reactance of the reference oscillator in response to the first comparison signal or to decrease the reactance of the reference oscillator in response to the second comparison signal. The step of providing the output signal may further comprise multiplying or dividing the oscillation frequency (of the oscillation signal) by a rational number to provide the output signal having the output frequency.

In exemplary embodiments, the comparing step further comprises: counting cycles of the output signal and the reference signal; determining when a first predetermined terminal count has been reached by the reference signal; and determining a difference between an output signal count and the first predetermined terminal count. Alternatively and equivalently, the comparing step may further comprise counting cycles of the output signal and the reference signal; determining when a first predetermined terminal count has been reached by the output signal; and determining a difference between a reference signal count and the first predetermined terminal count. The method may also include, with the counting of cycles of the output signal and the reference signal, determining a remainder as a cycle count difference between the reference frequency and the output frequency. In exemplary embodiments, following the comparison, the method also provides for determining a lowest remainder and storing a corresponding plurality of coefficients which produced the output frequency having the lowest remainder, and following a last comparison, selecting the plurality of coefficients which produced the output frequency having the lowest remainder and providing the plurality of coefficients as the frequency calibration of the reference oscillator. In exemplary embodiments, for each comparison, the plurality of calibration coefficients may be provided in binary search increments or in sequential increments.

Exemplary embodiments may also use a second, higher predetermined level of discrimination, comparing the output frequency to the reference frequency and providing the first comparison signal when the output frequency is higher than the reference frequency or providing the second comparison signal when the output frequency is lower than the reference frequency. For this embodiment, the comparing step further comprises counting cycles of the output signal and the reference signal; determining when a second predetermined terminal count has been reached by the reference signal; and determining a difference between an output signal count and the second predetermined terminal count. Alternatively and equivalently, the comparing step may further comprise counting cycles of the output signal and the reference signal; determining when a second predetermined terminal count has been reached by the output signal; and determining a difference between a reference signal count and the second predetermined terminal count.

Alternatively in an exemplary embodiment, the comparing step, implemented in the inventive comparator of the system and apparatus embodiments, may further comprise selecting a first plurality of coefficients and a second plurality of coefficients, with the second plurality of coefficients being an adjacent state of the first plurality of coefficients; using a second predetermined level of discrimination and the first plurality of coefficients, performing a first comparison of the output frequency to the reference frequency by correspondingly counting cycles of the output signal and the reference signal to form a plurality of corresponding counts until a corresponding count of the plurality of corresponding counts has a first transition to the second predetermined level of discrimination; and using the second predetermined level of discrimination and the second plurality of coefficients, and commencing with the previous corresponding counts, performing a second comparison of the output frequency to the reference frequency by correspondingly counting cycles of the output signal and the reference signal until a corresponding count of the plurality of corresponding counts has a second transition to the second predetermined level of discrimination. In this exemplary embodiment, implemented in the inventive reactance modulator of the system and apparatus embodiments, when the output signal provided using the first plurality of coefficients has a frequency higher than the output signal provided using the second plurality of coefficients, and when the reference signal corresponding count has provided the second transition, the exemplary method selects the first plurality of coefficients as the frequency calibration of the oscillator, and when the output signal corresponding count has provided the second transition, selects the second plurality of coefficients as the frequency calibration of the oscillator. Also in this exemplary embodiment, when the output signal provided using the first plurality of coefficients has a frequency lower than the output signal provided using the second plurality of coefficients, and when the reference signal corresponding count has provided the second transition, the exemplary method selects the second plurality of coefficients as the frequency calibration of the oscillator, and when the output signal corresponding count has provided the second transition, selects the first plurality of coefficients as the frequency calibration of the oscillator.

An exemplary frequency calibration system embodiment is also provided, with the system couplable to an oscillator to receive a reference signal having a reference frequency. The exemplary system comprises: a reference oscillator comprising a plurality of switchable reactance modules and a coefficient register, the reference oscillator adapted to provide an oscillation signal having an oscillation frequency; a frequency divider couplable to the reference oscillator, the frequency divider adapted to provide an output signal having an output frequency; a comparator coupled to the frequency divider, the comparator adapted to compare the output frequency to the reference frequency using a first predetermined level of discrimination, to provide first comparison signal when the output frequency is higher than the reference frequency, and to provide a second comparison signal when the output frequency is lower than the reference frequency; and a reactance modulator coupled to the comparator and couplable to the reference oscillator, the reactance modulator adapted to determine and provide to the coefficient register a plurality of coefficients to control switching of the plurality of switchable reactance modules to increase a reactance of the oscillator in response to the first comparison signal or to decrease the reactance of the oscillator in response to the second comparison signal. The frequency divider is typically further adapted to multiply or divide the oscillation frequency by a rational number to provide the output signal having the output frequency.

The exemplary comparator may further comprise: a first counter adapted to count cycles of the output signal; a second counter adapted to count cycles of the reference signal; and a state detector coupled to the first and second counters, the state detector adapted to determine when a first predetermined terminal count has been reached by the reference signal and to determine a difference between an output signal count and the first predetermined terminal count. Alternatively and equivalently, the exemplary comparator may further comprise: a first counter adapted to count cycles of the output signal; a second counter adapted to count cycles of the reference signal; and a state detector coupled to the first and second counters, the state detector adapted to determine when a first predetermined terminal count has been reached by the output signal and to determine a difference between a reference signal count and the first predetermined terminal count. In exemplary embodiments, the comparator is further adapted to count cycles of the output signal and the reference signal and to determine a remainder as a cycle count difference between a first predetermined terminal count and either a reference frequency count or an output frequency count. The comparator may further comprise: a remainder register; and a remainder comparator, the remainder comparator adapted to compare a first remainder with a second remainder, to determine a lowest remainder, and to store in the remainder register the plurality of coefficients which produced the output frequency having the lowest remainder. The reactance modulator may be further adapted to select the plurality of coefficients which produced the output frequency having the lowest remainder and provide the plurality of coefficients as the frequency calibration of the oscillator.

Also in exemplary embodiments, the comparator may be further adapted to compare the output frequency to the reference frequency using a second predetermined level of discrimination, and to provide the first comparison signal when the output frequency is higher than the reference frequency or provide the second comparison signal when the output frequency is lower than the reference frequency. For example, the state detector may also be adapted to determine when a second predetermined terminal count has been reached by the reference (or output) signal and to determine a difference between an output (or reference) signal count and the second predetermined terminal count.

An exemplary apparatus embodiment is also provided for frequency calibration of a free-running, reference harmonic oscillator, with the oscillator adapted to provide an oscillation signal having an oscillation frequency, with the oscillator having a coefficient register, and with the apparatus couplable to receive a reference signal having a reference frequency. The exemplary apparatus comprises: a frequency divider couplable to the oscillator, the frequency divider adapted to provide an output signal having an output frequency; a comparator coupled to the frequency divider, the comparator adapted to compare the output frequency to the reference frequency using a first predetermined level of discrimination, to provide first comparison signal when the output frequency is higher than the reference frequency, and to provide a second comparison signal when the output frequency is lower than the reference frequency; and a reactance modulator coupled to the comparator and couplable to the reference oscillator, the reactance modulator adapted to determine and provide to the coefficient register a plurality of coefficients to control switching of the plurality of switchable reactance modules to increase a reactance of the oscillator in response to the first comparison signal or to decrease the reactance of the oscillator in response to the second comparison signal.

In another exemplary embodiment, a frequency calibration system is provided, with the system couplable to a first reference oscillator to receive a reference signal having a reference frequency. The exemplary system comprises: a harmonic oscillator adapted to be an independent, calibrated reference oscillator, the harmonic oscillator comprising a plurality of switchable reactance modules and a coefficient register, the harmonic oscillator adapted to provide an oscillation signal having an oscillation frequency; a frequency divider coupled to the harmonic oscillator, the frequency divider adapted to provide an output signal having an output frequency which is a rational multiple or fraction of the oscillation frequency; a comparator coupled to the frequency divider, the comparator adapted to compare the output frequency to the reference frequency using a first predetermined level of discrimination, to compare the output frequency to the reference frequency using a second predetermined level of discrimination, and to provide a first comparison signal when the output frequency is higher than the reference frequency or provide a second comparison signal when the output frequency is lower than the reference frequency, the comparator further adapted to determine a remainder as a cycle count difference between the reference frequency and the output frequency, to determine a lowest remainder, and to store a corresponding plurality of coefficients which produced the output frequency having the lowest remainder; and a reactance modulator coupled to the comparator and to the oscillator, the reactance modulator adapted to determine and provide to the coefficient register a plurality of coefficients to control switching of the plurality of switchable reactance modules to increase a reactance of the oscillator in response to the first comparison signal or to decrease the reactance of the oscillator in response to the second comparison signal, the reactance modulator further adapted to select the plurality of coefficients which produced the output frequency having the lowest remainder and provide the plurality of coefficients as the frequency calibration of the harmonic oscillator.

It should be noted that the terms "fixed" and "variable" are utilized as known in the art, with "fixed" being understood to mean configured generally to be non-varying with respect to a selected parameter, and "variable" meaning configured generally to be varying with respect to the selected parameter. For example, a fixed capacitor generally means that its capacitance does not vary as a function of an applied voltage, while a variable capacitor (varactor) will have a capacitance which does vary as a function of applied voltage. Both, however, may have and generally will have capacitances which vary as a function of fabrication process variation. In addition, a fixed capacitor may be formed as a varactor coupled to a constant voltage, for example. Similarly, components may be coupled to each other either directly or indirectly or, stated another way, operatively coupled or coupled via signal transmission. For example, one component may be coupled to a second component via a third component, such as through a switching arrangement, a divider, a multiplier, etc. Those of skill in the art will recognize these various circumstances and contexts, as illustrated and as discussed below, and what is meant when such terms are utilized.

These and additional embodiments are discussed in greater detail below. Numerous other advantages and features of the present invention will become readily apparent from the following detailed description of the invention and the embodiments thereof, from the claims and from the accompanying drawings.

BRIEF DESCRIPTION OF THE DRAWINGS

The objects, features and advantages of the present invention will be more readily appreciated upon reference to the following disclosure when considered in conjunction with the accompanying drawings and examples which form a portion of the specification, wherein like reference numerals are used to identify identical or similar components in the various views, in which:

FIG. 37 (or "FIG. 37") is a flow diagram illustrating an exemplary third frequency calibration method in accordance with the teachings of the present invention.

DETAILED DESCRIPTION OF THE EXEMPLARY EMBODIMENTS

Figure 1:
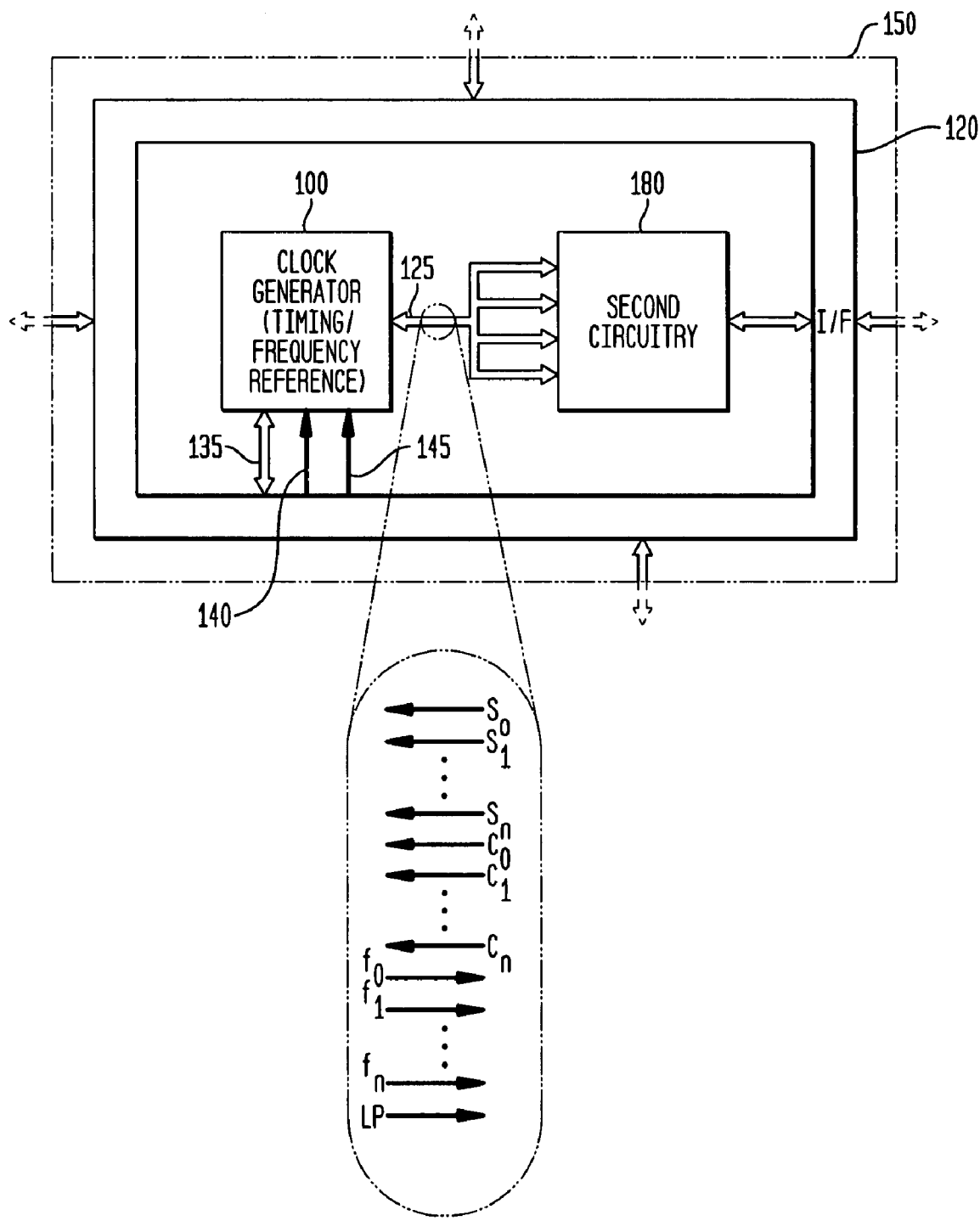
FIG. 1 (or "FIG. 1") is a block diagram illustrating an exemplary system embodiment in accordance with the teachings of the present invention.

While the present invention is susceptible of embodiment in many different forms, there are shown in the drawings and will be described herein in detail specific examples and embodiments thereof, with the understanding that the present disclosure is to be considered as an exemplification of the principles of the invention and is not intended to limit the invention to the specific examples and embodiments illustrated, and that numerous variations or modifications from the described embodiments may be possible and are considered equivalent. In this respect, before explaining at least one embodiment consistent with the present invention in detail, it is to be understood that the invention is not limited in its application to the details of construction and to the arrangements of components set forth above and below, illustrated in the drawings, or as described in the examples. Methods, systems and apparatuses consistent with the present invention are capable of other embodiments and of being practiced and carried out in various ways. Also, it is to be understood that the phraseology and terminology employed herein, as well as the abstract included below, are for the purposes of description and should not be regarded as limiting.

As indicated above, the various embodiments of the invention provide numerous advantages, including the ability to integrate a highly accurate (over PVT and age), low-jitter, free-running and self-referencing clock generator and/or a timing and frequency reference with other circuitry, such as illustrated in FIG. 1. FIG. 1 is a block diagram illustrating an exemplary system embodiment 150 in accordance with the teachings of the present invention. As illustrated in FIG. 1, the system 150 is a single integrated circuit, having a clock generator and/or timing/frequency reference 100 of the present invention integrated monolithically with other, or second, circuitry 180, together with interface (I/F) (or input/output (I/O) circuitry) 120. The interface 120 will generally provide power, such as from a power supply (not illustrated), ground, and other lines or busses to the clock generator 100, such as for calibration and frequency selection. As illustrated, one or more output clock signals are provided on bus 125, as a plurality of frequencies, such as a first frequency ($f_0$), a second frequency ($f_1$), and so on, through an $(n+1)^{th}$ frequency ($f_n$). In addition, a power conservation mode (or low power mode (LP)) is provided (also on bus 125). The second circuitry 180 (or the I/F 120) may also provide input into the clock generator 100, such as through selection signals ($S_0$, $S_1$, through $S_n$), and one or more calibration signals ($C_0$, $C_1$, through $C_n$). Alternatively, the selection signals ($S_0$, $S_1$, through $S_n$) and one or more calibration signals ($C_0$, $C_1$, through $C_n$) may be provided directly to the clock generator 100 through the interface 120, such as on bus 135, along with power (on line 140) and ground (on line 145).

The clock generator and/or timing/frequency reference 100, in addition to a low power mode, has additional modes discussed in greater detail below. For example, in a clock mode, the apparatus 100 will provide one or more clock signals, as output signals, to the second circuitry 180. The second circuitry 180 may be any type or kind of circuitry, such as a microprocessor, a digital signal processor ("DSP"), a radio-frequency circuit, for example, or any other circuit which could utilize the one or more output clock signals. Also for example, in a timing or frequency reference mode, the output signal from the apparatus 100 may be a reference signal, such as a reference signal for synchronization for a second oscillator. As a consequence, the terminology clock generator and/or timing/frequency reference will be utilized interchangeably herein, with the understanding that the clock generator will also generally provide a square-wave signal, which may or may not be provided with a timing/frequency reference, which may utilize a substantially sinusoidal signal instead. In addition, as discussed in greater detail below, the various embodiments of the invention also provided a pulsed mode, in which the output signal from clock generator and/or timing/frequency reference 100 is provided in bursts or intervals, for increased instruction processing efficiency and lower power consumption, for example.

It should be noted that the various signals, voltages, parameter-independent current sources, and so on, are referred to as "substantially" sinusoidal or square-wave signals, substantially constant control voltages, or substantially parameter-independent voltages or currents, for example. This is to accommodate the various fluctuations, noise sources and other distortions introduced which may cause such signals, voltages or currents to differ in practice from the more ideal depictions found in textbooks. For example, as discussed in greater detail below, exemplary "substantially" square-wave signals are depicted in FIGS. 15A and 15B, and exhibit a variety of distortions, such as undershoots, overshoots, and other variations, and are nonetheless considered to be very high quality square-waves in practice.

Several important features of the present invention are in system 150. First, a highly accurate, low-jitter, free-running and self-referencing clock generator 100 is integrated monolithically with other (second) circuitry 180, to form a singular integrated circuit (system 150). This is in sharp contrast with the prior art, in which a reference oscillator is used to provide a clock signal, such as a crystal reference oscillator, which cannot be integrated with other circuitry and is off-chip, as a second and separate device which must be connected through a circuit board to any additional circuitry. For example, in accordance with the present invention, the system 150, including clock generator 100, may be fabricated with other, second circuitry using conventional CMOS (complementary metal oxide semiconductor), BJT (bipolar junction transistor), BiCMOS (bipolar and CMOS), or other fabrication technologies utilized in modem IC manufacturing.

Second, no separate reference oscillator is required. Rather, in accordance with the invention, the clock generator 100 is self-referencing and free-running, such that it is not referenced to or locked to another signal, such as being synchronized in a phase locked loop ("PLL"), a frequency locked loop ("FLL"), a delay locked loop ("DLL"), or via injection locking to a reference signal, which is typical of the prior art. Instead, the exemplary embodiments may be utilized as such a reference oscillator which generates a frequency reference signal, which may then be locked to by one or more phase-locked or delay-locked loops, for example.

Third, the clock generator 100 provides a plurality of output frequencies and a power conservation mode, such that frequencies may be switched with low latency and in a glitch-free manner. For example, second circuitry 180 may shift to a power conservation mode, such as a battery or lower frequency mode, and request (through selection signals) a lower clock frequency for minimizing power consumption, or request a low power clock signal to enter a sleep mode. As discussed in greater detail below, such frequency switching is provided with substantially negligible latency, with low latency introduced for glitch prevention (in proportion to the number of glitch prevention stages utilized), using a merely a handful of clock cycles, rather than the thousands of clock cycles required to change the output frequency from a PLL/DLL/FLL.

Additional embodiments also provide for generating a plurality of frequency reference signals, whether sinusoidal or square-wave, such as for use as one or more clock signals or reference frequency sources. In exemplary embodiments, the clock/frequency reference of the invention is coupled to one or more phase-locked loops, frequency locked loops, or delay-locked loops, to provide a corresponding plurality of output reference signals at selected frequencies. These exemplary embodiments are typically programmable, through control signals or stored coefficients, such as to adjust the divide ratios of the PLLs, FLLs, or DLLs for corresponding frequency selection.

In addition, given the significantly high available output frequencies of the clock generator and/or timing/frequency reference 100 discussed below, new operating modes are available. For example, clock start-up times are effectively or substantially negligible, allowing the clock generator and/or timing/frequency reference 100 to be repeatedly started and stopped, such as turned off entirely or to be pulsed for power conservation. For example, rather than running continuously as a clock, the clock generator and/or timing/frequency reference 100 can be operated in comparatively short, discrete intervals or bursts (i.e., pulsed), periodically or non-periodically, for instruction processing by a second circuit 180, such as a processor. As discussed in greater detail below, with the rapid start-up time, such pulsed operation provides a power savings, as more instructions (million instructions per second or MIPS) are processed per milliwatt (mW) of power consumption. In addition, such a pulsed mode may also be utilized to periodically synchronize a second clock or oscillator, in addition to other uses. As a consequence, the clock generator and/or timing/frequency reference 100 (and the other embodiments discussed below) has a plurality of operating modes, including a clock mode, a timing and/or frequency reference mode, a power conservation mode, and a pulsed mode.

Fourth, as discussed in greater detail below, the clock generator and/or timing/frequency reference 100 includes features for highly accurate frequency generation over fabrication process, voltage, temperature ("PVT") and age variations. These features include frequency tuning and selection, and compensation for frequency variations which may be caused due to temperature and/or voltage fluctuations, fabrication process variations, and IC aging.

Fifth, the clock generator and/or timing/frequency reference 100 generates a significantly and comparatively high frequency, such as in the hundreds of MHz and GHz range, which is then divided to a plurality of lower frequencies. Each such division by "N" (a rational number, as a ratio of integers) results in a significant noise reduction, with phase noise reduced by N and phase noise power reduced by $N^2$. As a consequence, the clock generator of the present invention results in significantly less relative period jitter than available with other oscillators that generate their output directly or through frequency multiplication.

Figure 2:
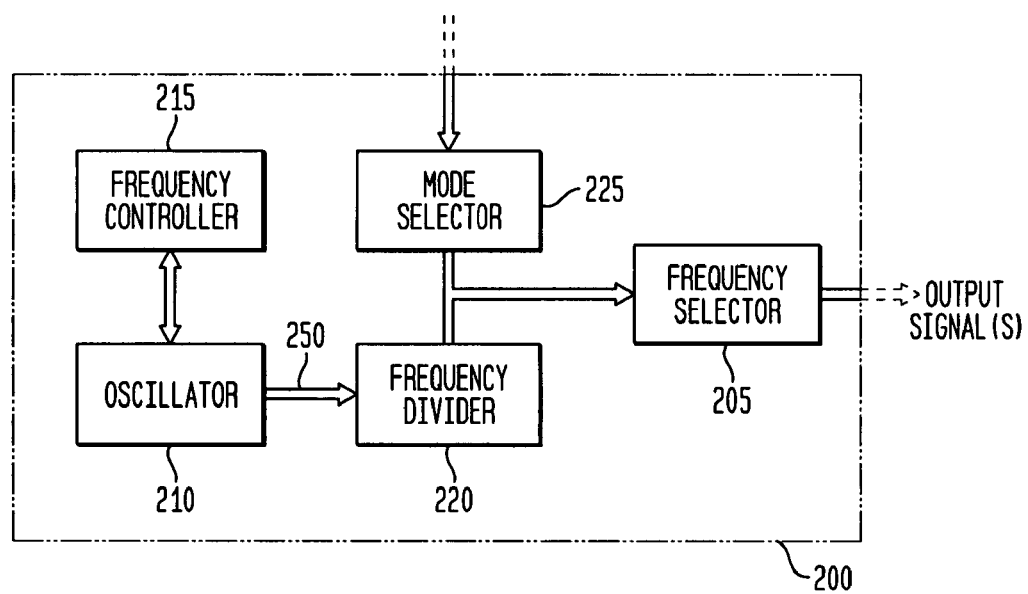
FIG. 2 (or "FIG. 2") is a block diagram illustrating a first exemplary apparatus embodiment in accordance with the teachings of the present invention.

These features are illustrated in greater detail in FIG. 2, which is a block diagram illustrating a first exemplary apparatus 200 embodiment, including a frequency controller 215 in accordance with the teachings of the present invention. As illustrated in FIG. 2, the apparatus 200 is a clock generator and/or timing/frequency reference, providing one or more output signals, such as a clock or reference signal having any of a plurality of frequencies, selected using frequency selector 205. The apparatus (or clock generator) 200 includes an oscillator 210 (having a resonant element), a frequency controller 215, a frequency divider 220, a mode selector 225, and the frequency selector 205 mentioned above. In accordance with the invention, the oscillator 210 generates a signal having a comparatively high frequency, $f_0$. Due to PVT or age variations mentioned above, the frequency controller 215 is utilized to frequency select or tune the oscillator 210, such that the oscillation frequency $f_0$ is selectable from a plurality of potential oscillation frequencies, i.e., the frequency controller 215 provides for output signals having frequencies which are accurate over PVT and age variations.

For example, given these PVT variations, the output frequency from an oscillator, such as oscillator 210, may vary plus or minus 5%. For some applications, such as those utilizing ring oscillators, such frequency variability may be acceptable. In accordance with the present invention, however, greater accuracy for the clock generator 200 is desirable, particularly for more sensitive or complex applications, such as providing clock signals for integrated microprocessors, microcontrollers, digital signal processors, communication controllers, and so on. As a consequence, frequency controller 215 is utilized to adjust for these PVT variations, such that the output frequency from the oscillator is the selected or desired frequency $f_0$ with much less variance by several orders of magnitude, such as ±0.25% or less, and having a comparatively low-jitter.

Various exemplary embodiments of the frequency controller 215, in accordance with the teachings of the present invention, are illustrated in detail below. For example, referring to FIG. 21, which is a block diagram illustrating an exemplary frequency controller 1415 and apparatus 1400 in accordance with the teachings of the present invention, an oscillator (resonator 310 and sustaining amplifier 305) provides a first output signal having a resonant frequency $f_0$. The exemplary frequency controller 1415 is coupled to the oscillator and modifies the resonant frequency $f_0$ in response to a second signal, such as a second signal provided by one or more sensors 1440. The exemplary frequency controller 1415 comprises one of more of the following components: transconductance modulator 1420, variable parameter modulator (or controller) 1425 (such as one or more of the controlled capacitance or controlled reactance modules discussed below), process (or other parameter) modulator (or compensator) 1430, voltage compensator 1455, coefficient register(s) 1435, and potentially also an age variation compensator 1460. Depending upon the selected embodiment, the frequency controller 1415 may also include one or more sensor(s) 1440, analog-to-digital (A/D) converter ("ADC") 1445, and control logic block 1450.

Figure 4:
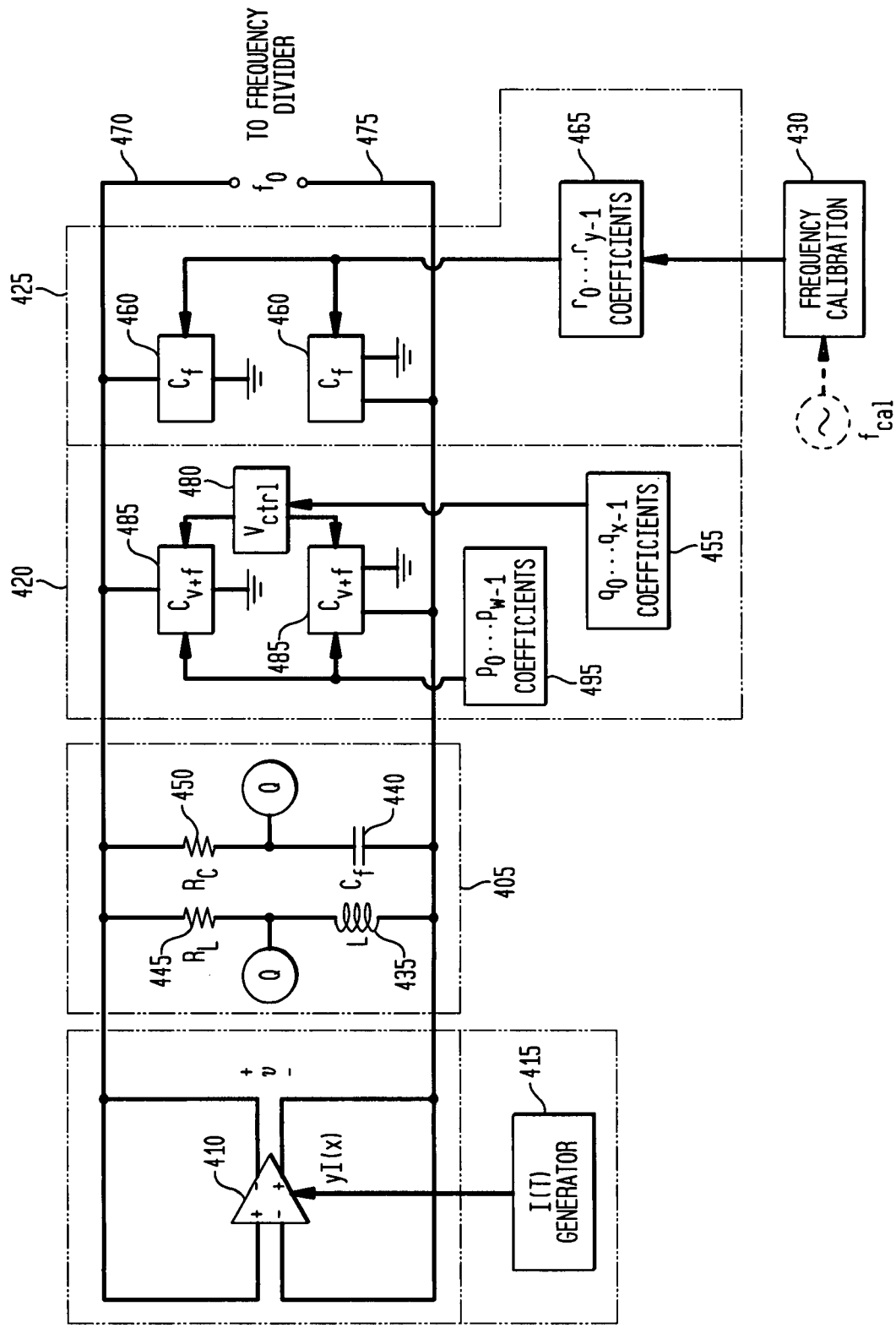
FIG. 4 (or "FIG. 4") is a high-level schematic and block diagram illustrating exemplary frequency controller, oscillator and frequency calibration embodiments in accordance with the teachings of the present invention.

For example, a temperature-dependent current source, I(T) (or, more generally, yI(x)) generator 415 illustrated in FIG. 4 effectively functions as a temperature sensor in accordance with the present invention, providing a corresponding output current which varies as a function of ambient or junction temperature. Such a temperature-dependent output current may be converted into a digital signal by A/D converter (ADC) 1445, and utilized to provide corresponding coefficients (stored in registers 1435) utilized by the various modulators or compensators 1420, 1425, 1430, 1455 and 1460 of the frequency controller 1415, to control the resonant (or output) frequency $f_0$ in light of various parameters, such as a variable operating temperature or variable fabrication processes. In other illustrated embodiments, such a temperature-dependent output current is provided directly (as a second signal, without intervening A/D conversion) to the various modulators, such as to transconductance modulator 1420 and to variable parameter modulator (or controller) 1425. These modulators, in turn, modify the resonant frequency $f_0$ through, for example, modifying the current through the resonator 310 and sustaining amplifier 305, or modifying the effective reactance or impedance (e.g., capacitance, inductance or resistance) coupled to and effectively forming part of the resonator 310. For example, the effective reactance (or impedance) may be modified by coupling to or decoupling from the resonator 310 fixed or variable capacitances, or modifying the magnitudes of one or more reactances coupled to the resonator, such as by modifying a control voltage or other continuous control parameter.

In the various illustrated embodiments discussed below, the transconductance modulator 1420 and variable parameter modulator (or controller) 1425 are generally implemented to utilize a temperature parameter, such that a substantially stable resonant frequency $f_0$ is provided over variations in operating temperature. It will be understood by those of skill in the art that these modulators may be implemented to provide a substantially stable resonant frequency $f_0$ as a function or in response to other variable parameters, such as variations due to fabrication process, voltage variations, aging, and other frequency variations.

Referring again to FIG. 2, to improve performance and decrease jitter (noise) and other interference, instead of generating a low frequency output and multiplying it up to a higher frequency, as is typically done using PLLs, FLLs, and/or DLLs, the present invention generates a comparatively high frequency output, $f_0$, which is then divided to one or more lower frequencies ($f_1$ through $f_n$), using frequency divider 220. Clock signals having one or more of the plurality of frequencies from frequency divider 220 may then be selected, using frequency selector 205. As indicated above, such frequency selection is provided glitch-free and with low latency, providing comparatively and significantly fast and glitch-free frequency switching. In addition, a plurality of operating modes are provided, using mode selector 225.

Figure 3:
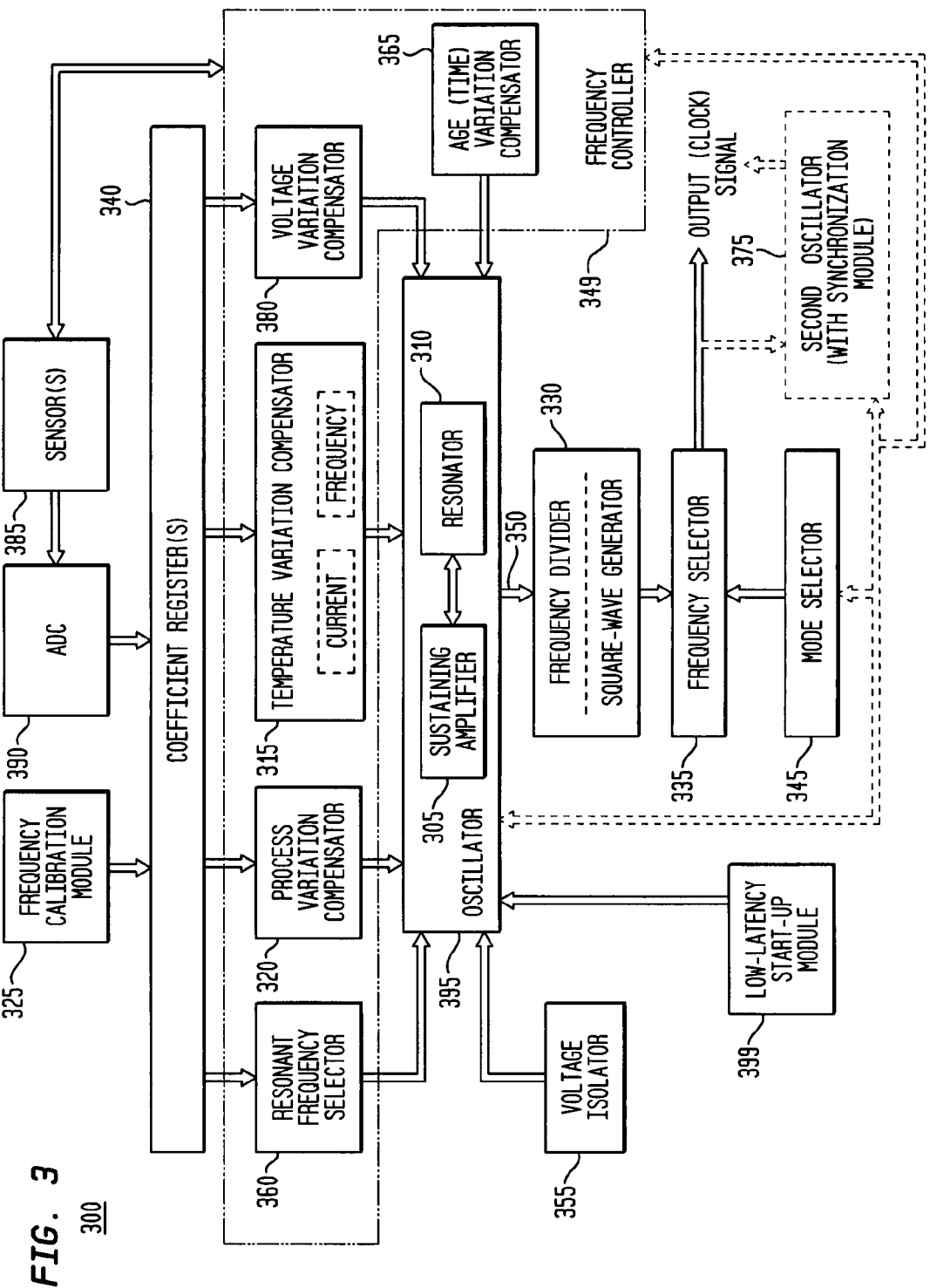
FIG. 3 (or "FIG. 3") is a block diagram illustrating a second exemplary apparatus embodiment in accordance with the teachings of the present invention.

FIG. 3 is a block diagram illustrating in greater detail a second exemplary apparatus embodiment, as clock generator and/or timing/frequency reference 300, in accordance with the teachings of the present invention. Referring to FIG. 3, clock generator and/or timing/frequency reference 300 comprises a resonator 310 and a sustaining amplifier 305 (forming an oscillator 395), a temperature compensator (or modulator) 315, a process variation compensator (or modulator) 320, a frequency calibration module 325, a voltage variation compensator (or modulator) 380, an age (time) variation compensator (or modulator) 365, one or more coefficient registers 340, and depending on the selected embodiments, may also include a sensor(s) 385, an analog-to-digital converter ("ADC") 390, frequency divider and square wave generator 330, a voltage isolator 355, a resonant frequency selector 360, an output frequency selector 335, a mode selector 345, and a low-latency start-up module 399. The sustaining amplifier 305, temperature compensator 315, process variation compensator 320, voltage isolator 355, voltage variation compensator 380, age variation compensator 365, resonant frequency selector 360, and frequency calibration module 325 are often included within a frequency controller, such as frequency controller 349 (or 215 or 1415). Alternatively, the sustaining amplifier 305 and resonator 310 may be considered to comprise an oscillator 395, with one or more of the various controller elements (e.g., temperature compensator 315, process variation compensator 320, voltage isolator 355, voltage variation compensator 380, age variation compensator 365, resonant frequency selector 360, sensor(s) 385, ADC 390, and frequency calibration module 325) included within a frequency controller 349 (or 215 or 1415). It should also be noted that the square-wave generator (of 330) may not be needed in timing or frequency reference embodiments.

The resonator 310 may be any type of resonator which stores energy, such as an inductor (L) and a capacitor (C) coupled to form an LC-tank, where the LC-tank has a selected configuration of a plurality of LC-tank configurations, or is otherwise electrically or electromechanically equivalent to or otherwise typically represented in the art as an inductor coupled to a capacitor. Such an LC-resonator is illustrated as resonator 405 in FIG. 4. In addition to LC resonators, other resonators are considered equivalent and within the scope of the present invention; for example, the resonator 310 may be a ceramic resonator, a mechanical resonator (e.g., XTAL), a microelectromechanical ("MEMS") resonator, or a film bulk acoustic resonator. In other cases, various resonators may be represented by electrical or electromechanical analogy as LC resonators, and are also within the scope of the present invention. In exemplary embodiments, an LC-tank has been utilized as a resonator, to provide for a high Q-value for a completely integrated solution.

The sustaining amplifier 305 provides for both start-up and sustaining amplification for the resonator 310. The temperature compensator 315 provides frequency control for the resonator 310, to adjust the oscillation frequency based on variations due to temperature. In selected embodiments, depending upon the degree of control desired or required, the temperature compensator 315 may include control over both current and frequency, as illustrated below for selected embodiments. For example, the temperature compensator 315 may comprise one or both of a transconductance modulator 1420 and variable parameter modulator 1425 of FIG. 21, with both modulators 1420 and 1425 embodied to be responsive to temperature fluctuations. Similarly, the process variation compensator 320 provides frequency control for the resonator 310, to adjust the oscillation frequency based on process variations inherent in semiconductor fabrication technologies, both process variations within a given foundry (e.g., batch or run variations, variations within a given wafer, and die-to-die variations within the same wafer) and process variations among different foundries and foundry processes (e.g., 130 nm and 90 nm processes)). Voltage variation compensator 380 may be utilized to maintain a stable output frequency over supply voltage variations and other voltage variations. Age variation compensator 365 may be utilized to maintain a stable output frequency as the IC ages, with corresponding variations in circuit elements occurring over time. Frequency calibration module 325 is utilized to fine-tune and select the desired output frequency, $f_0$, from among a plurality of oscillation frequencies which may occur in resonator 310, i.e., to select the output frequency $f_0$ from a plurality of available or potential frequencies. In selected embodiments, coefficient registers 340 are utilized to store coefficient values utilized in the various exemplary compensator and calibration embodiments, discussed in greater detail below.

As mentioned above, the frequency controller 349, in selected embodiments, may also include one of more sensors 385 and analog-to-digital converter (ADC) 390. In addition, many of the other compensators and modulators of the frequency controller include components which function as sensors, such as temperature-dependent current sources and other voltage variation detectors. In addition to being utilized to generate various pluralities of stored coefficients which provide control to various switching elements, to both switch controlled reactance modules (discussed below) to the resonator 310 (as a discrete form of control) and to vary the amount of effective reactance supplied by a coupled or switched reactance to the resonator 310 (a continuous form of control), the various sensors, compensators and modulators may also be utilized to provide other forms of continuous control over the resonant frequency of the resonator 310. The various continuous outputs from sensors, current generators, control voltages, etc., as illustrated and discussed below, function as control signals within the scope of the present invention. For example, the various control voltages, which may vary with a selected parameter (e.g., temperature) or which may be constant with respect to a selected parameter, function as control signals which are used to modify corresponding magnitudes of controlled capacitance modules implemented using varactors.

In addition to the temperature and process compensation, voltage isolator 355 provides isolation from variations in voltage, such as from a power supply, and may be implemented separately or as part of other components, such as part of temperature compensator 315. In addition to frequency adjustment for these PVT and age variations, the resonant frequency may also be selected independently through resonant frequency selector 360, for obtaining a selected frequency from a range of available frequencies.

For clock signal generation, clock generator 300 utilizes a frequency divider (in module 330) to convert the output oscillation frequency $f_0$ to a plurality of lower frequencies ($f_1$ through $f_n$) and to convert a substantially sinusoidal oscillation signal to a substantially square wave signal for clock applications, using a square wave generator (also in module 330). Frequency selector 335 then provides for selection of one or more of the available output signals having the plurality of frequencies, and mode selector 345 may also provide for operating mode selection, such as providing a low power mode, a pulsed mode, a reference mode, and so on. Using these components, the clock generator 300 provides a plurality of highly accurate (over PVT), low jitter, and stable output frequencies, $f_0$, $f_1$ through $f_n$, with minimal to negligible frequency drift due to such PVT variations, thereby providing sufficient accuracy and stability for sensitive or complex applications, as mentioned above.

FIG. 4 is a high-level schematic and block diagram illustrating exemplary frequency controller, oscillator and frequency calibration embodiments in accordance with the teachings of the present invention. As illustrated in FIG. 4, the resonator is embodied as a resonant LC tank 405, and the frequency controller is embodied as several elements, a negative transconductance amplifier 410 (used to implement the sustaining amplifier), a temperature-responsive (or temperature-dependent) current generator I(T) (or, more generally, yI(x), as responsive to any such parameter "x") 415, a temperature-responsive (or temperature-dependent) frequency ($f_0$ (T)) compensation module 420, a process variation compensation module 425, and may also include a frequency calibration module 430. The various temperature-responsive or temperature-dependent modules 415 and 420 are sensitive to or responsive to temperature fluctuations, and provide corresponding adjustments, such that the resonant frequency is stable and accurate over these PVT and age variations.

Figure 8:
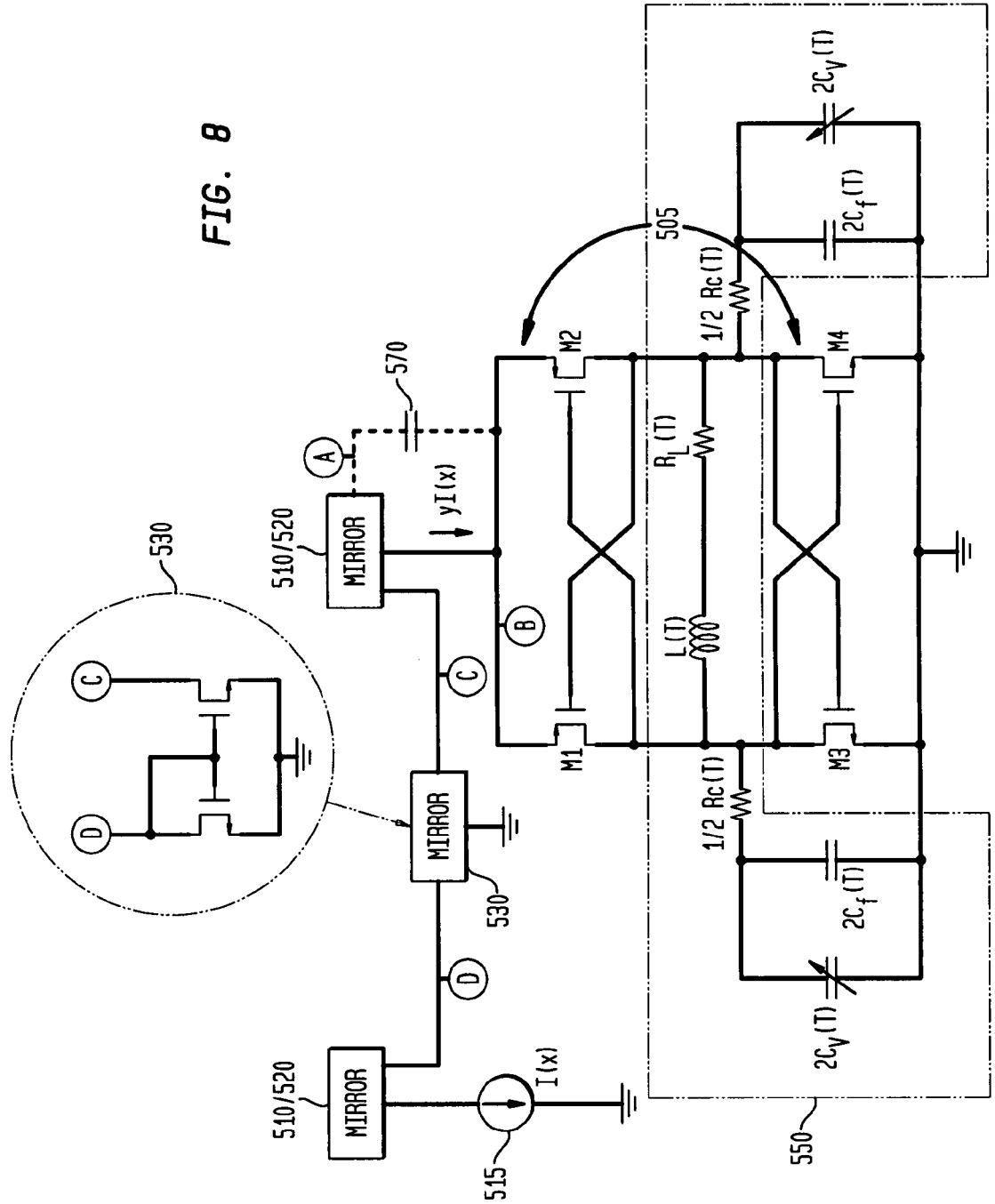
FIG. 8 (or "FIG. 8") is a circuit and block diagram illustrating second exemplary negative transconductance amplifier, temperature-responsive current generator (I(T)), and LC tank oscillator embodiments in accordance with the teachings of the present invention.

The resonant LC tank 405 with a sustaining amplifier may be equally described as a harmonic oscillator or harmonic core, and all such variations are within the scope of the present invention. It should be noted that while the resonant LC tank 405 is an inductor 435 in parallel with a capacitor 440, other circuit topologies are also known and equivalent to that illustrated, such as an inductance in series with a capacitance. Another such equivalent topology is illustrated in FIG. 8. Additional equivalent topologies are illustrated in the fourth related application and are incorporated herein by reference. In addition, as indicated above, other types of resonators may be utilized and all are considered equivalent to the exemplary resonant LC tank illustrated herein. Moreover, as discussed in greater detail below, additional capacitances and/or inductances, both fixed and variable (and referred to more generally as impedances or reactances (or reactive elements)), are distributed in the various modules and effectively form part of the resonant LC tank 405 and are utilized as part of the frequency controller of the invention. In addition, corresponding resistances (resistive components of the various impedances) $R_L$ 445 and $R_C$ 450 are illustrated separately, but should be understood to be intrinsic to the inductor 435 and capacitor 440, respectively, occurring as part of fabrication, and are not additional or separate components from the respective inductor 435 and capacitor 440. Conversely, such additional or intrinsic (parasitic) resistances can also be included as part of compensation for PVT variations, as illustrated and discussed below with reference to FIG. 29.

The inductor 435 and capacitor 440 of the resonant LC tank or oscillator 405 are sized to substantially or approximately provide the selected oscillation frequency, $f_0$, or range of oscillation frequencies around $f_0$. In addition, inductor 435 and capacitor 440 may be sized to have or to meet IC layout area requirements, with higher frequencies requiring less area. Those of skill in the art will recognize that $f_0 \approx 1/2\pi\sqrt{LC}$, but only as a first order approximation because, as discussed below, other factors such as the impedances $R_L$ and $R_C$, any additional resistors, along with temperature and process variations and other distortions, affect $f_0$, and may be included in second and third order approximations. For example, the inductor 435 and capacitor 440 may be sized to generate a resonant frequency in the 1-5 GHz range; in other embodiments, higher or lower frequencies may be desirable, and all such frequencies are within the scope of the invention. In addition, the inductor 435 and capacitor 440 may be fabricated using any semiconductor or other circuitry process technology, and may be CMOS-compatible, bipolar-junction transistor-compatible, for example, while in other embodiments, the inductor 435 and capacitor 440 may be fabricated using silicon-on-insulator (SOI), metal-insulator-metal (MiM), polysilicon-insulator-polysilicon (PiP), GaAs, strained-silicon, semiconductor heterojunction technologies, or MEMS-based (microelectromechanical) technologies, also for example and without limitation. It should be understood that all such implementations and embodiments are within the scope of the invention. In addition, other resonator and/or oscillator embodiments, in addition to or instead of the resonant LC tank 405, may also be utilized and are also within the scope of the present invention. As used herein, "LC tank" will mean and refer to any and all inductor and capacitor circuit layouts, configurations or topologies which may provide oscillation, however embodied. It should be noted that the capability of the oscillator 405 to be fabricated using a conventional process, such as CMOS technology, allows the clock generator to be fabricated integrally and monolithically with other circuitry, such as the second circuitry 180, and provides a distinct advantage of the present invention.

In addition, the capacitance 440 illustrated in FIG. 4 is only a portion of the overall capacitance involved in the resonance and frequency determination of the resonant LC tank 405, and is a fixed capacitance. In selected embodiments, this fixed capacitance may represent approximately 10% to 90% of the total capacitance ultimately utilized in the oscillator, as an example. Alternatively, the capacitance 440 may also be implemented as a variable capacitance, if desired. As discussed in greater detail below, the overall capacitance is distributed, such that additional fixed and variable capacitance is selectively included within the clock generator and/or timing/frequency reference 300, and is provided, for example, by components of the frequency controller (215, 1415), such as temperature-responsive frequency ($f_0$ (T)) compensation module 420 and process variation compensation module 425, to provide for both selecting the resonant frequency $f_0$ and to allow the resonant frequency $f_0$ to be substantially independent of both temperature and process variations.

In the selected embodiments, the inductance 435 has been fixed, but also could be implemented in a variable manner, or as a combination of fixed and variable inductances. As a consequence, those of skill in the art will recognize that the detailed discussions of fixed and variable capacitance, for both frequency tuning and temperature and process independence, pertain similarly to inductance choices. For example, different inductances could be switched in or out of the oscillator, to similarly provide tuning. In addition, a single inductor's inductance may also be modulated. As a consequence, all such inductance and capacitance variations are within the scope of the present invention, and are illustrated as switchable, variable and/or fixed reactive elements or components of the exemplary controlled impedance modules 1305 of FIG. 20 and the controlled reactance modules 1805 of FIGS. 25-27.

Also as illustrated in FIG. 4, the resonant LC tank 405 and resulting output signal, referred to as a first (output) signal at nodes or lines 470 and 475, is a differential signal and provides common-mode rejection. Other configurations, including non-differential or other single-ended configurations are also within the scope of the present invention. For example, in single-ended configurations, only one instantiation of the various modules (e.g., 485, 460) would be required, rather than the use of two for a balanced configuration as illustrated. Similarly, other components and features discussed below, such as frequency dividers, would also have a single-ended rather than differential configuration. In addition, various embodiments illustrated utilize MOSFET transistors (metal oxide semiconductor field effect transistors) in various forms (such as CMOS, accumulation-mode MOSFET ("AMOS"), inversion-mode MOSFET ("IMOS"), and so on); other implementations are also available, such as using bipolar junction transistors ("BJTs"), BiCMOS, etc. All such embodiments are considered equivalent and are within the scope of the present invention.

Figure 5A:
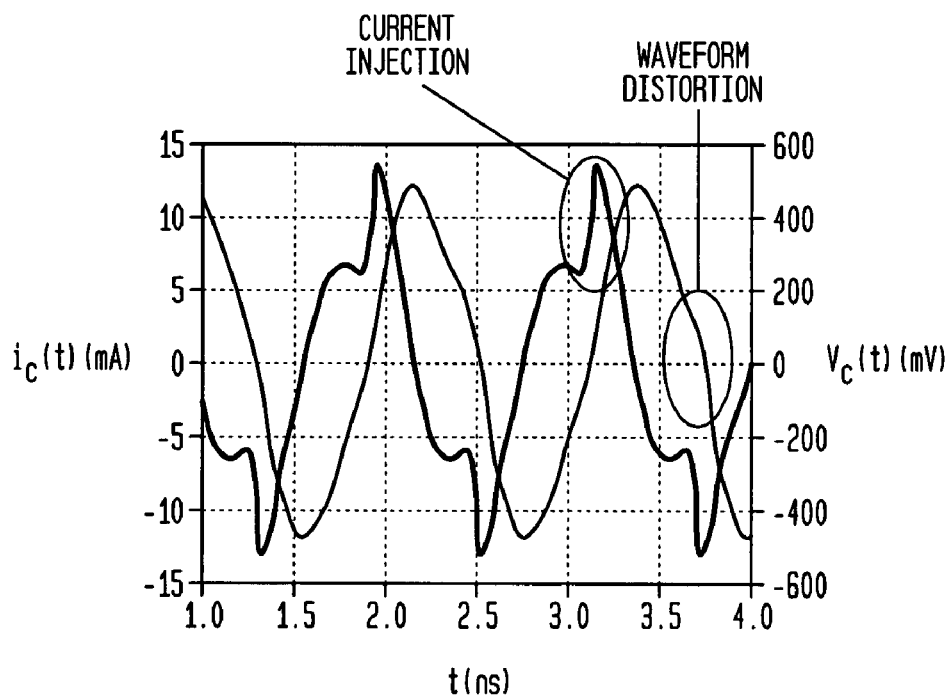
FIG. 5A (or "FIG. 5A") is an exemplary graph illustrating oscillator voltage waveform (frequency) distortion due to a harmonic content of current injected into an oscillator with a specific filter response.

The negative transconductance amplifier 410 is selected to provide temperature compensation through transconductance ($g_m$) modulation and the on-resistance of its resistors. Transconductance ($g_m$) modulation may also be utilized independently in frequency selection. Another significant advantage of the present invention is the selection of a negative transconductance amplifier 410 to provide start-up and sustaining amplification, because both oscillation amplitude and frequency are affected by the transconductance of the sustaining amplifier, providing both amplitude modulation and frequency trimming (or tuning), in addition to providing temperature compensation. The negative transconductance amplifier 410 will inject current into the resonant LC tank 405 (and specifically onto the capacitor 440) in response to a voltage "v" across the resonant LC tank 405, as illustrated (across nodes 470 and 475). That current injection, in turn, will change (and distort) the voltage waveform (as voltage is the integral of the current), resulting in a change or variation in frequency, generally in inverse proportion to the magnitude of the transconductance, $g_m$, as illustrated in FIG. 5A. It should be noted that this transconductance is a negative value, as gain is provided to cancel the loss intrinsic to the resonant element. As a consequence, whenever "transconductance amplifier" is utilized herein, it should be understood to mean and to be merely an abbreviation for "negative transconductance amplifier".

Figure 5B:
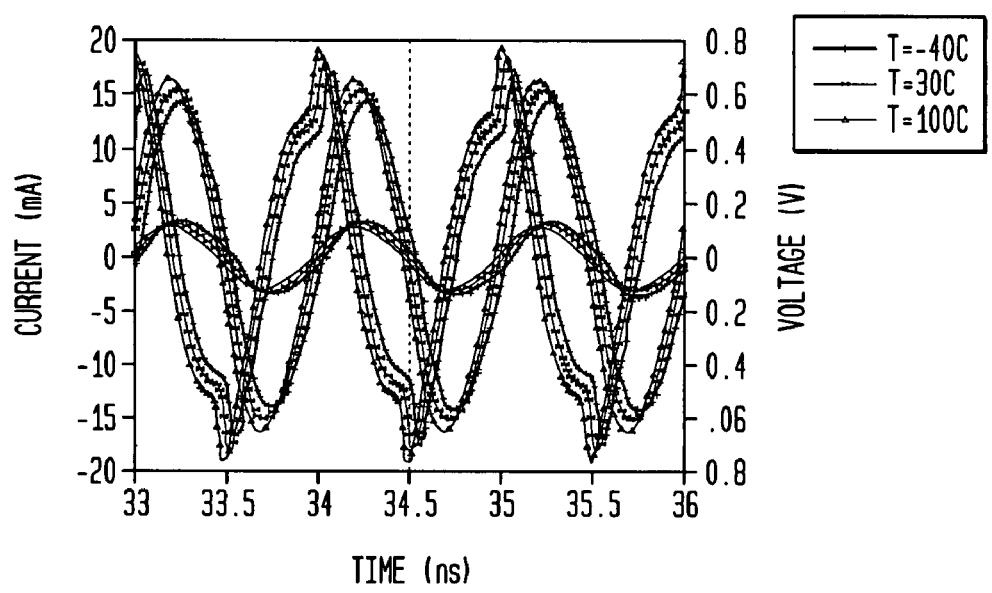
FIG. 5B (or "FIG. 5B") is an exemplary graph illustrating oscillator voltage waveform (frequency) shown in FIG. 5A as a function of temperature.
Figure 5C:
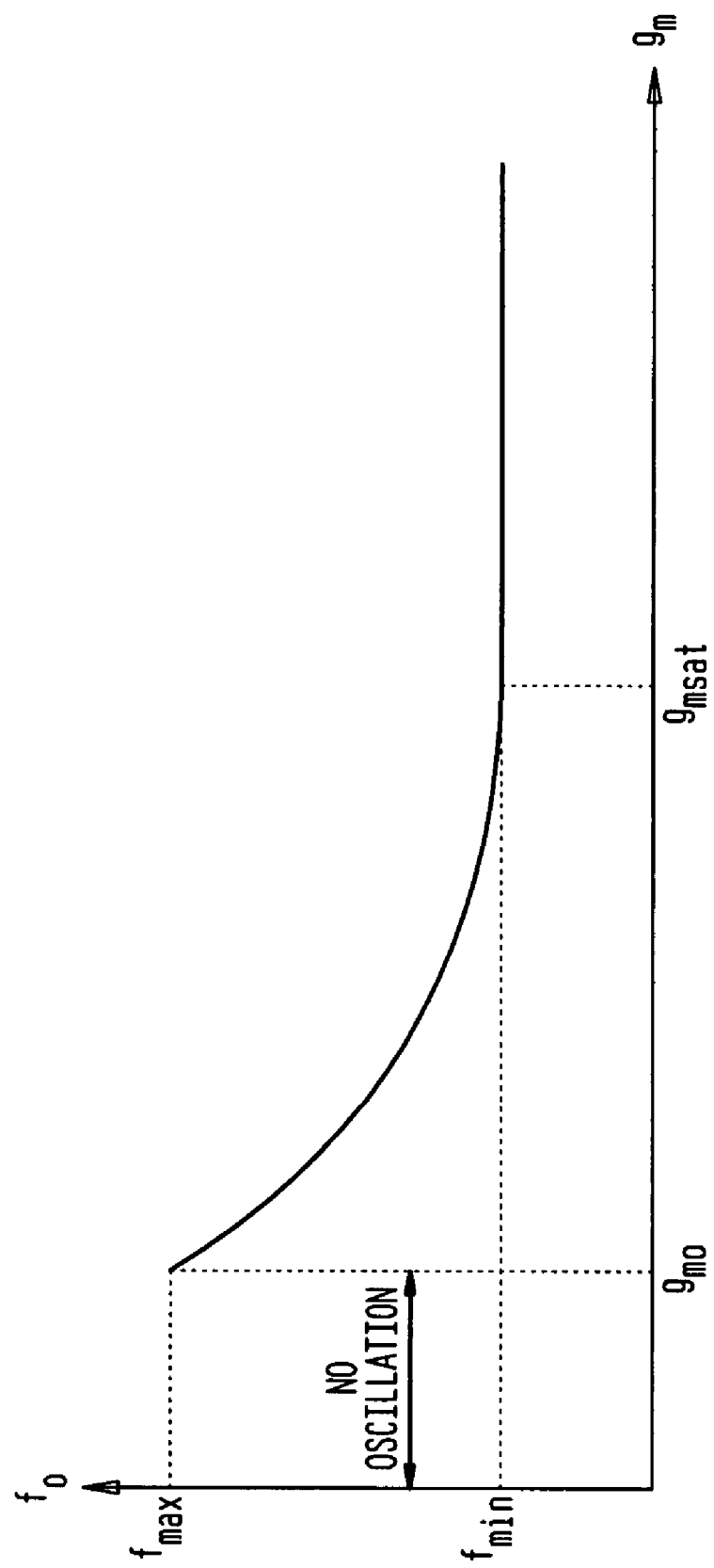
FIG. 5C (or "FIG. 5C") is an exemplary graph illustrating oscillator frequency as a function of the transconductance of a sustaining amplifier.

In turn, the transconductance is also a function of the bias current, substantially proportional (approximately) to the square root of the current (yI(x)) through the amplifier 410 (for MOSFETs), and substantially proportional (approximately) to the current (yI(x)) through the amplifier 410 (for BJTs), which is temperature-dependent, resulting in a waveform distortion which is both temperature and bias current dependent, as illustrated in FIG. 5B. In addition, as illustrated in FIG. 5C, the oscillation frequency is also related to and a function of the transconductance of the sustaining negative transconductance amplifier 410, providing for oscillation frequency selection. Moreover, in addition to temperature dependence (as I(T)), the current can also vary as a function of other parameters or variables (so is referred to more generally as current I(x)), such as voltage or external tuning, and may also be amplified such as by a factor of "y" (as illustrated below); as a consequence, the current is referred to as "yI(x)".

Figure 21:
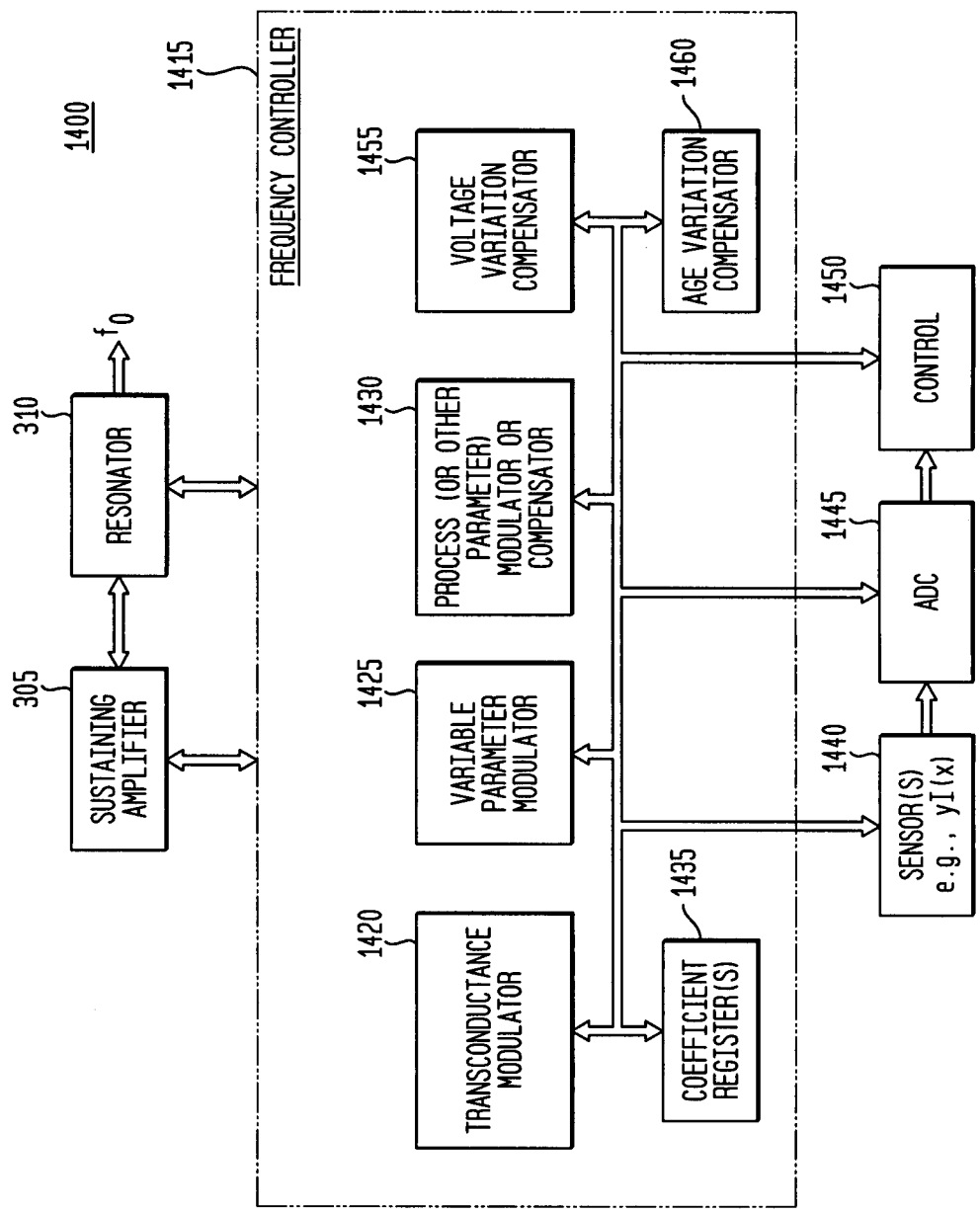
FIG. 21 (or "FIG. 21") is a block diagram illustrating a first exemplary frequency controller and apparatus in accordance with the teachings of the present invention.
Figure 25:
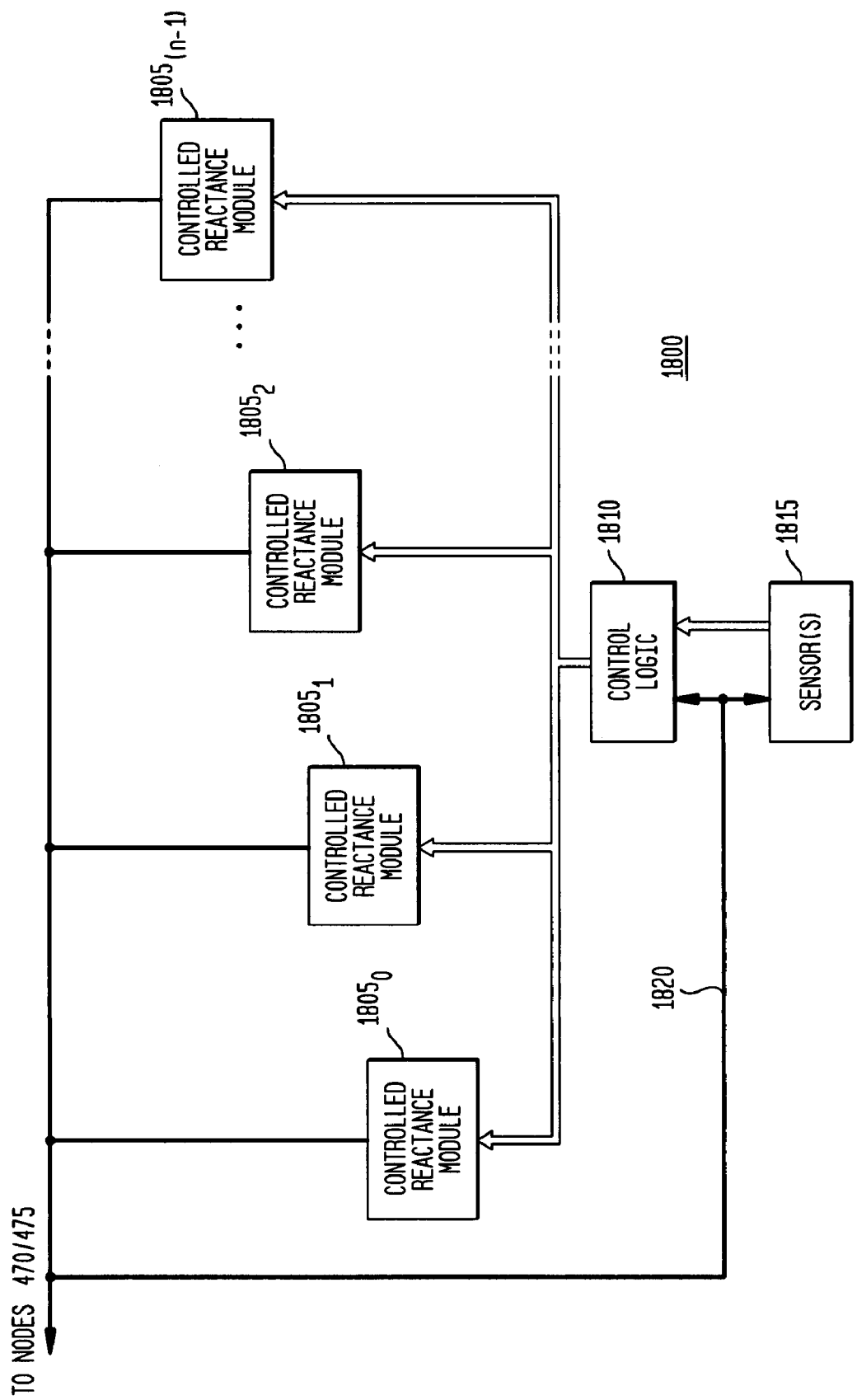
FIG. 25 (or "FIG. 25") is a block diagram illustrating a second exemplary frequency controller and apparatus in accordance with the teachings of the present invention.

As indicated above, more generally, such a variable current yI(x) may be utilized as or as part of a sensor, such as one or more sensors 1440 or transconductance modulator 1420 of FIG. 21 or sensors 1815 of FIG. 25. For example, when such as variable current is provided by I(T) generator 415, such that the current provided is a function of temperature (parameter or variable "x"=temperature parameter "T"), I(T) generator 415 thereby functions as a temperature sensor, and may be utilized as such in the exemplary embodiments, such as utilized by the frequency controller (215, 349, 1415) to adjust the resonant frequency $f_0$ in response to temperature fluctuations. For example, transconductance modulator 1420 of FIG. 21 may comprise such a temperature (or other parameter) responsive current source 415 (which also functions as a sensor 1440), providing current to a sustaining amplifier 305.

Significant inventive breakthroughs of the present invention include utilizing these potential distortions advantageously, to provide for frequency compensation in generating the selected $f_0$ value of the oscillator, and frequency modulation through modulation of the transconductance of the sustaining amplifier. As a consequence, and as discussed in greater detail below, the transconductance, first, may be modified or varied for frequency selection, and second, to compensate for such frequency variation due to temperature, voltage, fabrication process or aging, by modifying the current yI(x), generally on a real-time or near real-time basis. The selected frequency $f_0$, and its stability with respect to temperature variations, in accordance with the invention, may be determined through appropriate selection of the transconductance $g_m$, and selection of I(T). Stated another way, in accordance with the present invention, the bias current is made temperature dependent, as I(T) (or, more generally, as yI(x)), which in turn affects the transconductance $g_m$, which in turn affects the oscillation frequency $f_0$. This methodology may also be utilized for other variables, such as voltage fluctuations, process variation, or aging variation.

Figure 6:
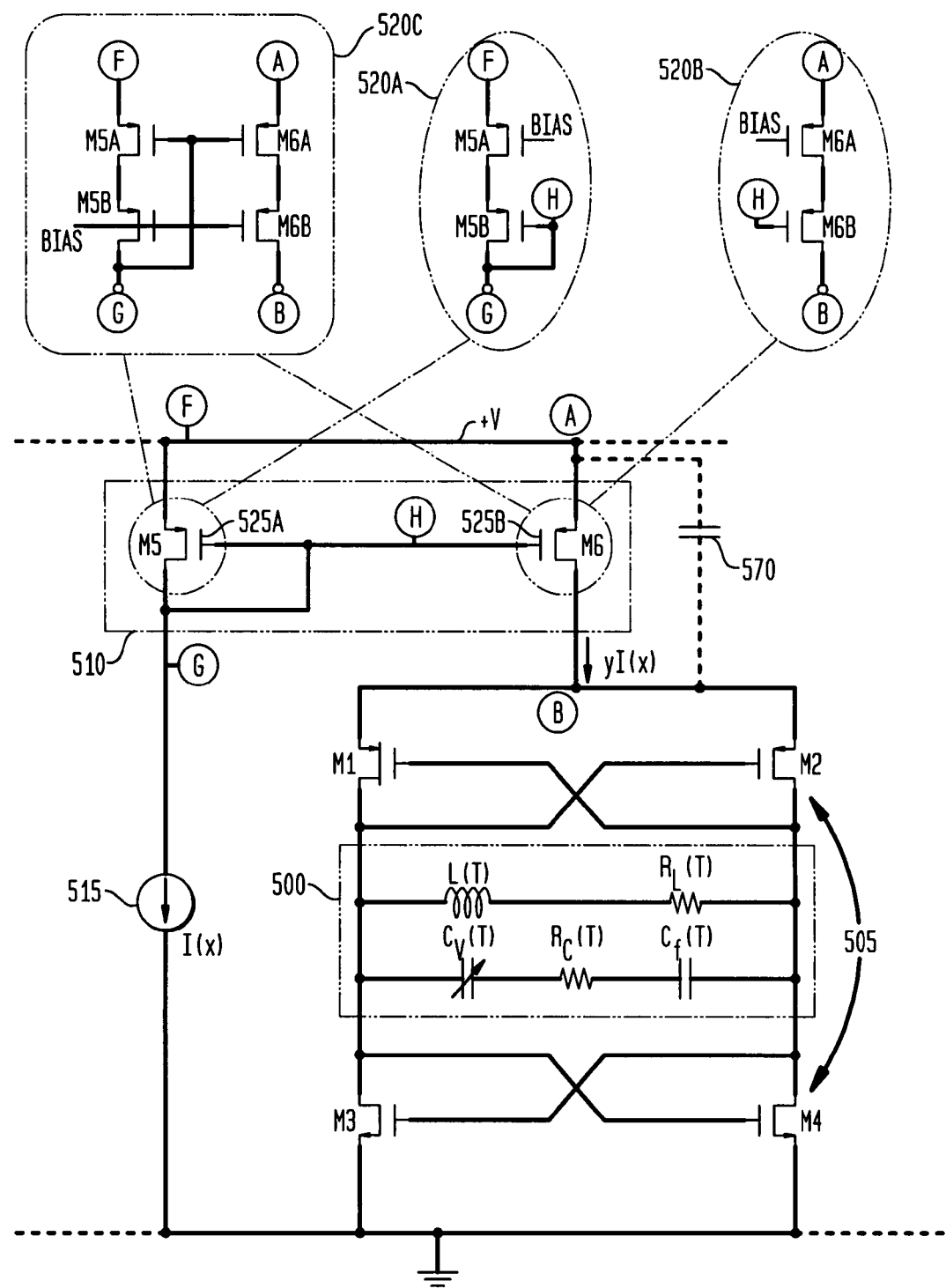
FIG. 6 (or "FIG. 6") is a circuit diagram illustrating first exemplary negative transconductance amplifier, temperature-responsive current generator (I(T)), and LC tank oscillator embodiments in accordance with the teachings of the present invention.
Figure 7A:
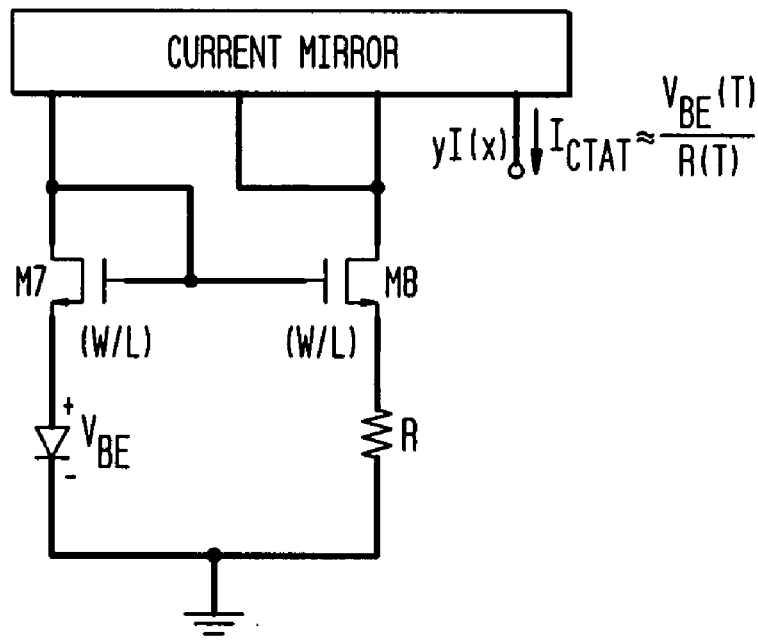
FIG. 7A (or "FIG. 7A") is a circuit diagram illustrating an exemplary temperature-responsive CTAT current generator in accordance with the teachings of the present invention.
Figure 7B:
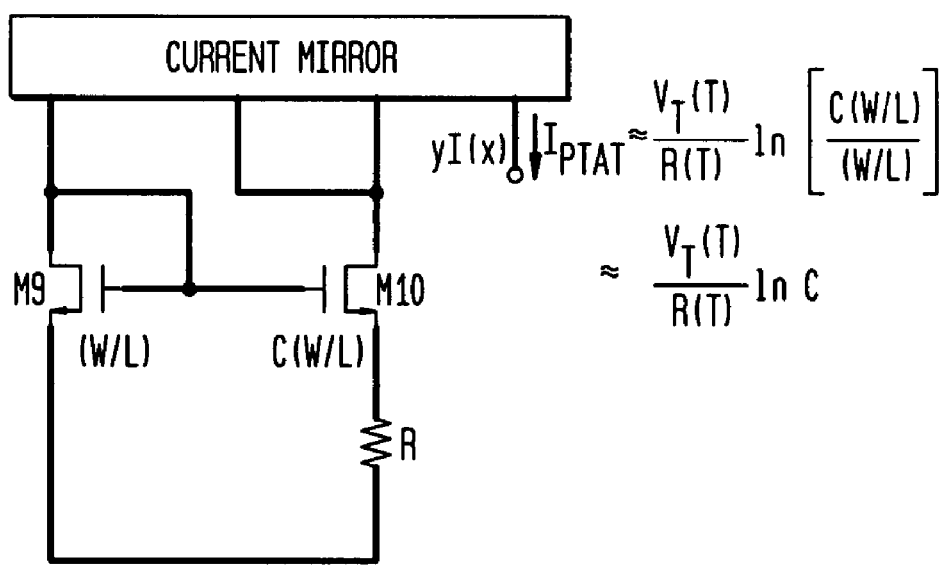
FIG. 7B (or "FIG. 7B") is a circuit diagram illustrating an exemplary temperature-responsive PTAT current generator in accordance with the teachings of the present invention.
Figure 7C:
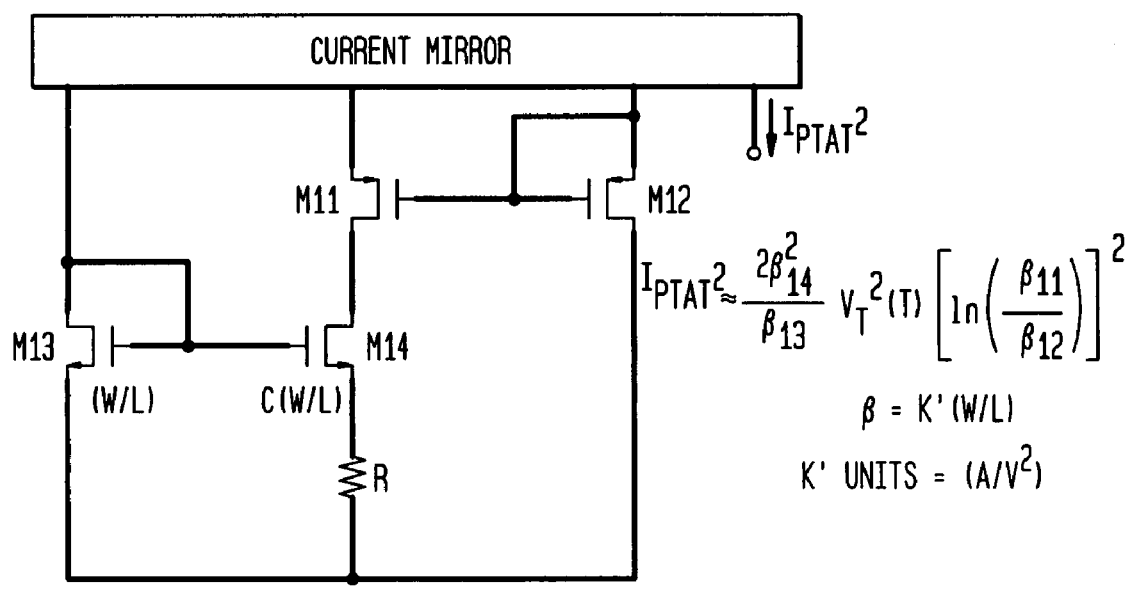
FIG. 7C (or "FIG. 7C") is a circuit diagram illustrating an exemplary temperature-responsive $PTAT^2$ current generator in accordance with the teachings of the present invention.
Figure 7D:
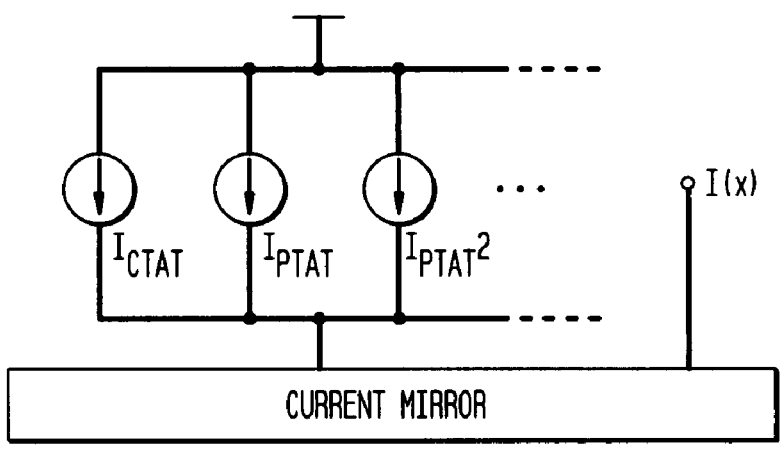
FIG. 7D (or "FIG. 7D") is a circuit diagram illustrating an exemplary selectable and scalable temperature-responsive current generator, with selected CTAT, PTAT, and $PTAT^2$ configurations, in accordance with the teachings of the present invention.

FIG. 6 is a circuit diagram illustrating exemplary negative transconductance amplifier (410), temperature-responsive current generator (I(T) 415), and LC tank resonator (405) embodiments in accordance with the teachings of the present invention. As illustrated in FIG. 6, a resonant LC tank 500 is coupled to a negative transconductance amplifier implemented as a complementary cross-coupled pair amplifier 505 (comprised of transistors M1, M2, M3 and M4) which, in turn, is coupled through a voltage isolator 510 (implemented as current mirror (transistors 525A and 525B) and referred to interchangeably herein) to a temperature-responsive current generator (I(x)) 515. The current mirror 510 (voltage isolator) may also be implemented in a first cascode topology (520A and 520B) and a second cascade topology (520C), for example, such as to provide improved stability with variations in power supply and isolate the oscillator from the power supply (voltage isolation). The temperature-responsive current generator 515 may be implemented utilizing topologies such as CTAT (complementary to absolute temperature), PTAT (proportional to absolute temperature), or PTAT$^2$ (proportional to absolute temperature squared), as illustrated in FIGS. 7A, 7B and 7C, respectively, and combinations of CTAT, PTAT, and PTAT$^2$, as illustrated in FIG. 7D. In each case, the current I(T) (or yI(x)) injected into the negative transconductance amplifier (complementary cross-coupled pair amplifier) 505 has a temperature dependence, such as increasing current (PTAT and PTAT$^2$) or decreasing current (CTAT) as a function of increasing temperature, as illustrated. One or more combinations of these temperature-responsive current generators may also be implemented, as illustrated in FIG. 7D, such as CTAT in parallel with PTAT, for example.

The selection of a particular temperature-responsive or temperature-dependent current generator is also a function of the fabrication process utilized; for example, CTAT may be utilized for a Taiwan Semiconductor (TSMC) fabrication process. More generally, as different fabricators utilize different materials, such as aluminum or copper, RL typically varies, resulting in different temperature coefficients which, in turn, change the temperature coefficient of the oscillator, thereby requiring differences in I(T) compensation. Correspondingly, different ratios of CTAT, PTAT, and PTAT$^2$ compensation may be required to provide an effectively flat frequency response as a function of temperature. Not separately illustrated, the various temperature-responsive current generators illustrated in FIGS. 7A, 7B, 7C and 7D may include a start-up circuit. In addition, the transistors comprising the selected temperature-responsive current generator configuration may be biased differently, such as biased in strong inversion for CTAT (M7 and M8) and PTAT$^2$ (M13 and M14), and in subthreshold for PTAT (M9 and M10) and PTAT$^2$ (M11 and M12), for the exemplary topologies illustrated.

FIG. 8 is a circuit and block diagram illustrating additional exemplary negative transconductance amplifier, temperature-responsive (or temperature-dependent) current generator (I(T) or I(x)), and LC tank oscillator embodiments in accordance with the teachings of the present invention. As illustrated in FIG. 8, the resonant LC tank 550 has a different topology than previously illustrated, but also is coupled to a negative transconductance amplifier implemented as a complementary cross-coupled pair amplifier 505 (transistors M1, M2, M3 and M4) which, in turn, is coupled through a plurality of current mirrors 510 (or 520) and 530 to a temperature-responsive (or temperature-dependent) current generator (I(T) or I(x)) 515. As illustrated, the plurality of current mirrors are utilized to successively provide gain to and increase the current I(T) entering the negative transconductance amplifier 505 and resonant LC tank 550. Often, the tail device in the current mirror (e.g., transistor M6 in FIG. 6) providing current into node B and which drives the negative transconductance amplifier is selected to be a PMOS device, and thus several stages of mirroring may be required (as shown) to provide a PMOS current mirror input to the $g_m$ amplifier. PMOS is often selected because in modern CMOS processes, PMOS devices are often buried channel devices which are known to exhibit less flicker noise than equally sized and similarly biased NMOS devices. Reduced flicker noise in the tail device reduces the phase noise and jitter of the oscillator because flicker noise is upconverted around the oscillation frequency by the nonlinear active devices in the circuit.

As indicated above, the portion of the current mirror 510 or 520 (or other circuitry) sourcing current into the negative transconductance amplifier 505 should have a high impedance at its output to reduce power supply frequency drift, such as by using long transistor geometries and cascode configurations to increase output resistance, and provide significant stability at node B. In addition, a shunt capacitor 570 also may be employed to filter and thereby reduce flicker noise from the various tail devices.

Depending upon the selected application, the use of the negative transconductance amplifier 505 with its I(T) (or yI(x)) bias may provide sufficient frequency stability, such that the additional frequency controller components may not be necessary or desirable in that application. In other embodiments, however, additional accuracy and less frequency drift may be provided, using one or more of the components discussed in greater detail below.

In addition to providing a temperature-dependent current yI(x) (or I(T)), the various transistors M1, M2, M3 and M4 each have an associated resistance during conduction, which may also tend to cause frequency distortion and frequency drift during oscillation. In each half-cycle, either M1 and M4 or M2 and M3 are on and conducting. Such resistance is also temperature dependent. As a consequence, the transistors M1, M2, M3 and M4 should be adjusted in size (width and length) to also compensate for such frequency effects. It should be noted that the current injected into the resonant LC tank 405 must be sufficient to sustain oscillation (as illustrated in FIG. 5C) and, as a consequence, will have a minimum value, which may limit the degree or capability of frequency control which can be readily implemented through the negative transconductance amplifier 410 (or 505) and temperature-dependent current generator 415 (or 515). As a consequence, I(T) and the transistor (M1, M2, M3 and M4) sizing should be jointly selected to provide for oscillation start up, to accommodate maximum currents for power consumption constraints, and to fit into the selected IC area and layout. For example, the transconductance $g_m$ may be selected to provide approximately sufficient current to ensure start up and sustain oscillation, with a frequency characteristic of decreasing frequency with increasing temperature, followed by sizing transistors M1, M2, M3 and M4 to be large enough to either make the frequency independent of temperature or increasing with increasing temperature, followed by fine-tuning the frequency-temperature relationship with appropriate selection of I(T). In selected modeled embodiments, this has resulted in frequency accuracy of approximately ±0.25% to 0.5% over PVT, which may be more than sufficient for many applications.

Figure 20:
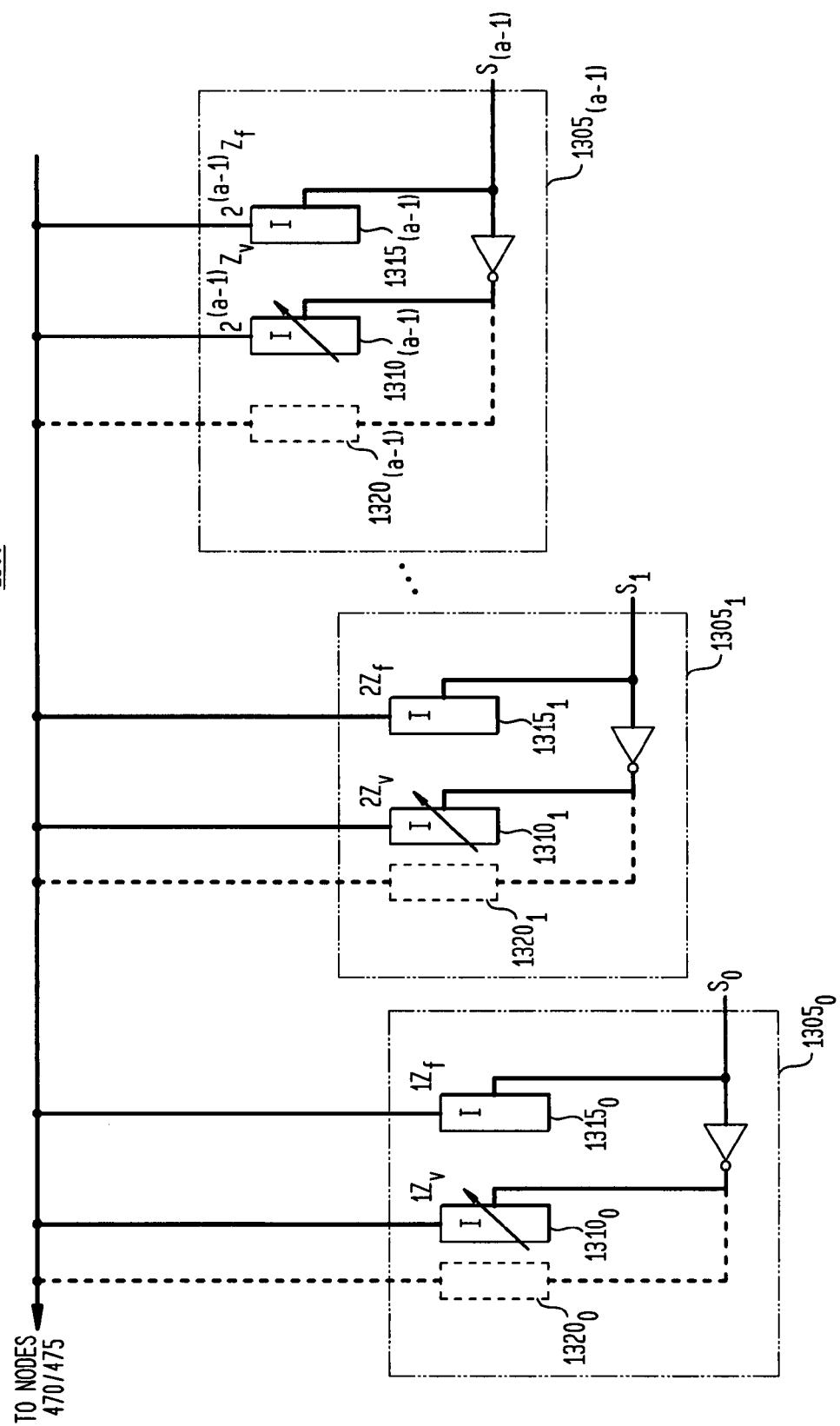
FIG. 20 (or "FIG. 20") is a block and circuit diagram illustrating an exemplary controlled impedance module utilized in a compensation module in accordance with the teachings of the present invention.

Referring again to FIG. 4, additional compensation modules are also utilized as part of frequency controller (215, 349, 1415) to provide greater control and accuracy over the resonant frequency $f_0$, such as for applications in which greater accuracy and less variance (or frequency drift) may be required, or where technologies do not allow the previous techniques to provide sufficient accuracy over PVT or age variations, such as to provide a frequency accuracy of approximately ±0.25% or better. In these circumstances, temperature-dependent (or temperature-responsive) frequency ($f_0$(T)) compensation module 420 may be utilized, such as the exemplary temperature-responsive frequency ($f_0$(T)) compensation module 420. This module 420 may be implemented, for example, utilizing controlled (or controllable) capacitance modules 485, with each coupled to a respective side or rail of the resonant LC tank 405 (lines 470 and 475), and with each under common control, provided by a first plurality ("w") of switching coefficients ($p_0$ though $p_{(w-1)}$) (register 495) and a voltage controller ($V_{CTRL}$) 480 providing a control voltage determined by a second plurality ("x") of switching coefficients ($q_0$ though $q_{(x-1)}$) (register 455), with representative examples illustrated in FIGS. 9 and 10. (The terms "controlled" and "controllable" are utilized interchangeably herein). Additional exemplary embodiments are illustrated in FIG. 20, which illustrates an exemplary controlled impedance module 1300 utilized in a frequency-temperature compensation module, such as in place of or in addition to controlled (or controllable) capacitance modules 485 in module 420; in FIG. 22, which illustrates another variation of controlled capacitance modules 485, as controlled capacitance modules 1500 with a plurality of temperature-dependent or other parameter-dependent control voltages (generated as illustrated FIGS. 23 or 26); in FIG. 25, which illustrates a plurality of controlled reactance modules 1805 which are switched in or out (coupled to or uncoupled from the resonator) in response to control signals from control logic 1810 and sensor(s) 1815, including feedback from the oscillator; in FIG. 26, which illustrates a plurality of controlled reactance modules 1805 which are switched in or out and/or switched to a control voltage, in response to control signals (continuous) or coefficients (discrete); and in FIG. 27, which illustrates a plurality of controlled reactance modules 1805 which are switched in response to control signals, for voltage variation compensation. There are several different types of switching available, such as coupling or uncoupling a reactance or impedance to the resonator, or switching coupled reactances or impedances to selected control voltages or other control signals, for example.

Figure 9:
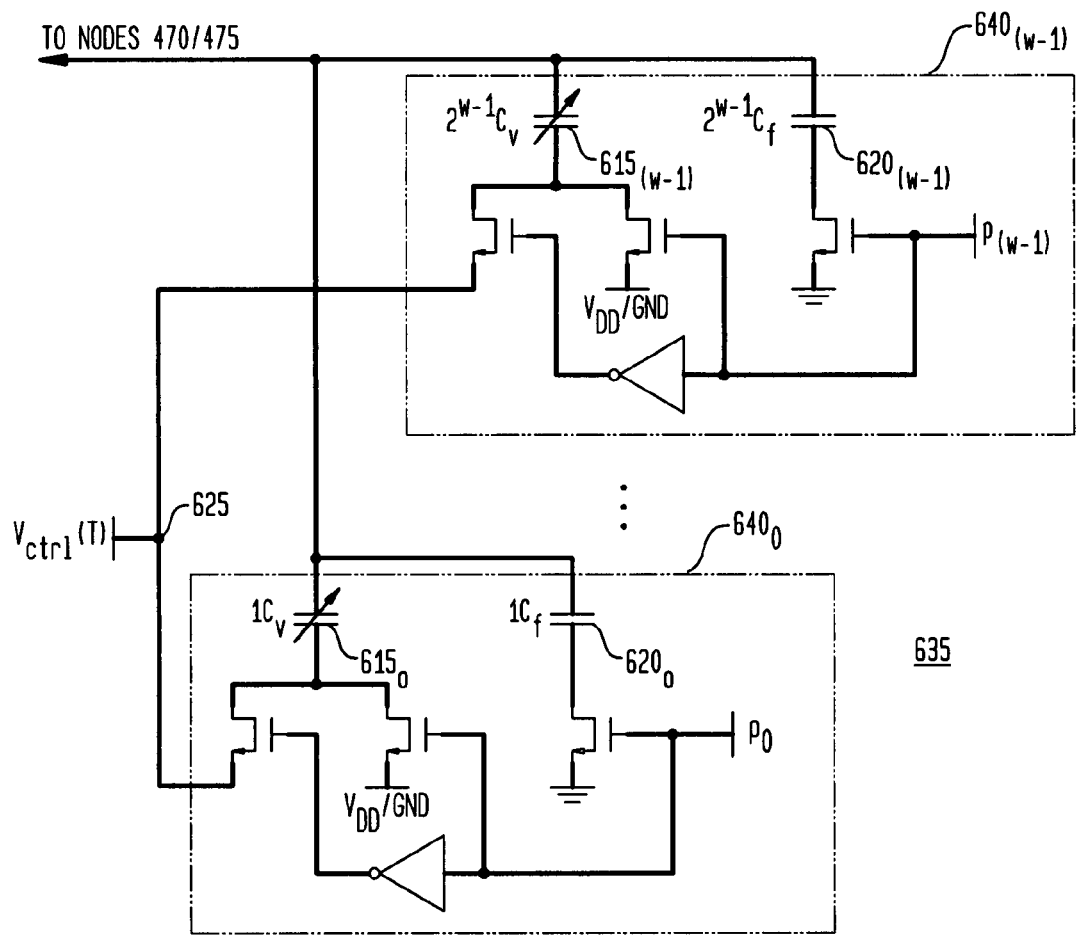
FIG. 9 (or "FIG. 9") is a circuit diagram illustrating an exemplary first controlled (or controllable) capacitance module utilized in a frequency-temperature compensation module in accordance with the teachings of the present invention.

FIG. 9 is a circuit diagram illustrating an exemplary first controllable capacitance module 635 in accordance with the teachings of the present invention, which may be utilized as the controlled (or controllable) capacitance modules 485 in the frequency-temperature compensation module 420 (and attached to each side of the resonant LC tank 405 (nodes or lines 470 and 475)). As illustrated, the controlled (or controllable) capacitance module 635 is comprised of a bank or array of a plurality (w) of switchable capacitive modules 640 of binary-weighted fixed capacitors ($C_f$) 620 and binary- or other differentially-weighted variable capacitors (varactors) ($C_v$) 615. Any type of fixed capacitors 620 and variable capacitors (varactors) 615 may be utilized; in selected embodiments, the varactors 615 are AMOS (accumulation-mode MOSFET), IMOS (inversion-mode MOSFET), and/or junction/diode varactors. Each switchable capacitive module 640 has an identical circuit layout, and each differs by a binary weighted capacitance, with switchable capacitive module 640$_0$ having a capacitance of one unit, switchable capacitive module 640$_1$ having a capacitance of two units, and so on, with switchable capacitive module 640$_{(w-1)}$ having a capacitance of $2^{(w-1)}$ units, with each unit representing a particular capacitance magnitude or value (typically in femtofarads (fF) or picofarads (pF)). As mentioned above, other differential weighting schemes are equally applicable, such as linear or binary, and may also consist of providing such differential weighting by switching the reactance to a selected control voltage, thereby increasing or decreasing its effective reactance.

Within each switchable module 640, each fixed and variable capacitance is initially equal, with the variable capacitance allowed to vary in response to the control voltage provided at node 625. This control voltage, in turn, varies with temperature or another selected variable parameter, resulting in an overall or total capacitance provided by the controlled capacitance module 635 also varying as a function of temperature (or other parameter) and which, in turn, is utilized to vary the resonant frequency $f_0$. In other selected embodiments, any of a plurality of control voltages may be utilized, including static control voltages, to provide for other types of compensation, discussed below. Also within each switchable capacitive module 640, either the fixed capacitance $C_f$ or the variable capacitance $C_v$ is switched into the circuit, not both, using switching coefficients $p_0$ though $p_{(w-1)}$. For example, in the selected embodiment, for a given or selected module 640, when its corresponding "p" coefficient is a logic high (or high voltage), the corresponding fixed capacitance $C_f$ is switched into the circuit and the corresponding variable capacitance $C_v$ is switched out of the circuit (and coupled to a power rail voltage $V_{DD}$ or ground (GND), depending whether the device is AMOS or IMOS, respectively, to avoid a floating node and to minimize the capacitance presented to the tank), and when its corresponding "p" coefficient is a logic low (or low voltage), the corresponding fixed capacitance $C_f$ is switched out of the circuit and the corresponding variable capacitance $C_v$ is switched into the circuit and coupled to the control voltage provided on node 625.

In an exemplary embodiment, a total of eight switchable capacitive modules 640 (and corresponding first plurality of eight switching coefficients $p_0$ though $p_7$ have been implemented to provide 256 combinations of fixed and variable capacitances. As a result, significant control over oscillation frequency as a function of temperature variations is provided.

It should be noted, in this exemplary embodiment, by switching in or out the fixed capacitance $C_f$ or the variable capacitance $C_v$, the ratio of fixed to variable changes and, correspondingly, the amount or degree of temperature-responsiveness of the controllable capacitance module 635. For example, with increasing amounts of variable capacitance $C_v$, the controllable capacitance module 635 provides greater variability of capacitance in response to temperature (or other parameter), thereby adjusting the frequency response of the tank or other oscillator.

Figure 10:
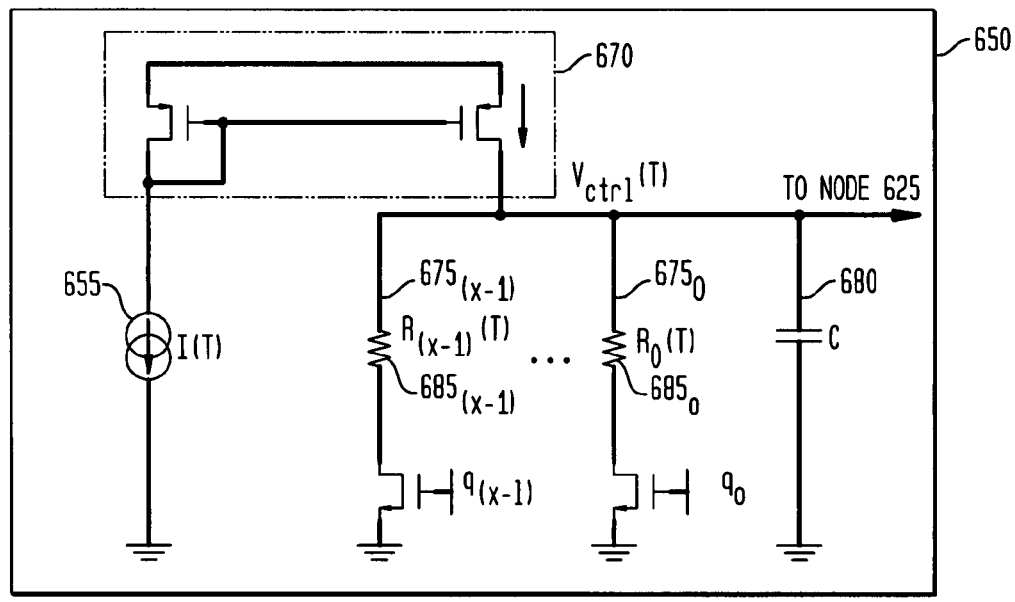
FIG. 10 (or "FIG. 10") is a circuit diagram illustrating an exemplary first voltage control module utilized in a frequency-temperature compensation module in accordance with the teachings of the present invention.

FIG. 10 is a circuit diagram illustrating an exemplary temperature dependent voltage control module 650 utilized to provide the control voltage in the controllable capacitance module 635 (of the frequency-temperature compensation module 420) and as $V_{CTRL}$ 480 (in FIG. 4), in accordance with the teachings of the present invention. As illustrated, voltage control module 650 creates a temperature-dependent current I(T) (or more generally, a current I(x)), using current generator 655, as previously discussed, using one or more combinations of PTAT, PTAT$^2$ and/or CTAT current generators, and may share the I(T) generator 415 utilized with the negative transconductance amplifier 410, instead of providing a separate generator 655. The temperature-dependent current I(T) (or I(x)) is mirrored through current mirror 670 to an array or bank of a plurality of switchable resistive modules or branches 675 and a fixed capacitive module or branch 680, all configured in parallel. In other exemplary embodiments, depending upon the parameter variation to be compensated, other control voltage generators discussed below may be utilized.

In other combinations, depending upon the selection and weighting of the PTAT, PTAT$^2$ and/or CTAT current generators, a temperature-independent current may also be generated. For example, a PTAT generator and a CTAT generator, sized to have equal magnitudes and opposite slopes, can be combined to create a current generator which provides a constant current over temperature fluctuations. Such a current generator, for example, can be utilized to provide a constant current source in the aging variation compensator illustrated in FIG. 30. Those of skill in the art will recognize that other current sources may also be utilized, such as those which vary with power supply voltage, and may be utilized as corresponding voltage sensors.

The resistors 685 may be any type or combination of different types, such as diffusion resistors (p or n), polysilicon, metal resistors, salicide or unsalicide polysilicon resistors, or well resistors (p or n well), for example. Depending upon the type or combination of types of resistors selected, the resistors 685 generally will also have a corresponding temperature dependence (or responsiveness), providing a corresponding voltage variation across the selected resistor 685 as a function of temperature for a given current through the selected resistor 685. For example, a diffusion resistor will generally have a high temperature coefficient (providing more voltage variation with temperature), while a polysilicon resistor will generally have a low temperature coefficient (providing less voltage variation with temperature), while a mix of a plurality of these different resistor types in series for a selected module 675 will provide a corresponding response in between these high and low response levels. Alternatively, the resistors 685 may be sized or weighted to provide different voltage levels as a function of a given current, such as a temperature-dependent current (e.g., I(T)), also thereby providing a corresponding voltage variation as a function of temperature for such a temperature-varying current.

Each switchable resistive module 675 is switched in or out of the voltage control module 650 by a corresponding "q" coefficient of a second plurality ("x") of switching coefficients $q_0$ though $q_{(x-1)}$. When switchable resistive module 675 is switched into the circuit (such as when its corresponding coefficient is a logic high or high voltage), the resulting voltage across its corresponding resistor 685 is also temperature-dependent, due to the temperature-dependent current I(T). In a selected embodiment, three switchable resistive modules 675 were utilized, providing 8 branch combinations. As a result, the control voltage provided to node 625 is also a function of temperature (or other parameter), thereby providing a temperature or other parameter dependence or sensitivity to the variable capacitors 615 in controllable capacitance module 635. Other resistive modules which are more generally parameter-dependent, or which are temperature-independent, are discussed below with reference to FIGS. 23 and 26, and FIG. 28, respectively.

Figure 24:
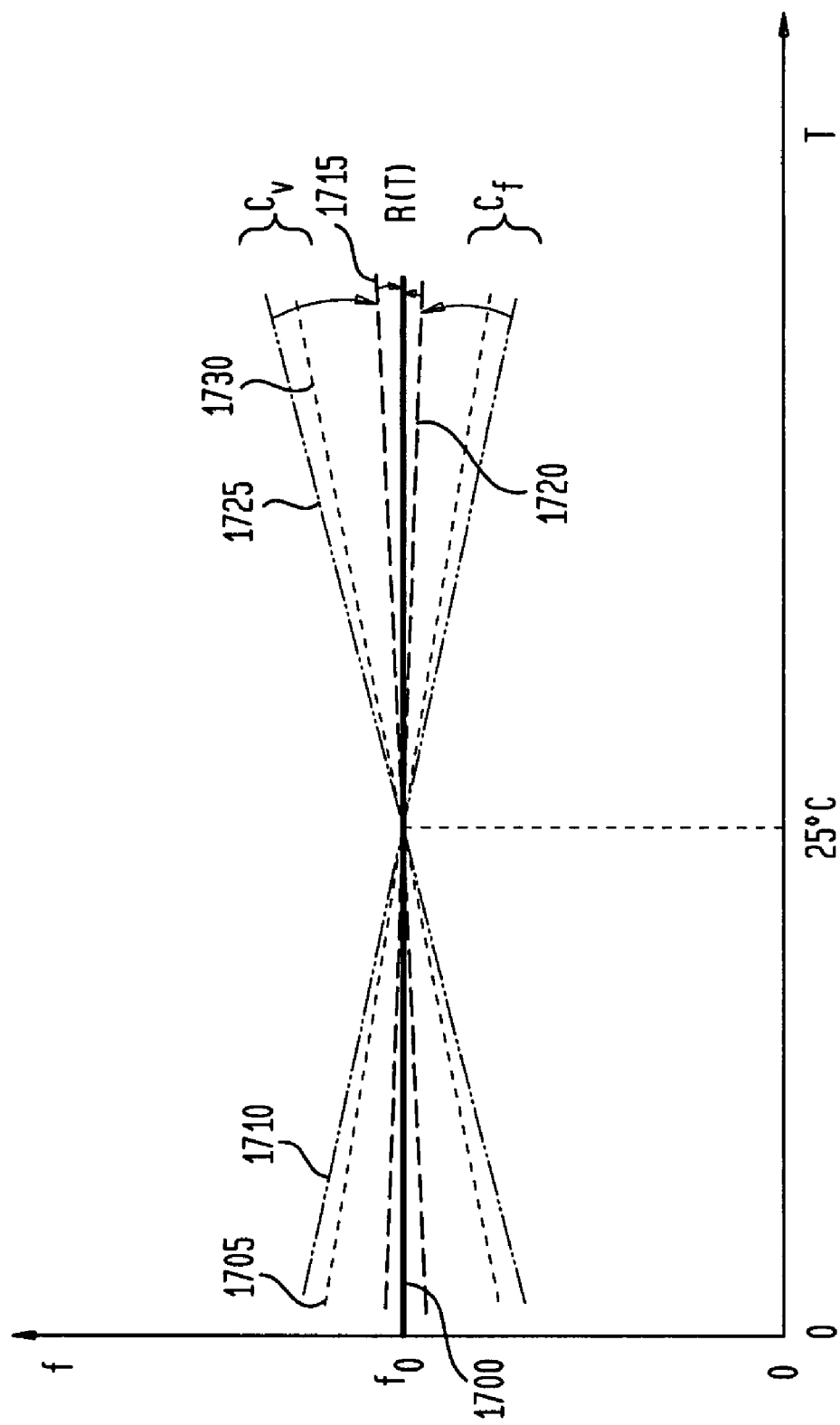
FIG. 24 (or "FIG. 24") is a graph illustrating exemplary frequency control in response to temperature variation in accordance with the teachings of the present invention.

The first plurality of switching coefficients $p_0$ though $p_{(w-1)}$ and the second plurality of switching coefficients $q_0$ though $q_{(x-1)}$ may be determined post-fabrication by testing a representative IC having the clock generator of the present invention. Once a resonant frequency $f_0$ has been selected and/or calibrated for a given fabrication process (discussed below with reference to FIGS. 11 and 12), the temperature (or other parameter) responsiveness of the oscillator is determined and adjusted, to provide a substantially constant selected resonant frequency $f_0$ for such variation in ambient or operating temperature (or other variable parameter). In the exemplary embodiments, the first plurality of switching coefficients $p_0$ though $p_{(w-1)}$ are determined first, by testing various combinations of coefficients, to provide a coarse level of adjustment, resulting in a substantially or mostly flat frequency response as a function of varying ambient temperature. As illustrated in FIG. 24, more or less fixed capacitance $C_f$ or variable capacitance $C_v$ is switched into or out of the oscillator. For example, when the uncompensated frequency response of the oscillator to temperature variation is represented by lines 1705 or 1710, additional variable capacitance $C_v$ may be switched in, providing a coarse adjustment for the frequency response of the oscillator to approximately line 1715. Conversely, also for example, when the uncompensated frequency response of the oscillator to temperature variation is represented by lines 1725 or 1730, additional fixed capacitance $C_f$ may be switched in, providing a coarse adjustment for the frequency response of the oscillator to approximately line 1720.

The second plurality of switching coefficients $q_0$ though $q_{(x-1)}$ are then determined, also by testing various combinations of coefficients, to provide a finer level of adjustment, resulting in a substantially and significantly flat frequency response as a function of varying ambient temperature, illustrated in FIG. 24 as adjusting a partially compensated frequency response (lines 1715 or 1720) to the substantially flat response of line 1700, through selection of the temperature responsiveness of the various resistors 685. The first and second pluralities of coefficients are then loaded into respective registers 495 and 455 in all of the ICs fabricated in the selected processing run (or batch). Depending on the fabrication processing, under other circumstances, it is possible that for higher accuracy, each IC may be separately calibrated. As result, in conjunction with the temperature compensation provided by the negative transconductance amplifier 410 and I(T) generator 415, the overall frequency response of the clock generator is substantially independent of temperature fluctuations.

In other exemplary embodiments, the first plurality of switching coefficients $p_0$ though $p_{(w-1)}$ and the second plurality of switching coefficients $q_0$ though $q_{(x-1)}$ may also be determined and varied dynamically during operation of the oscillator, such as through sensor(s) 1440 and A/D converter 1445, as illustrated in FIG. 21, or through sensor(s) 1815 and control logic (or control loop) 1810 illustrated in FIG. 25. In these alternative embodiments, the stored first and second pluralities of coefficients may be eliminated or bypassed, with corresponding voltages applied directly as control signals to the respective switching components as illustrated in FIGS. 9 and 10 (and, similarly, extended to the other pluralities of coefficients discussed below).

Figure 26:
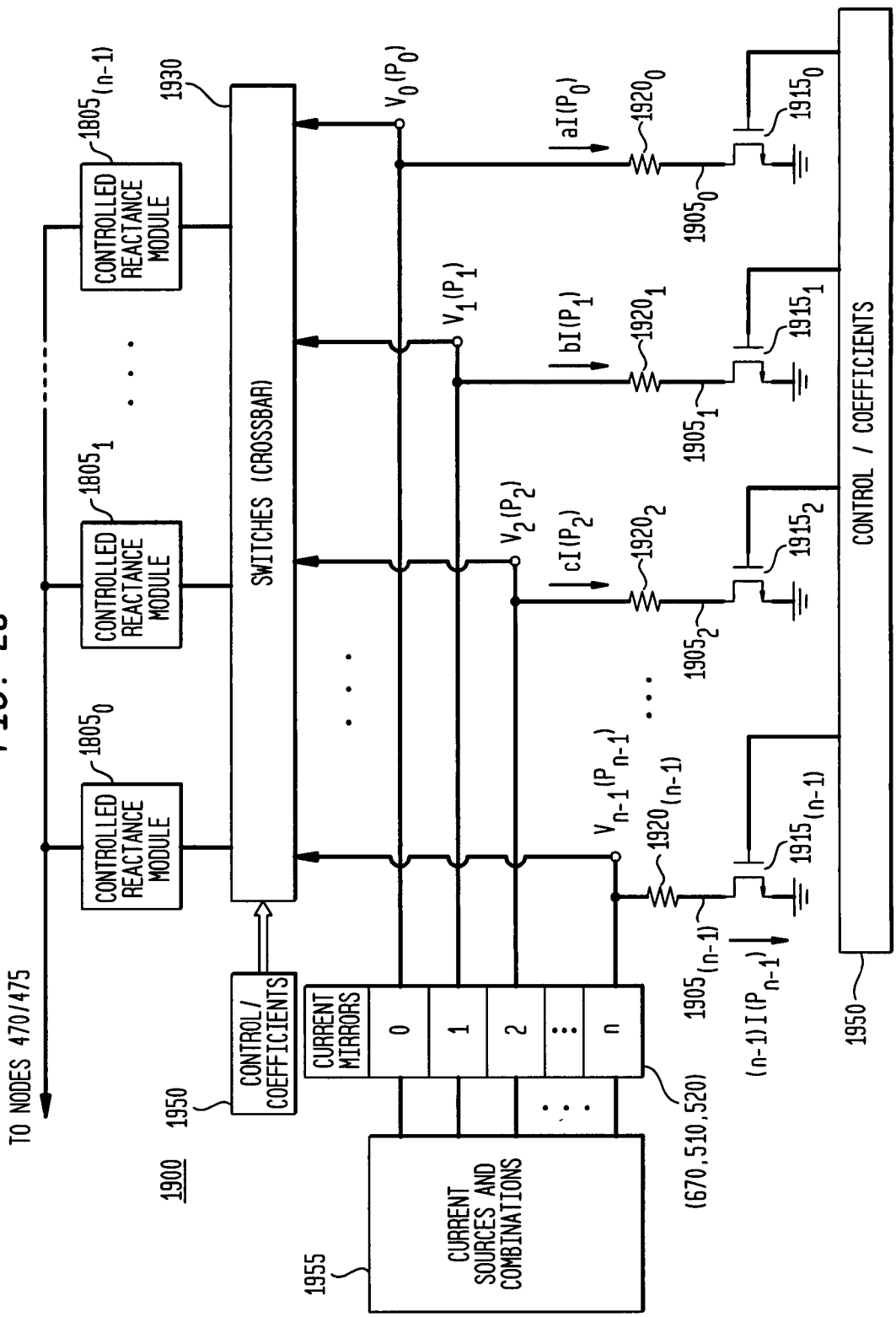
FIG. 26 (or "FIG. 26") is a circuit diagram illustrating an exemplary third controlled capacitance module and an exemplary third voltage control module utilized in a parameter compensation module in accordance with the teachings of the present invention.
Figure 28:
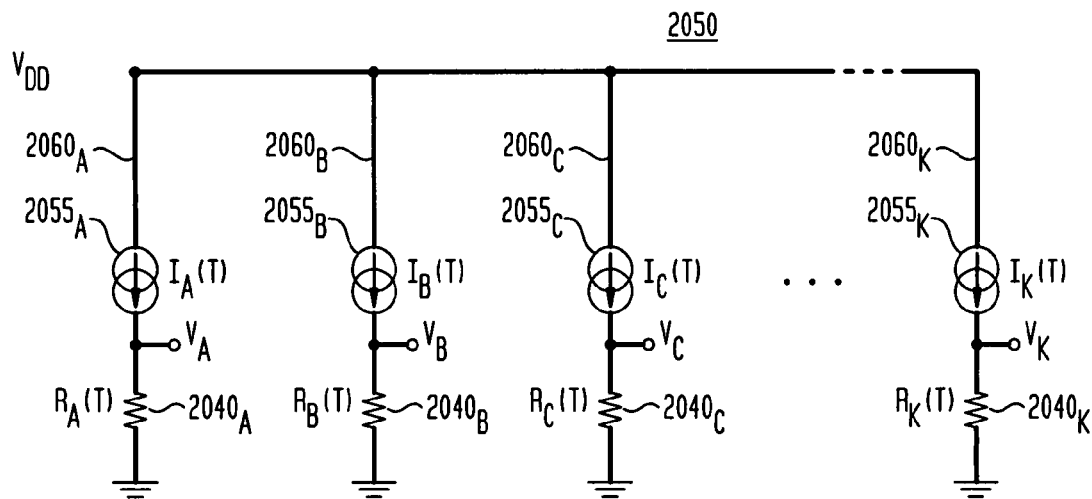
FIG. 28 (or "FIG. 28") is a circuit diagram illustrating an exemplary fourth voltage control module utilized in frequency and process compensation modules in accordance with the teachings of the present invention.

For example, as illustrated in FIG. 26, as discussed in greater detail below, any of a plurality of current sources 1955 may be provided in various combinations to a plurality of resistive modules, to create a plurality of control voltages responsive to a selected parameter "P", which may be switched in any combinations to each of the plurality of controlled reactance modules 1805, which may be embodied, for example, as controlled capacitance modules 1505 (FIG. 22), to control the effective reactance of the resonator. In addition, any of a plurality of constant (temperature independent) control voltages may also be created, as illustrated in FIG. 28. Moreover, other or additional types of current sources may be utilized, either to generate the control voltage or to provide sensor 385, 1440 capability, such as those which may vary with the supply voltage $V_{DD}$, or which are independent of both supply voltage, temperature, and other parameters. Any of these control voltages may be utilized to provide continuous control in real time, in addition to discrete control, over parameter variations, such as temperature variations.

As a consequence, the overall capacitance provided to the resonant LC tank 405 is distributed into a combination of fixed and variable portions, with the variable portions responsive to provide temperature compensation and, therefore, control over the resonant frequency $f_0$. The more variable capacitance $C_v$ which is switched into the circuit (controlled capacitor module 635), the greater the frequency response to fluctuations in ambient temperature. As indicated above, both fixed and variable capacitors may be implemented using variable capacitors (varactors) coupled or switched, respectively, to substantially constant or variable voltages.

In addition to providing temperature compensation, it should be noted that a switched or controlled (or controllable) capacitance module 635 may also be utilized to select or tune the resonant frequency $f_0$. It will also be apparent to those of skill in the art that a switched or controllable capacitance module 635 may also be utilized to provide a frequency response to other parameter variations, such as fabrication process variations, frequency, and voltage fluctuations. In addition, as discussed below with reference to FIGS. 20 and 25-27, a capacitance, an inductance, a resistance, or any other reactance or impedance element may be utilized in these various exemplary embodiments, providing a controlled reactance or impedance module to provide a selected frequency response to any of a plurality of variable parameters, such as temperature, voltage, fabrication process, or frequency.

Figure 22:
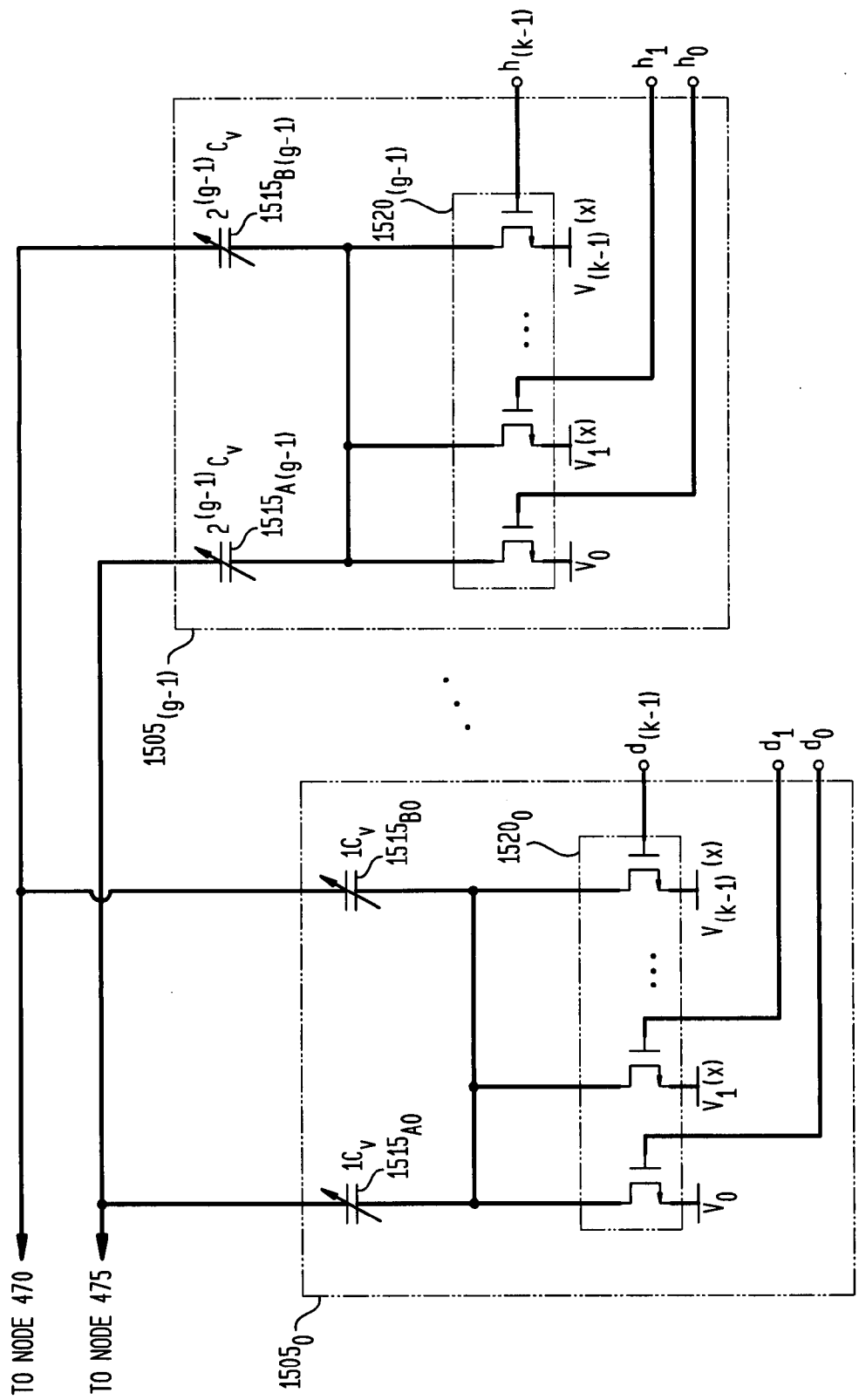
FIG. 22 (or "FIG. 22") is a circuit diagram illustrating an exemplary second controlled capacitance module utilized in a frequency-temperature compensation module in accordance with the teachings of the present invention.

FIG. 22 is a circuit diagram illustrating an exemplary second controlled capacitor module 1500 utilized (with module 1600 of FIG. 23) (in lieu of or in addition to modules 485 and 480) in a frequency-temperature compensation module 420, or more generally, in a frequency controller 215, 349, 1415, in accordance with the teachings of the present invention. The second controlled capacitance module 1500 operates similarly to the first controlled capacitance module 635, but utilizes variable capacitances, instead of both fixed and variable, and utilizes a plurality of different control voltages, instead of a single control voltage. In addition, such variable capacitances are not coupled to or decoupled from the resonator (i.e., the variable capacitances are always coupled to the resonator), and instead are switched to different control voltages to control the frequency response as a function of a selected parameter such as temperature. Selected embodiments, moreover, may utilize as few as one module, and the differential weighting may be accomplished by switching to a selected control voltage of a plurality of control voltages.

Referring to FIG. 22, the second controlled capacitor module 1500 utilizes at least one of a plurality ("g") of variable capacitance modules 1505, each of which contains variable capacitances ($C_v$) $1515_{A0}$ through $1515_{B(g-1)}$ (illustrated in pairs A and B, corresponding to balanced coupling to node 475 or 470, and illustrated with binary-weighting) which are switchable (through pluralities of transistors or other switches $1520_0$ through $1520_{(g-1)}$) to a selected control voltage of a plurality of control voltages $V_0$, $V_1(x)$, through $V_{(k-1)}(X)$, where control voltage $V_0$ is substantially static (substantially non-responsive to the selected parameter "x", such as temperature), while the remaining control voltages $V_1(x)$ through $V_{(k-1)}(x)$ are generally responsive or sensitive to the selected parameter "x", such as temperature. As illustrated, the backplates of each corresponding pair of variable capacitors 1515 (A and B) are coupled to each other (shorted together), and then connected via a switch to a selected control voltage. Each such pair of variable capacitances 1515 is switchable, through corresponding coefficients (illustrated as a fourth plurality of coefficients $d_0$, $d_1$, ... $d_{(k-1)}$ through $h_0$, $h_1$, ... $h_{(k-1)}$, such that each module 1505 may be switched separately and independently to any of the plurality of control voltages $V_0$, $V_1(x)$, through $V_{(k-1)}(x)$. As a consequence, these switchable modules may remain coupled to the resonator with the effective impedance (e.g., reactance) varied through switching to one or more control voltages.

Figure 23:
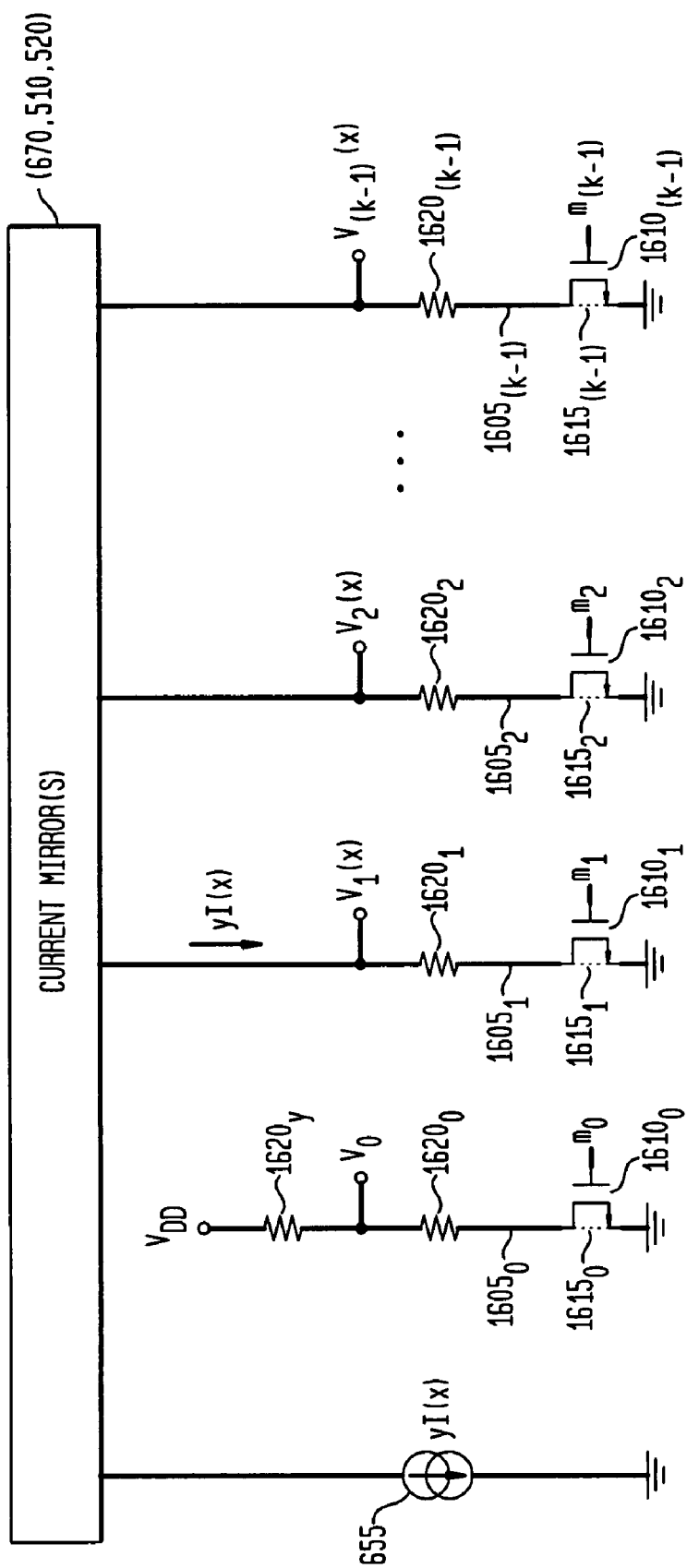
FIG. 23 (or "FIG. 23") is a circuit diagram illustrating an exemplary second voltage control module utilized in a frequency-temperature compensation module in accordance with the teachings of the present invention.

FIG. 23 is a circuit diagram illustrating an exemplary second voltage control module 1600 utilized in a frequency-temperature compensation module in accordance with the teachings of the present invention. As illustrated in FIG. 23, a parameter-sensitive or responsive current source 655 (such as any of the various CTAT, PTAT and $PTAT^2$ temperature sensitive current sources, and their combinations, previously discussed an illustrated in FIGS. 7A-7D) is provided (through one or more current mirrors (e.g., 670, 510, 520)) to an array or bank of a plurality "k–1" of resistive modules 1605 (illustrated as modules $1605_0$, $1605_1$, through $1605_{(k-1)}$), each of which provides a separate or independent control voltage, $V_1(x)$, $V_2(x)$, through $V_{(k-1)}(x)$ which are provided to modules 1505 (of FIG. 22). The various corresponding resistors $1620_0$, $1620_1$, through $1620_{(k-1)}$ may be any of the types, sizes or weights previously discussed with reference to FIG. 10, to provide any selected voltage response to a selected parameter, such as temperature. A static control voltage, $V_0$, as illustrated, may be generated utilizing any voltage divider coupled between the voltage supply rail $V_{DD}$ and ground, with corresponding resistance magnitudes or values $1605_0$ and $1605_y$ selected to provide the desired static voltage level. In addition, generation of a plurality of different static or constant (i.e., temperature independent) voltages is illustrated in FIG. 28, by combining different current sources having differently shaped currents in response to temperature (or another parameter) with different temperature-dependent resistors having complementary or opposing temperature responses, resulting in a plurality of control voltages having different magnitudes and substantially constant over temperature variations. Any of these various voltages may be utilized, as needed, as any of the various control voltages.

In the exemplary embodiments, each such control voltage of the plurality of control voltages is different, to provide a plurality of control voltages, each of which are differently responsive or shaped (i.e., provide different responses (response curves) as a function of variations in the selected parameter such as temperature), may respond to different parameters, and others which may be substantially constant with respect to a selected parameter. Depending upon the selected embodiment, the array or bank of resistive modules 1605 may be switchable (through corresponding transistors 1610 (illustrated as transistors $1610_0$, $1610_1$, through $1610_{(k-1)}$), and thereby switched into or out of the array 1600, or may be statically included (fixed connections 1615, illustrated as dashed lines in FIG. 23) to automatically generate a predetermined number of control voltages $V_0$, $V_1(x)$, through $V_{(k-1)}(x)$. Depending upon the selection of resistors 1620 (and/or transistors 1610, if included), each of the various control voltages $V_0$, $V_1(x)$, through $V_{(k-1)}(x)$ will be different or otherwise provide a different response to the selected parameter or variable, such as a different temperature response.

Similarly, FIG. 26 is a circuit and block diagram illustrating an exemplary third voltage control module 1900 which may be utilized to provide control voltages to any of the various modules in accordance with the teachings of the present invention. As illustrated in FIG. 26, a plurality of parameter-sensitive or responsive current sources 1955 (such as any of the various CTAT, PTAT and $PTAT^2$ temperature sensitive current sources, and their combinations, previously discussed an illustrated in FIGS. 7A-7D) is provided (through one or more current mirrors (e.g., 670, 510, 520)) to an array or bank of a plurality "n–1" of resistive modules 1905 (illustrated as modules $1905_0$, $1905_1$, through $1905_{(n-1)}$). Each of the resistive modules 1905 provides a separate or independent control voltage, $V_0(P)$, $V_1(P)$, $V_2(P)$, through $V_{(n-1)}(P)$, creating a plurality of control voltages which are responsive or dependent upon the selected parameter "P", and which are provided to controlled reactance modules 1805, controlled capacitance modules 1505 (of FIG. 22), or any of the other modules utilizing one or more control voltages. The various corresponding resistors $1920_0$, $1920_1$, through $1920_{(n-1)}$ may be any of the types, sizes or weights previously discussed, to provide any selected voltage response to a selected parameter. The selection of current source (or combination of current sources) and resistor size and type allows the shaping of the response of any desired control voltage to the selected parameter. In addition, any of the plurality of different static or constant (i.e., temperature independent) voltages illustrated in FIG. 28 also may be utilized, as needed, as any of the various control voltages for any of the modules discussed.

Depending upon the selected embodiment, the array or bank of resistive modules 1905 may be switchable (through corresponding transistors 1915 (illustrated as transistors $1915_0$, $1915_1$, through $1915_{(n-1)}$), and thereby switched into or out of the array, dynamically or statically, to automatically generate a plurality of control voltages $V_0(P)$, $V_1(P)$, $V_2(P)$, through $V_{(n-1)}(P)$. Each of these different control voltages may then be switched (using switches 1930, such as a full crossbar switch), in any combination, statically or dynamically, under the switching control of control signals and/or coefficients 1950, to controlled reactance modules 1805, which may be coupled to the resonator or which also may be switched into or out of the tank. As a consequence, any of these control voltages may be utilized to control the effective reactance of the resonator (oscillator), providing both discrete and continuous control of the resulting resonant frequency. For example, any of these parameter-dependent control voltages $V_0(P)$, $V_1(P)$, $V_2(P)$, through $V_{(n-1)}(P)$, or any of the substantially parameter-independent control voltages (FIG. 28), may be provided to the controlled impedance modules 1305 or the controlled capacitance modules 1505 or 1805 to vary the effective capacitance provided to the resonator, providing frequency control over variations from any of a plurality of parameters.

Referring again to FIG. 22, when each of these different control voltages $V_0$, $V_1(x)$, through $V_{(k-1)}(x)$, or more generally, $V_0(P)$, $V_1(P)$, $V_2(P)$, through $V_{(n-1)}(P)$, and any of the substantially constant control voltages, is available and switchable to the variable capacitances $C_v$ 1515 in the variable capacitance modules 1505 through the fourth plurality of coefficients $d_0, d_1, \ldots d_{(k-1)}$ through $h_0, h_1, \ldots h_{(k-1)}$, a highly flexible, fine-tuned and highly controllable frequency response to the selected parameter (such as temperature) is provided to the resonator 405, enabling highly accurate frequency control over the resonant frequency $f_0$. For example, variable capacitances $1515_{A(g-1)}$ and $1515_{B(g-1)}$ in module $1505_{(g-1)}$ may be switched to control voltage $V_1(x)$ through parameter $h_1$ (or a corresponding dynamically applied voltage, as a control signal ) being set to a logic high or high voltage with the remaining h parameters of the fourth plurality of parameters set to a logic low or low voltage, providing a first frequency response as a function of temperature or another selected parameter, while variable capacitances $1515_{A0}$ and $1515_{B0}$ in module 15050 may be switched to control voltage $V_{(k-1)}(x)$ through parameter $d_{(k-1)}$ (or a corresponding dynamically applied voltage, as another control signal) being set to a logic high or high voltage with the remaining d parameters of the fourth plurality of parameters set to a logic low or low voltage, providing a second frequency response as a function of temperature or another selected parameter, and so on. As discussed above, the fourth plurality of coefficients $d_0, d_1, \ldots d_{(k-1)}$ through $h_0, h_1, \ldots h_{(k-1)}$, also may be determined post-fabrication through testing one or more ICs, or may also be determined and varied dynamically during operation of the oscillator, such as through sensor(s) 1440 and A/D converter 1445, as illustrated in FIG. 21, or through sensor(s) 1815 and control logic (or control loop) 1810 illustrated in FIG. 25. More generally, such control through either coefficients or control signals is illustrated in FIG. 26, and can be utilized to provide either or both discrete or continuous frequency control as a function of any selected parameter, such as temperature, voltage, fabrication process, age, or frequency.

In addition, in lieu of stored coefficients for the first, second or fourth pluralities of coefficients, particularly when the corresponding values would be determined dynamically, as discussed above, corresponding voltages may be directly applied to the various switches (e.g., transistors 1520 or the switching transistors of modules 640 and 650), as control signals, as mentioned above.

Referring again to FIG. 4, another compensation module is also utilized to provide greater control and accuracy over the resonant frequency $f_0$, also for applications in which greater accuracy and less variance (or frequency drift) may be required, such as to provide a frequency accuracy of approximately ±0.25% or better over PVT. In these circumstances, a process variation compensation module 425 may be utilized, to provide control over the resonant frequency $f_0$ independently of fabrication process variations, such as the exemplary modules illustrated in FIGS. 11 and 12. As indicated above, any of these various modules may include any impedance, reactance, or resistance, and be made responsive to any selected parameter, such as temperature, process variation, voltage variation, and frequency variation.

Figure 11:
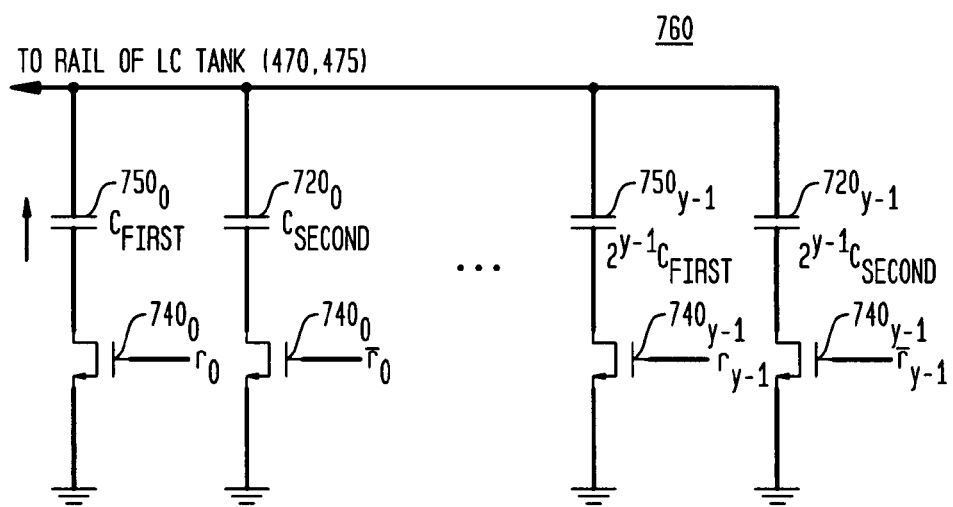
FIG. 11 (or "FIG. 11") is a circuit diagram illustrating an exemplary first process variation compensation module in accordance with the teachings of the present invention.

FIG. 11 is a circuit diagram illustrating an exemplary first process variation compensation module 760 in accordance with the teachings of the present invention. The first process variation compensation module 760 may be utilized as the process compensation modules 460 in FIG. 4, with each module attached to a rail or side of the resonant LC tank 405 (lines or nodes 470 and 475). In addition, each first process variation compensation module 760 is controlled by a third plurality ("y") of switching coefficients $r_0$ though $r_{(y-1)}$, stored in register 465. The first process variation compensation module 760 provides an array of switchable capacitive modules having differentially-weighted (e.g., binary-weighted), first fixed capacitances 750, for adjustment and selection of the resonant frequency $f_0$, by switching in or out a plurality of fixed capacitances 750, through a corresponding plurality of switching transistors 740 (controlled by a corresponding "r" coefficient). Again, as each capacitance branch is switched in or out of the array or circuit 760, the corresponding first fixed capacitance is added or subtracted from the total capacitance available for oscillation in the resonant LC tank, thereby changing the effective reactance and modulating the resonant frequency. The third plurality of switching coefficients $r_0$ though $r_{(y-1)}$ is also determined post-fabrication using test ICs, generally as an iterative process with the determinations of the first and second (or fourth) pluralities of switching coefficients. This calibration is accomplished using the frequency calibration module (325 or 430) and a reference oscillator known to have a predetermined frequency. The determined "r" coefficients are then stored in the corresponding registers 465 of the ICs of that production or process batch. Alternatively, each IC may be calibrated separately, for example.

In addition to such calibration methods, the third plurality of switching coefficients $r_0$ though $r_{(y-1)}$ may also be determined using other methods, discussed below, such as using various voltage and current sensors to measure parameters or variables which reflect fabrication process parameters, such as transistor threshold voltages, resistance magnitudes or values of the tank, or absolute current levels produced by the various current sources. Such measured values may then be utilized to provide corresponding coefficients (the third plurality of switching coefficients $r_0$ though $r_{(y-1)}$) and/or control signals for corresponding frequency adjustment. For example, such measured or sensed values may be converted to digital values, which are then indexed to a lookup table in memory, which then provides stored values based on known values, or other calibrations or modeling.

To avoid additional frequency distortions, several additional features may be implemented with this first process variation compensation module 760. First, to avoid additional frequency distortion, the on resistance of the MOS transistors 740 should be small, and therefore the transistors' width/length ratio is large. Second, large capacitances may be split into two branches, with two corresponding transistors 740 controlled by the same "r" coefficient. Third, to provide for the resonant LC tank to have a similar load under all conditions, when a first fixed capacitance 750 is switched in or out of the circuit 760, a corresponding second fixed capacitance 720, as a "dummy" capacitor (having a significantly smaller capacitance or the smallest size allowed by the design rules for the fabrication process), is correspondingly switched out of or into the circuit, based on the inverse of the corresponding "r" coefficient. As a consequence, approximately or substantially the same on resistance of the transistors 740 is always present, with only the amount of capacitance varied.

As an alternative to the use of the "dummy" capacitances, metal fuses or the like could be utilized instead of the transistors 740. Metal fuses would be left intact to include the corresponding fixed capacitance 750, and could be "blown" (open-circuited) to remove the corresponding fixed capacitance 750 from the resonant LC tank 405.

Figure 12:
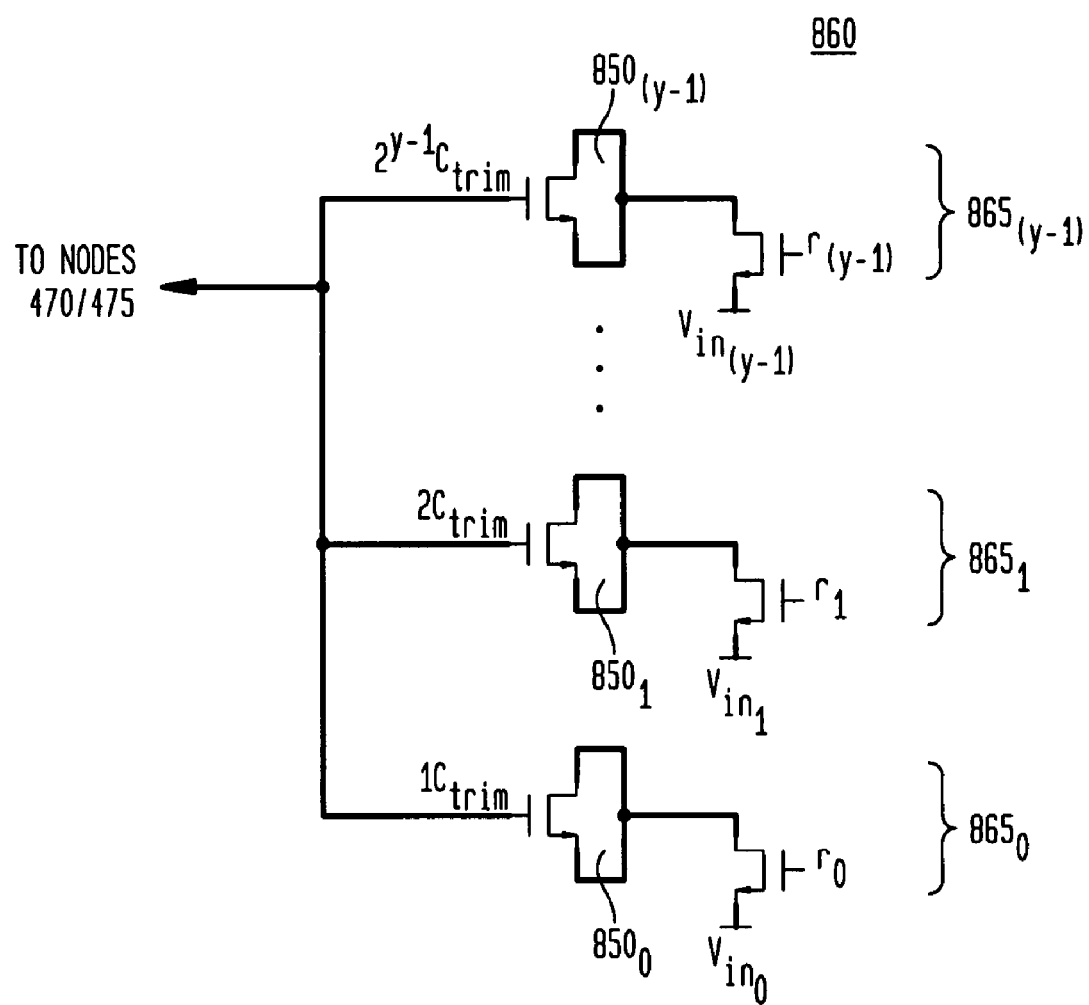
FIG. 12 (or "FIG. 12") is a circuit diagram illustrating an exemplary second process variation compensation module in accordance with the teachings of the present invention.

FIG. 12 is a circuit diagram illustrating an exemplary second process variation compensation module 860 in accordance with the teachings of the present invention. The second process variation compensation module 860 may be utilized as the process compensation modules 460 in FIG. 4, with each module attached to a rail or side (lines 470 and 475) of the resonant LC tank 405, instead of modules 760. More generally, the second process variation compensation module 860 is utilized as part of frequency controller (215, 349 or 1415), such as process (or other parameter) modulator or compensator 1430 (FIG. 21). In addition, each second process variation compensation module 760 would also be controlled by a third plurality of switching coefficients $r_0$ though $r_{(y-1)}$, stored in register 465. (Because of the different circuitry employed in each exemplary process variation compensation module 760 or 860, however, the corresponding third pluralities of switching coefficients $r_0$ though $r_{(y-1)}$ generally would, of course, be different from each other.) In addition, such switching may be controlled through use of any control signals, discussed above.

It should be noted that FIG. 12 provides a varactor illustration different from those utilized in other Figures, in which a varactor 850 is represented by a MOS transistor, rather than as a capacitor with an arrow through it. Those of skill in the art will recognize that varactors are often AMOS or IMOS transistors, or more generally MOS transistors, such as those illustrated in FIG. 12, and configured by shorting the transistor's source and drain. As a consequence, the other illustrated varactors may be consider to include, as potential embodiments, the AMOS or IMOS transistors as configured as in FIG. 12. In addition, the varactors 850 may also be binary-weighted with respect to each other, or may use another differential weighting scheme.

The second process variation compensation module 860 has a similar structural concept, but additional notable differences from the first process variation compensation module 760. The second process variation compensation module 860 provides an array or bank of a plurality of switchable variable capacitive modules 865, without MOS switches/transistors, and hence the losses or loading through the MOS transistors are eliminated. Instead, the load appears as a low loss capacitance; such low loss also implies that the oscillator start-up power is less. In the second process variation compensation module 860, a MOS varactor 850 is switched either to $V_{in}$, which may be any of the various pluralities of control voltages discussed above, to provide a corresponding capacitance level to the resonant LC tank 405, or may be switched to ground or the power rail (voltage $VD_D$), thereby providing either the minimum capacitance or the maximum capacitance to the resonant LC tank 405 based upon the varactor 850 geometry. For AMOS, switched to voltage $VD_D$ would provide minimum capacitance and switched to ground would provide maximum capacitance, while the opposite is the case for IMOS. Again, the second process variation compensation module 860 is comprised of an array of variable capacitances, as varactors 850, for adjustment and selection of the resonant frequency $f_0$, by coupling or switching a selected varactor 850 to any of a plurality of control voltages (Vin), or to ground or $V_{DD}$, such as switching between a first voltage and a second voltage, through a corresponding "r" coefficient or through application of a corresponding control signal. In another alternative, instead of a plurality or an array, one varactor 850 may be utilized, with its effective reactance provided to the tank controlled by a selected control voltage.

As each capacitance branch is switched to a corresponding control voltage, ground or $V_{DD}$, the corresponding variable capacitance is added to or not included in the total capacitance available for oscillation in the resonant LC tank, thereby changing its effective reactance and modulating the resonant frequency. More particularly, for an AMOS implementation, coupling to $V_{DD}$ (as $V_{in}$) provides lesser capacitance and coupling to ground ($V_{in}$=0) provides greater capacitance, with the opposite holding for an IMOS implementation, in which coupling to $V_{DD}$ (as $V_{in}$) provides greater capacitance and coupling to ground ($V_{in}$=0) provides lesser capacitance, where it is assumed that the voltage on the rails of the LC tank (nodes or lines 470 and 475 of FIG. 4) is between zero V and voltage $V_{DD}$, and significantly or substantially far from either voltage level. Coupling to voltages between $V_{DD}$ and ground, such as many of the various control voltages, as Vin, will provide a corresponding, intermediate level of capacitance to the tank. The third plurality of switching coefficients $r_0$ though $r_{(y-1)}$ is also determined post-fabrication using test ICs, also generally as an iterative process with the determinations of the first and second pluralities of switching coefficients. The determined "r" coefficients are then stored in the corresponding registers 465 of the ICs of that production or process batch. Again, individual ICs may also be calibrated and tested separately. In addition, any selected number of modules 850 may be controlled dynamically, to provide continuous frequency control during oscillator operation.

As indicated above, depending upon the type (AMOS or IMOS) of varactor, switching any of the variable capacitive modules 865 to $V_{DD}$ or ground, as first and second voltage levels, results in the corresponding maximum capacitance or no (negligible) capacitance being included as effective capacitance for the resonator (LC tank). As mentioned above, however, other capacitance levels intermediate between such maxima and minima may also be generated, by switching the variable capacitive modules 865 to a corresponding control voltage. Utilizing a plurality of control voltages having different magnitudes, results in a corresponding capacitance of the variable capacitive modules 865 being added to (or subtracted from) the LC tank, thus changing its effective reactance and modulating the resonant frequency.

FIG. 28 is a circuit diagram illustrating an exemplary fourth voltage control module 2050 utilized in frequency, process and other parameter compensation modules in accordance with the teachings of the present invention. Referring to FIG. 28, a plurality of substantially constant voltage modules 2060 (illustrated as $2060_A$, $2060_B$, $2060_C$ through $2060_K$) are utilized to create a corresponding plurality of control voltages which are substantially constant with respect to a selected parameter, such as temperature, and which have a corresponding plurality of different magnitudes, creating a plurality of control voltages $V_A$, $V_B$, $V_C$ through $V_K$, which have different magnitudes. As illustrated, the plurality of different, substantially static or constant (i.e., temperature independent) voltages is created by combining different current sources 2055 (illustrated as current sources $2055_A$, $2055_B$, $2055_C$ through $2055_K$), each having different responses to temperature or another parameter (i.e., differently shaped currents in response to temperature (or another parameter)), with a corresponding plurality of resistors 2040 (illustrated as corresponding resistors $2040_A$, $2040_B$, $2040_C$ through $2040_K$), each of which have a temperature or other parameter-dependent response which is opposing or complementary to the corresponding current source 2055 of the particular module 2060. Each corresponding current source 2055 and resistor 2040 is selected to have such opposing or complementary responses with the other, to effectively cancel the other's response to the selected parameter. For example, a current source 2055 is selected to have a particular combination of PTAT, CTAT or $CTAT^2$ current sources of appropriate magnitude, and a resistor 2040 is selected based on size, type, and so on, such that the resulting voltage is substantially constant over the parameter variations, e.g., temperature variations.

Any of these various voltages may be utilized, as needed, as any of the various control voltages, such as to provide a corresponding Vin for the variable capacitive modules 865 illustrated in FIG. 12, to adjust the effective capacitance (reactance) of the resonator and the resulting resonant frequency.

It should also be noted that the illustrated embodiments for modules such as temperature compensator 315 (or 410, 415 and/or 420) and process variation compensator 320 (or 425 and 460), such as those illustrated in FIGS. 6-12, may be utilized for other purposes. For example, the various illustrated embodiments for the compensator 315 (or 410, 415 and/or 420) may be made dependent upon process variation, rather than temperature. Similarly, the various illustrated embodiments for the compensator 320 (or 425 and 460) may be made dependent upon temperature, rather than process variation. As a consequence, the embodiments for these and other modules should not be considered limited to the exemplary circuits and structures illustrated, as those of skill in the art will recognize additional and equivalent circuits and applications, all of which are within the scope of the invention.

As indicated above, the various illustrated controlled capacitance modules (485, 635, 460, 760, 860, 1501) may be generalized to any reactance or impedance element, whether a capacitance, inductance, resistance, or combination of capacitance, inductance or resistance. An array or bank 1300 of such a plurality ("a") of switchable, controlled impedance (or reactance) modules 1305 are illustrated in FIG. 20, and may be utilized within the frequency controller (215, 349, 1400) of the present invention, as any of the various modulators or compensators (315, 320, 355, 1420, 1425, 1430). Each differently weighted, controlled reactance or impedance module 1305 (illustrated as $1305_0$, $1305_1$, through $1305_{(a-1)}$) is comprised of one or more fixed reactances $Z_f$ 1315, variable reactances $Z_v$ 1310, or "dummy" reactances 1320, which are switchable in response to a corresponding coefficient "s" of a fifth plurality of coefficients ($S_0$, $S_1$, through $S_{(a-1)}$). The array of controlled reactance or impedance modules 1305 generally may be implemented to operate as discussed above with respect to any of the various controlled capacitance modules, in any of the various embodiments. The fifth plurality of coefficients may be determined post-fabrication, or dynamically, as discussed above for the other sets of coefficients. In addition, depending upon the implementation, the various reactances or impedances may be switched in or out of the array 1300 or switched to various control voltages or ground, as previously illustrated, and may be utilized to provide a selected frequency response of the oscillator in response to any of a plurality of parameters, such as temperature variations, voltage fluctuations, fabrication process, or frequency.

Similarly, referring to FIG. 25, an array or bank of a plurality "n" of switchable, controlled reactance modules 1805 are illustrated (as controlled reactance modules $1805_0$ through $1805_{(n-1)}$), and also may be utilized within the frequency controller (215, 1415) of the present invention, as any of the various modulators or compensators (315, 320, 355, 1420, 1425, 1430). These controlled reactance modules 1805 may also be binary, linearly, or otherwise differently weighted, and switched in or out of the various circuits, switched to one or more control voltages, or any combination thereof, and may be responsive to any selected parameter. The array of controlled reactance modules 1805 generally may be implemented to operate as discussed above with respect to any of the various controlled capacitance modules, in any of the various embodiments. Rather than being switched to the oscillator through a plurality of coefficients, in this exemplary embodiment, the controlled reactance modules 1805 are switched dynamically, through voltages or currents provided directly by sensors 1815 and control logic 1810, with feedback provided (line or node 1820), and which may be implemented as known in the art, or as illustrated above, with all such variations considered within the scope of the present invention. In addition, the reactance modules may be more considered more broadly, as impedance modules, with both a resistive and/or reactance aspect, such as utilizing the various resistors illustrated in FIG. 29.

For example, such variations in the selected parameter may be determined in any of a plurality of ways previously discussed, such as through a temperature-sensitive current source, other temperature sensors, or any other type of sensor which is responsive to the selected parameter. For example, a sensor may comprise a voltage across a diode, providing a voltage output responsive to temperature. Referring to FIG. 21, the output of such a sensor 1440 may be provided to A/D converter 1445, which provides a digital output indicative of the level of the sensed parameter, which may then be utilized as the corresponding coefficients (any of the pluralities of coefficients discussed above), or utilized to dynamically switch any of the various controlled reactance or impedance modules (e.g., 1305, 1805) or the various second controlled capacitance modules. Similarly, sensor 1815 output may be provided to control logic 1810, which may also adjust the various reactances, either statically or dynamically, and with or without feedback from the resonator.

Figure 27:
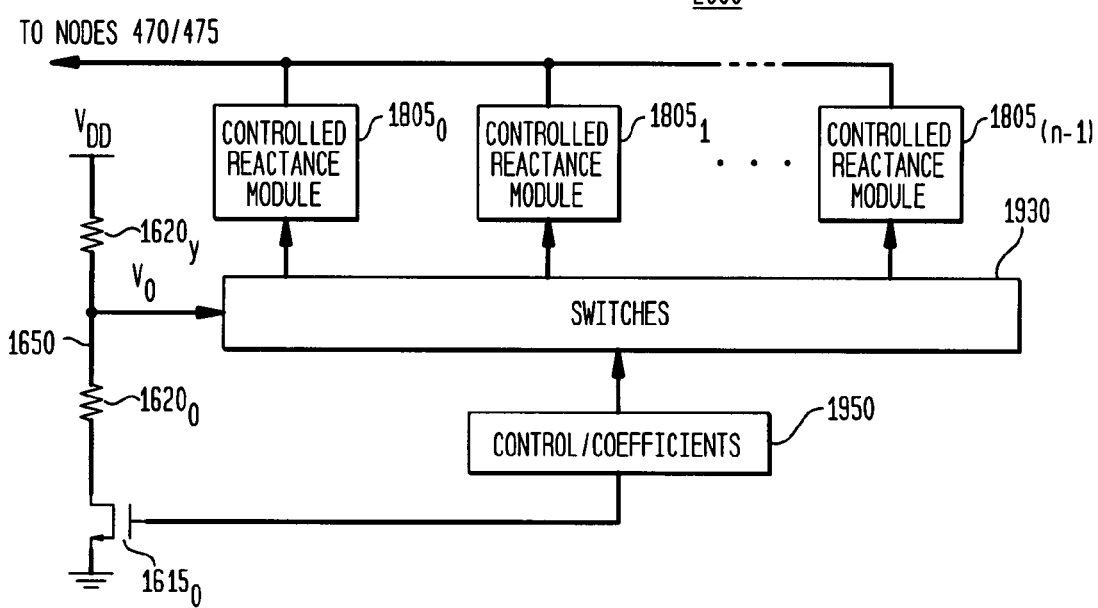
FIG. 27 (or "FIG. 27") is a circuit and block diagram illustrating an exemplary voltage variation compensation module in accordance with the teachings of the present invention.
Figure 29:
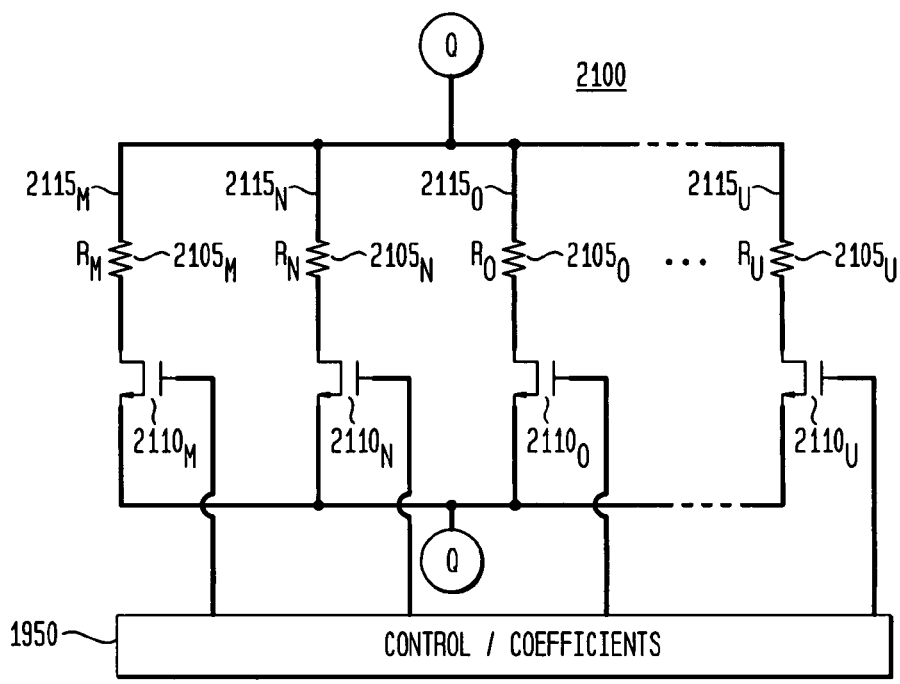
FIG. 29 (or "FIG. 29") is a circuit diagram illustrating an exemplary resistive control module in accordance with the teachings of the present invention.

FIG. 27 is a circuit and block diagram illustrating an exemplary voltage variation compensation module 2000 in accordance with the teachings of the present invention, and may be utilized as a voltage variation compensator 380, 1455 illustrated in FIGS. 3 and 21. Referring to FIG. 27, a switchable resistive module 1650 forms a voltage divider, using resistors $1620_O$ and $1620_y$, providing voltage $V_O$. In the event of fluctuations in the supply voltage (power rail) $V_{DD}$, voltage $V_O$ is correspondingly changed. As voltage $V_O$ can be switched (switches 1930) (as discussed above) to any of the controlled reactance modules 1805, under the control of control signals or coefficients 1950, the effective capacitance to the tank is also varied, thereby modulating the resonant frequency. As a result, the resonant frequency may be controlled over such voltage fluctuations. Other implementations will be apparent based upon the other illustrated embodiments, and are also within the scope of the invention As indicated above, the resonant frequency of the tank may also be modified by varying the resistance to the tank, in addition to the intrinsic or parasitic resistances $R_L$ 445 and $R_C$ 450 of FIG. 4. FIG. 29 is a circuit diagram illustrating an exemplary resistive control module 2100 which may be utilized as or as part of any of the various frequency control module and the various frequency controllers in accordance with the teachings of the present invention. Such a resistive control module 2100 may be inserted into node Q in resonator 405 of FIG. 4, in series with inductor 435 and $R_L$ 445, or in series with capacitor 440 and $R_C$ 450, or both. Each switchable resistive module 2115 (illustrated as the plurality of switchable resistive modules $2115_M$, $2115_N$, $2115_O$ through $2115_U$) has a differently weighted (such as a binary-weighted), resistor 2105 (illustrated as corresponding resistors $2105_M$, $2105_N$, $2105_O$ through $2105_U$), and is switchable in or out of the array or module 2100 through corresponding transistors or switches 2110 (illustrated as transistors $2110_M$, $2110_N$, $2110_O$ through $2110_U$), under the control of control signals and/or coefficients 1950. As indicated above, such switching also provides another mechanism to control or modulate the resonant frequency of the resonator 405, and may be a function of any selected parameter, or may be parameter independent, such as for resonant frequency selection.

Figure 30:
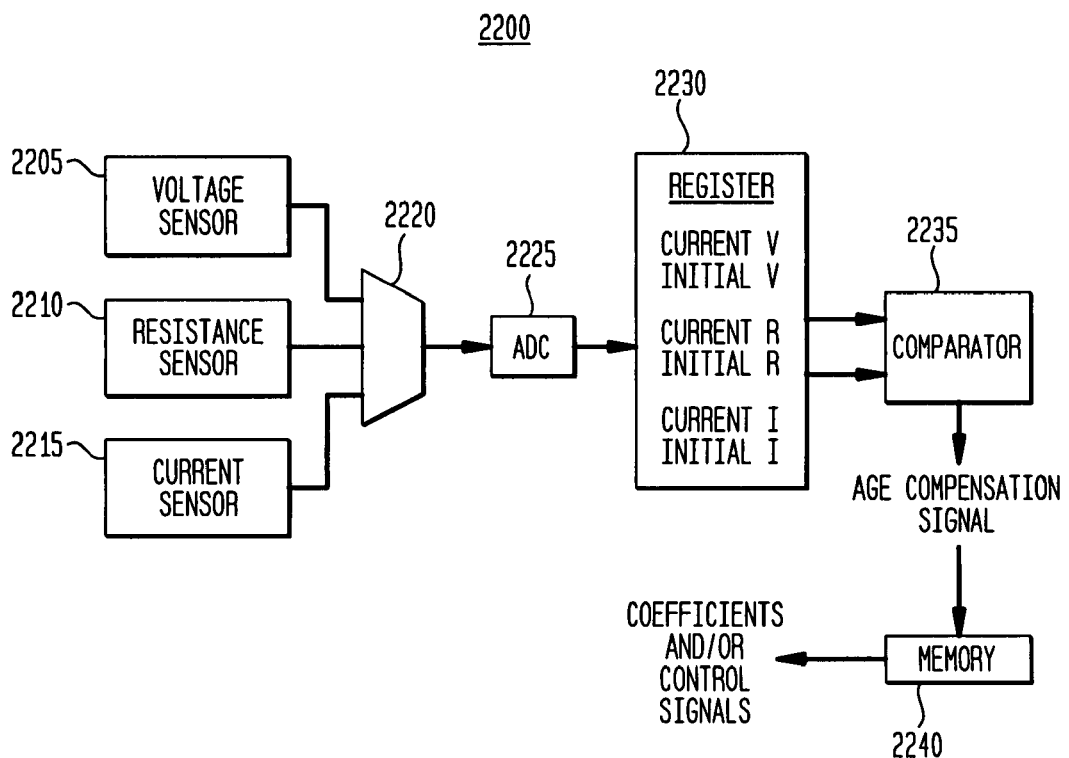
FIG. 30 (or "FIG. 30") is a block diagram illustrating an exemplary age variation compensator in accordance with the teachings of the present invention.

FIG. 30 is a block diagram illustrating an exemplary age variation compensator 2200 in accordance with the teachings of the present invention. As illustrated in FIG. 30, various sensors are utilized to measure a relevant parameter which is or may be affected by the passage of time, or which otherwise changes over the lifetime of an IC, such as a voltage sensor 2205 to measure a threshold voltage of a transistor, a resistance sensor 2210 to measure one or more resistance magnitudes or values of the tank, and/or a current sensor to measure absolute current levels produced by the various current sources. A selected measurement, at a given point in time is provided (via multiplexer 2220) to ADC 2225, for conversion into a digital value, which is stored in a register or other non-volatile memory 2230. When the IC is first powered on or otherwise initialized, an initial measurement is stored in the register 2230, to provide a basis for comparison for subsequent measurements. Subsequently, additional measurements may be performed, with the resulting values stored as corresponding current values in register 2230, illustrated as current and initial values for voltage, resistance and current. For a given parameter, such as voltage, current and initial values may be read and compared, comparator 2235, which then provides a corresponding age compensation signal proportional to any difference between the two values. Such difference values provided by the age compensation signal may then be utilized to provide corresponding coefficients and/or control signals for corresponding frequency adjustment. For example, such age compensation signals may be indexed to a lookup table in memory 2240, which then provides stored values based on known values, or other calibrations or modeling of age affects, and provides for corresponding frequency adjustments using any of the various modulators and compensators discussed above.

Referring again to FIG. 21, the frequency controller 215, 349, 1415 of the present invention may comprise one or more of the following components: (1) a transconductance modulator 1410 (e.g. 410, 415 and the embodiments illustrated in FIGS. 6-8), which in the exemplary embodiments, may also include or be coupled to sustaining amplifier 305; (2) a variable parameter modulator 1425, to modulate the resonant frequency $f_0$ in response to any selected parameter, such as temperature, fabrication process variation, voltage variation, or frequency, such as the various controlled capacitance modules 485, 635, 1505 or controlled reactance modules 1305, 1805; (3) a process (or other parameter) modulator or compensator 1430, such as process variation compensator 425, 760, 860, or controlled reactance modules 1305, 1805; (4) a voltage variation compensator 380, 1455; and/or (5) an age (time) variation compensator (or modulator) 365, 1460. It will be observed by those of skill in the art that the various divisions between transconductance modulator 1410, variable parameter modulator 1425, or process (or other parameter) modulator or compensator 1430 or the other compensators and modulators are arbitrary and do not limit the scope of the present invention, as each may be made responsive to any of the parameters discussed above, and each may be utilized for any of the purposes discussed above (e.g., the variable parameter modulator 1425 may be utilized to compensate for fabrication process variations, etc., rather than temperature variations, for example). In addition, depending upon the selected implementation, one or more coefficient registers 1435 (e.g., 455, 465, 495) may be utilized to store any of the pluralities of coefficients discussed above. In alternative embodiments, such coefficients may not be needed, with switching voltages or currents applied directly, either statically or dynamically, as control signals.

Also in the exemplary embodiments, these various components may include a sensor 1440, 1815 (e.g., yI(x) (or I(T)) generator 415, 515), or such as sensor may be provided as a separate component, such as a current source coupled to a diode as discussed above. Also, depending on the selected embodiment, and A/D converter 1445 and control logic 1450, 1810, to provide the selected frequency control.

Figure 13:
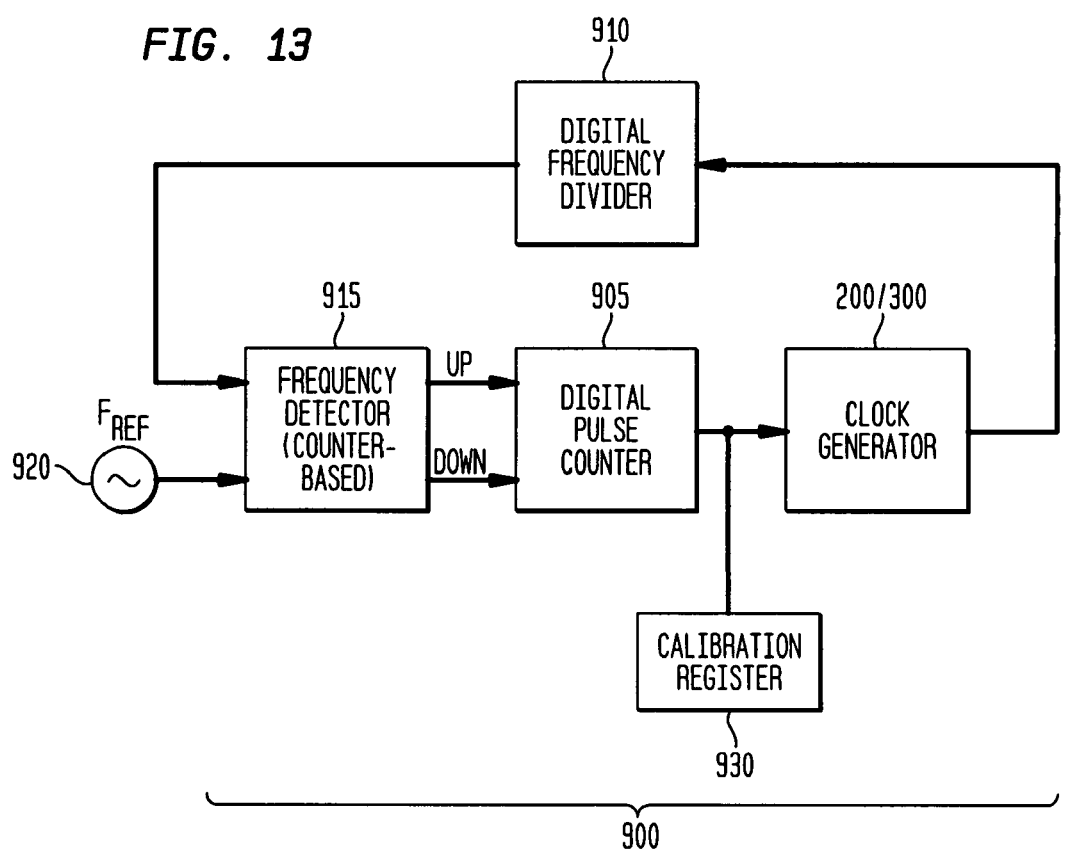
FIG. 13 (or "FIG. 13") is a block diagram illustrating an exemplary first frequency calibration module in accordance with the teachings of the present invention.

Referring again to FIGS. 3 and 4, the clock generator and/or timing/frequency reference (100, 200, or 300) may also include a frequency calibration module (325 or 430). FIG. 13 is a high-level block diagram illustrating an exemplary first frequency calibration module 900 (which may be utilized as module 325 or 430) in accordance with the teachings of the present invention. The first frequency calibration module 900 includes a digital frequency divider 910, a counter-based frequency detector 915, a digital pulse counter 905, and a calibration register 930 (which also may be utilized as register 465). Using a test IC, the output signal from the clock generator (100, 200 or 300) is frequency divided (910) and compared with a known reference frequency 920 in frequency detector 915. Depending upon whether the clock generator (100, 200 or 300) is fast or slow with respect to the reference, down or up pulses are provided to the pulse counter 905. Based upon those results, the third plurality of switching coefficients $r_0$ though $r_{(y-1)}$ is determined, and the clock generator (100, 200 or 300) is calibrated to a selected reference frequency. Again, individual ICs may also be calibrated and tested separately.

Figure 31:
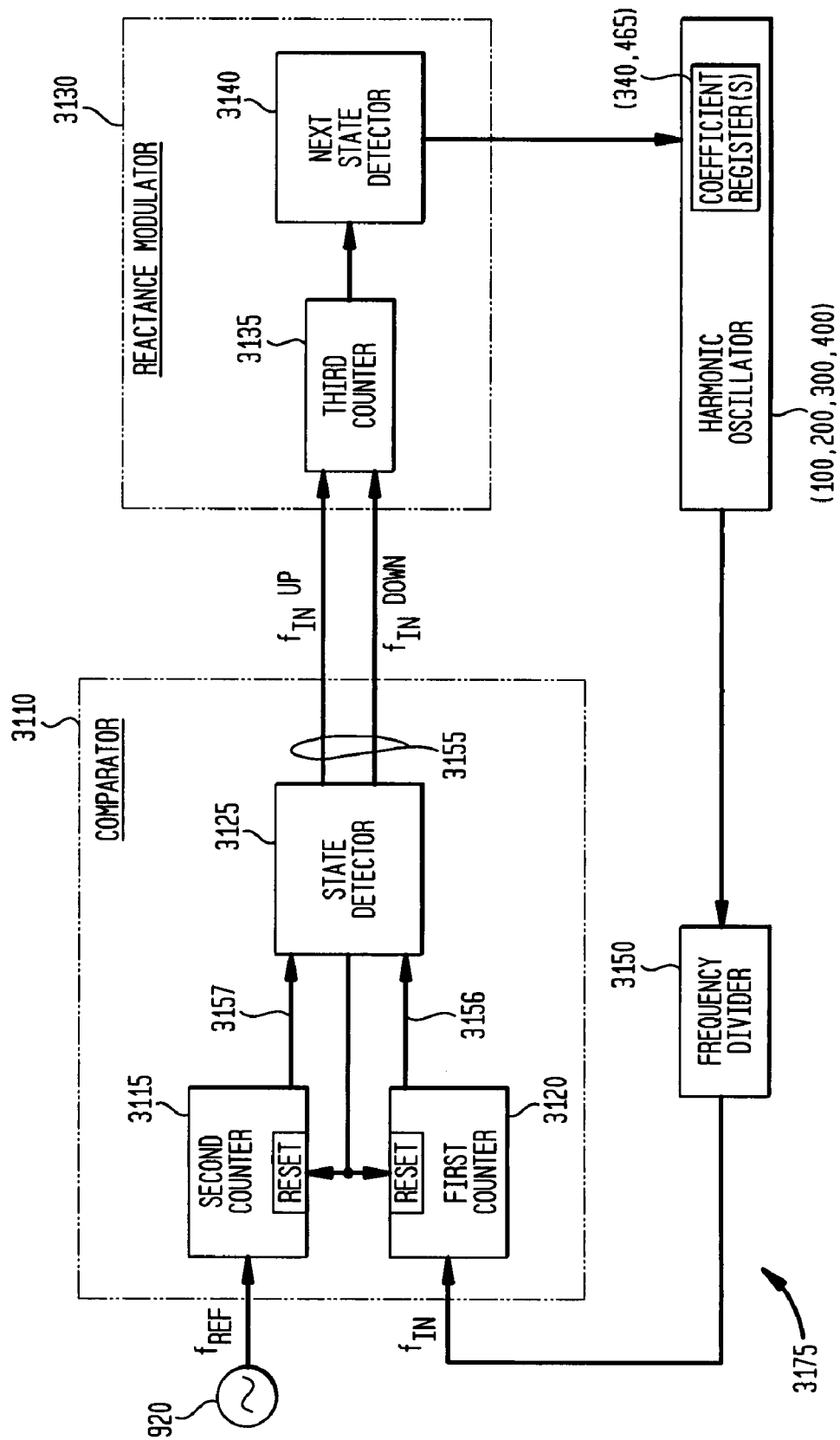
FIG. 31 (or "FIG. 31 ") is a block diagram illustrating in greater detail an exemplary first frequency calibration module and first frequency calibration system in accordance with the teachings of the present invention.

Such frequency calibration is illustrated in greater detail with reference to FIGS. 31-37. FIG. 31 is a block diagram illustrating in greater detail an exemplary first frequency calibration module 3175 and an exemplary first frequency calibration system 3100 in accordance with the teachings of the present invention, which may be utilized as any of the frequency calibration modules 325, 430 or 900. Referring to FIG. 31, the frequency calibration module 3175 comprises a comparator 3110, a reactance (or impedance) modulator 3130, and a frequency divider 3150, with the frequency calibration system 3100 comprising these components in conjunction with the harmonic oscillator (100, 200, 300, 400) of the present invention. For this embodiment, reference to a complete calibration module or complete calibration circuit (3175) will mean and include the circuitry comprising the comparator 3110 and the reactance (or impedance) modulator 3130, and depending on the selected embodiment, may also include the frequency divider 3150 (such as when the frequency from the external frequency reference 920 is lower than the oscillation frequency provided by the harmonic oscillator (100, 200, 300, 400)). In selected embodiments, the comparator 3110 comprises a first counter 3120, a second counter 3115, and a state detector 3125. Also in selected embodiments, the reactance modulator 3130 comprises a third counter 3135 and a next state detector 3140. While generally referred to as a reactance modulator 3130, it should be understood that this modulator is also adapted, depending on the selected embodiment, to modify the effective reactance of the oscillator (100, 200, 300, 400), and more generally, to modify the effective impedance of the oscillator (100, 200, 300, 400), whether reactance, resistance, or both, as discussed below.

As discussed above, among other components, the oscillator (100, 200, 300, 400) comprises a plurality of switchable reactance (or impedance) modules and one or more coefficient registers (340, 465), with the plurality of switchable reactance modules having differently or differentially weighted reactances, such as binary-weighted or linearly-weighted, for example. As previously discussed, the plurality of switchable reactance modules, in selected embodiments, may be a plurality of switchable impedance modules, comprising either or both a reactance or a resistance. The oscillator is adapted to provide an oscillation signal having an oscillation frequency, which may be any of the various resonant or oscillator output frequencies discussed with reference to FIG. 14. The frequency of the oscillation signal provided by the oscillator (100, 200, 300, 400) can be controlled through the corresponding coefficients discussed previously, which control the coupling or uncoupling (switching) of the various reactance modules to or from the oscillator (100, 200, 300, 400). As indicated above, in the event that the oscillation frequency (or the resonant frequency) is comparatively much higher than a reference frequency, which generally will be the case, the oscillation frequency is divided by frequency divider 3150. More generally, the frequency divider 3150 may implement any ratio for frequency division or multiplication. The frequency divider 3150 is coupled to the oscillator (100, 200, 300, 400) to receive the oscillation signal, and divides the oscillation frequency, providing an output signal having an output frequency which is a rational fraction or rational multiple of the oscillation frequency. The frequency divider 3150 may be implemented as known in the art; in the exemplary embodiment, the frequency divider 3150 is implemented as a digital frequency divider, using a plurality of flip-flops configured identically or similar to the plurality of flip-flops 1080 illustrated in FIG. 14.

Continuing to refer to FIG. 31, the comparator 3110 is coupled to the frequency divider, and is adapted to compare the output frequency to the reference frequency and to provide a comparison signal on lines or nodes 3155 when the output frequency is not substantially equal to the reference frequency. More specifically, in the exemplary embodiment, the first counter 3120 is coupled to the frequency divider 3150 to receive the output signal, and counts each cycle of the output frequency. For example, the first counter 3120 increments its count by one for every positive (or negative) pulse of the output signal. Similarly, the second counter 3115 is coupled to the reference oscillator 920 to receive the reference signal, and counts each cycle of the reference frequency, also incrementing its count by one for every positive (or negative) pulse of the reference signal. Both the first counter 3120 and the second counter 3115 are configured to have a predetermined terminal count, providing an output signal when the predetermined terminal count is reached, such that the first counter 3120 is adapted to provide a first count signal on line or node 3156 when a predetermined terminal count is reached, and the second counter 3115 is adapted to provide a second count signal on line or node 3157 when the predetermined terminal count is reached. In this way, the first counter 3120 and the second counter 3115 effectively race against the other, with a corresponding first count signal or second count signal provided first by the counter having the higher frequency input, resulting in a comparison of the output frequency to the reference frequency. More specifically, when the output frequency is higher than the reference frequency, the first count signal will be provided earlier than the second count signal and, conversely, when the reference frequency is higher than the output frequency, the second count signal will be provided earlier than the first count signal.

The state detector 3125 is coupled to the first counter 3120 and to the second counter 3115, and is adapted to provide the comparison signal when the output frequency is not substantially equal to the reference frequency. In the exemplary embodiments, the comparison signal comprises a reactance increase signal (to decrease the oscillation frequency) and a reactance decrease signal (to increase the oscillation frequency). The state detector 3125 provides a reactance increase signal ($f_{IN}$ down) when the first count signal is received first, indicating that the oscillation frequency (as represented by the output frequency) should be decreased by increasing the reactance of the oscillator (100, 200, 300, 400). Similarly, the state detector 3125 provides a reactance decrease signal ($f_{IN}$ up) when the second count signal is received first, indicating that the oscillation frequency (as represented by the output frequency) should be increased by decreasing the reactance of the oscillator (100, 200, 300, 400). In the event that both the first counter 3120 and the second counter 3115 provide count signals during the same clock cycle, the state detector 3125 is configured to provide either no reactance signal or a reactance stable signal (as a third signal), as during that interval, the reference frequency and the output frequency appear to have the same frequency and their corresponding counts cannot be discriminated. In addition to the other methods discussed below, one or more reactance stable signals may also be utilized to determine that the calibration process is complete. The state detector 3125 also resets the first counter and the second counter when either or both the first count signal or the second count signal is received, for counting to begin again for the next iteration. In the exemplary embodiments, this process continues iteratively, over repeated intervals, with a first or second count signal generated in each interval, until the desired level of accuracy is achieved. As discussed in greater detail below, in this embodiment, the iterative process may result in convergence to a single set of reactance coefficients for selection of a single output frequency, or when coefficients (or counts) are incremented or decremented sequentially, may result in the state detector 3125 alternating between two sets of reactance coefficients (alternately providing a reactance increase signal ($f_{IN}$ down) and a reactance decrease signal ($f_{IN}$ up)) which correspondingly provide two different output frequencies, with other variations applicable for binary search calibrations, as discussed below.

As a consequence, the comparator 3110 provides a comparison signal which indicates that the output frequency is less than the reference frequency (reactance decrease signal) and a comparison signal which indicates that the output frequency is greater than the reference frequency (reactance increase signal). The reactance modulator 3130 is coupled to the comparator 3110 and to the oscillator (100, 200, 300, 400), and is adapted to determine and provide to the coefficient register (340, 465) a plurality of coefficients to control the switching of the various controlled reactance modules, as discussed above. More specifically, the reactance modulator 3130 determines and provides a first plurality of coefficients to control switching of a first subset of the plurality of switchable reactance modules to increase the reactance of the oscillator when the comparison signal indicates the output frequency is greater than the reference frequency, and determines and provides to the coefficient register a second plurality of coefficients to control switching of a second subset of the plurality of switchable reactance modules to decrease the reactance of the oscillator when the comparison signal indicates the output frequency is less than the reference frequency. As indicated above, in addition to or in lieu of modifying the effective reactance of the oscillator (resonator), in exemplary embodiments, the reactance impedance modulator 3130 may also be adapted to modify the effective impedance (reactance, resistance, or both) of the oscillator.

In the exemplary embodiments, the reactance modulator 3130 is implemented utilizing a third counter 3135 and a next state detector 3140. As the comparator 3110 iterates over a plurality of intervals, with a first or second count signal and a corresponding comparison signal (reactance increase signal or reactance decrease signal) generated in each interval, the third counter 3135 accumulates a total count over all of the iterations. More specifically, the third counter 3135 is coupled to the state detector 3125, and is an up and down counter; namely, the third counter 3135 is adapted to increase a previous count to form a current count in response to the reactance increase signal and to decrease the previous count to form the current count in response to the reactance decrease signal. This count from the third counter 3135 is utilized to determine the corresponding plurality of coefficients which will control the switching of the various reactance modules to the oscillator (100, 200, 300, 400). As a result, the current count, utilized to provide the plurality of coefficients, will increase or decrease, as needed, to correspondingly increase or decrease the reactance of the oscillator (100, 200, 300, 400) and correspondingly decrease or increase the oscillation frequency.

The counting system utilized by the third counter 3135 may be implemented in a plurality of ways, all of which are considered equivalent and within the scope of the present invention. In an exemplary embodiment, the third counter 3135 is adapted to increase or decrease the previous count in sequential increments, such as counting by one unit linearly (e.g., 8, 7, 6, 5; 8, 9, 10, 11; or 1, 2, 3, 4, and so on). In another exemplary embodiment, the third counter 3135 is adapted to increase or decrease the previous count in binary search increments, with each next increment being approximately one-half of the previous increment, rounded to an integer value (e.g., 8, 12, 10, 11; 8, 4, 6, 5; 8, 12, 14, 15; etc.), as known in the art. For example, when the previous count is eight and a reactance increase signal is received, the next count is 12, followed by a reactance decrease signal so the next count is 10, followed by a reactance increase signal so the next count is 11, and so on. As discussed in greater detail below, a pointer is typically utilized to keep track of the current state of a binary search, so that the next state is determined appropriately.

For example, for a sequential calibration method, the method may begin with all coefficients equal to zero, followed by repeated reactance increase signals (to decrease the frequency of the oscillation signal), resulting in corresponding sequential increments in the corresponding coefficients until the oscillation frequency is increased to at or above the reference frequency. In this sequential method, at this point, the oscillation frequency will then be decreased to just below the reference frequency, resulting in a reactance decrease signal. Depending on the selected embodiment, and depending upon the resolution provided by the count number and corresponding number of coefficients, this may be sufficient to achieve the desired accuracy of the oscillator (100, 200, 300, 400), and the method may end. In other embodiments, the sequential method may result in toggling back and forth between two sets of coefficients, with corresponding oscillation frequencies slightly higher and slightly lower than the reference frequency, either of which may be selected arbitrarily as sufficient to achieve the desired accuracy of the oscillator (100, 200, 300, 400), and the method may end. In other embodiments, as discussed below, a determination may be made as to which set of coefficients is the most accurate.

Similarly, when a binary search or counting method is utilized, it is possible that best set of coefficients for calibration may have occurred earlier in the search, e.g., 8 in a binary search of 16 values. Methods to determine the best or optimal available coefficients for these embodiments are also discussed in greater detail below.

In the exemplary embodiments, however, there is a finite amount of reactance available to be coupled to or decoupled from the oscillator (100, 200, 300, 400), with corresponding maximum and minimum values for the plurality of coefficients, e.g., the third plurality of coefficients discussed above. For example, when implemented as four bits, the maximum and minimum values will be, respectively, fifteen and zero. As these maximum and minimum counts may be reached, referred to herein as threshold counts, it is important that any further reactance increase signals or reactance decrease signals not be allowed to further increment or decrement the current count, to avoid a possibility of circular counting, such as fifteen incrementing to zero, or zero decrementing to fifteen. In the exemplary embodiments, the next state detector 3140 is coupled to the third counter 3135, with the next state detector 3140 being adapted to provide an output count equal to the previous count when the current count and the previous count are each a corresponding threshold count, and to provide the output count equal to the current count when the previous count is not the corresponding threshold count or when the current count is not the corresponding threshold count. For example, when the previous count is 15 and is incremented to zero as a current count, the output count provided will be the previous count of 15, as both are threshold counts. Similarly, when the previous count is 14 and is incremented to 15 as the current count, the output count will be the current count of 15, as the previous count is not a threshold count (even though the current count is now a threshold count). The next state detector 3140 is therefore adapted to prevent the output count from being a circular count.

As indicated, the current count is then provided as the plurality of coefficients to the oscillator (100, 200, 300, 400), with corresponding modulation of the various reactances and corresponding adjustment of the oscillation frequency. As a consequence, as the process iterates over a sufficient number of intervals, the oscillation frequency will converge toward the reference frequency, within any selected level of accuracy. This may result in convergence to a single set of reactance coefficients for selection of a single output frequency, may result in two (or more) sets of reactance coefficients which correspondingly provide different output frequencies which (initially) appear equally close to the reference frequency (within the current count or coefficient resolution), or may result in alternating between two sets of reactance coefficients which correspondingly provide two different output frequencies. In the latter two cases, the present invention includes decision methodologies to choose the set of coefficients providing the more accurate frequency calibration.

Those of skill in the art will also recognize that the number of counting bits may, but need not, correspond to the number of calibration bits. For example, the number of counting bits only needs to provide a desired level of comparative frequency resolution, to determine whether the oscillation frequency is higher or lower than the reference frequency, and may comprise a fewer (or greater) number of bits than the number of calibration bits. This feature is utilized with the first predetermined level of discrimination and the second, higher predetermined level of discrimination provided by the various first and second counters, as discussed below. In contrast, the number of calibration bits is typically selected to provide a desired level of actual or non-comparative frequency resolution, namely, to determine whether the oscillation frequency is within a specified range, such as within a predetermined number of parts per million of a specified frequency, such as the reference frequency or more typically a multiple of the reference frequency, as the oscillation frequency may be divided prior to comparison with the reference frequency.

Figure 32:
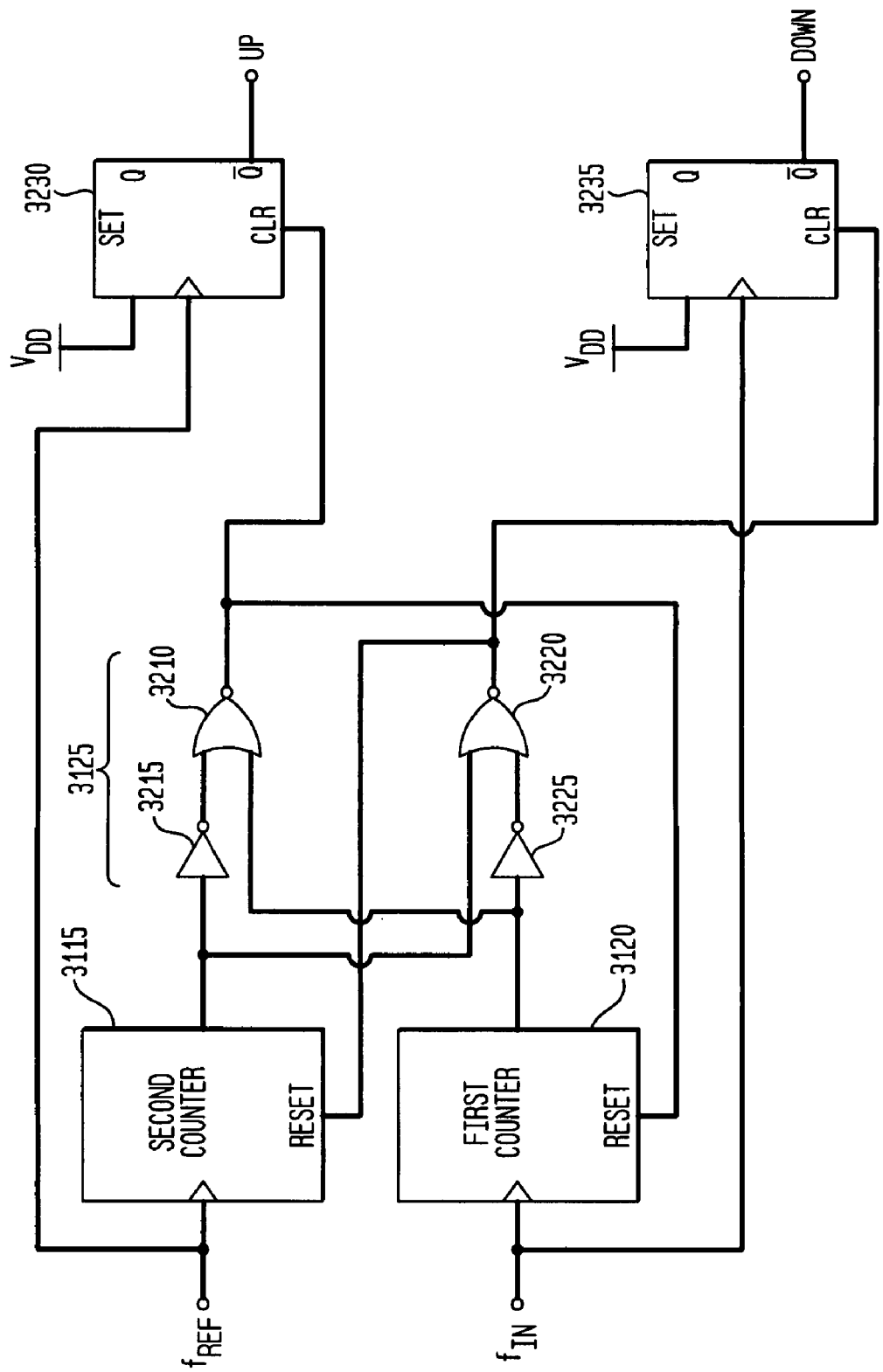
FIG. 32 (or "FIG. 32") is a block diagram illustrating an exemplary comparator of an exemplary first frequency calibration module in accordance with the teachings of the present invention.

FIG. 32 is a block diagram illustrating an exemplary comparator 3110 of an exemplary frequency calibration module 3175 in accordance with the teachings of the present invention. As illustrated in FIG. 32, the comparator 3110 is implemented utilizing the first and second counters 3120 and 3115 discussed above, and the state detector 3125. In an exemplary embodiment, the state detector 3125 comprises: a first inverter 3225 coupled to the first counter 3120 to receive the first count signal and generate an inverse first count signal; a first NOR gate 3220 coupled to the first inverter 3225 to receive the inverse first count signal and coupled to the second counter 3115 to receive the second count signal, with the first NOR gate 3220 being adapted to provide the reactance increase signal when the first count signal indicates the output frequency is greater than the reference frequency and the second count signal indicates the reference frequency is not greater than the output frequency. The state detector 3125 further comprises a second inverter 3215 coupled to the second counter 3115 to receive the second count signal and generate an inverse second count signal; a second NOR gate 3210 coupled to the second inverter 3215 to receive the inverse second count signal and coupled to the first counter 3120 to receive the first count signal, with the second NOR gate 3210 adapted to provide the reactance decrease signal when the second count signal indicates the reference frequency is greater than the output frequency and the first count signal indicates the output frequency is not greater than the reference frequency; and a buffer (implemented as flip-flops 3230 and 3235) coupled to the first NOR gate 3220 and to the second NOR gate 3210 to store values corresponding to the reactance increase signal and the reactance decrease signal. Also as illustrated, the outputs of the first and second NOR gates 3220 and 3210 provide the reset signals to the first and second counters 3120 and 3115. Not separately illustrated, the outputs from the flip-flops 3230 and 3235 are typically provided to additional synchronization circuitry, such as additional flip-flops, to avoid metastable or indeterminate states. Additional synchronization circuitry may also be utilized in other parts of the comparator 3110, as well. The (Q-bar) outputs from the flip-flops 3230 and 3235 then provide the reactance decrease signal ($f_{IN}$ up) and reactance increase signal ($f_{IN}$ down), respectively, to the reactance modulator 3130.

Figure 33:
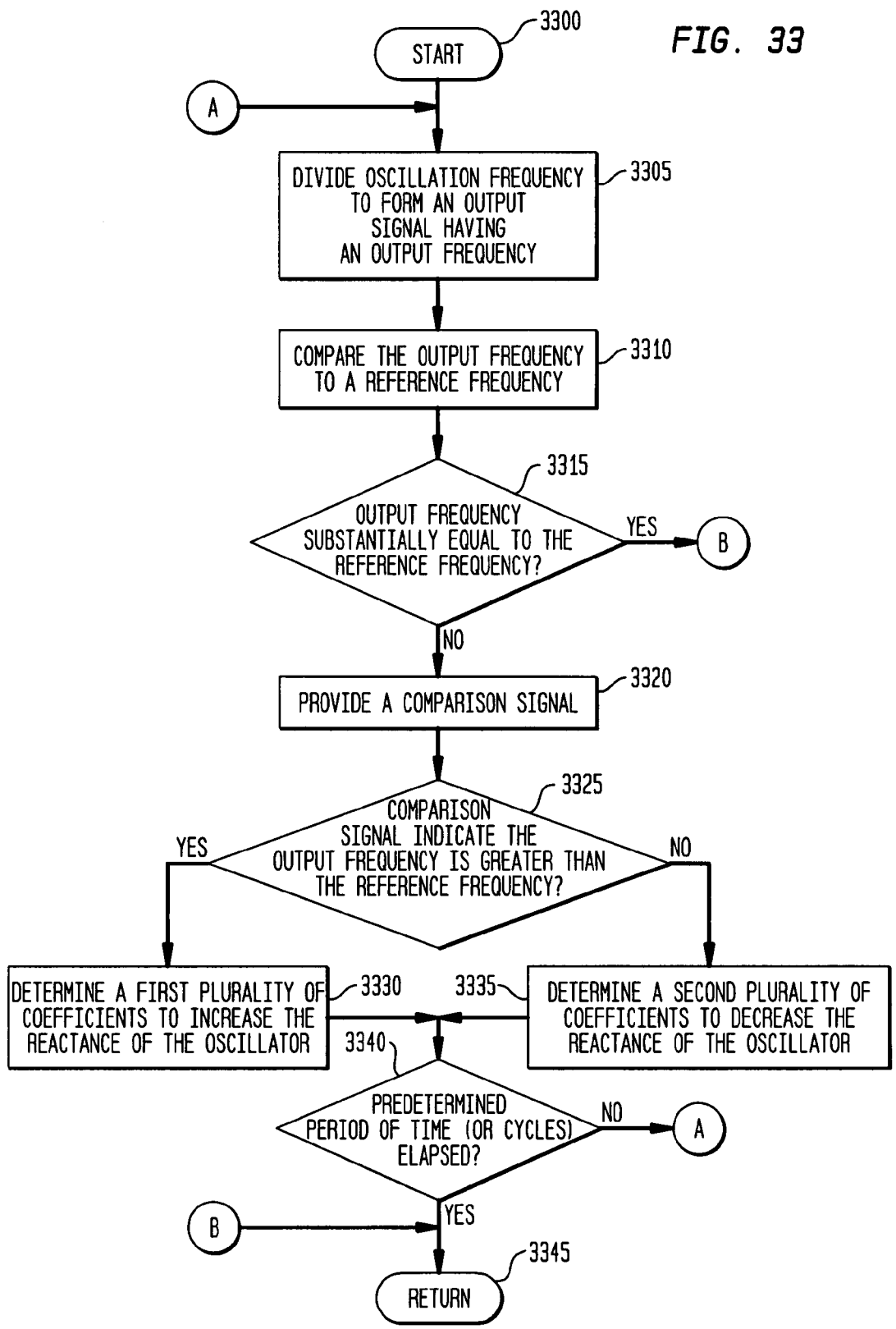
FIG. 33 (or "FIG. 33") is a flow diagram illustrating an exemplary first frequency calibration method in accordance with the teachings of the present invention.

FIG. 33 is a flow diagram illustrating an exemplary first frequency calibration method in accordance with the teachings of the present invention, and provides a useful summary. Beginning with start step 3300, the first method divides an oscillation frequency of an oscillation signal provided by the oscillator by a rational fraction or rational multiple to form an output signal having an output frequency, step 3305. The first method compares the output frequency to a reference frequency of a reference signal provided by a reference oscillator, step 3310.

As indicated above, the comparing step generally involves counting cycles of the output signal and providing a first count signal when a predetermined terminal count is reached; counting cycles of the reference signal and providing a second count signal when the predetermined terminal count is reached; and modulating the reactance of the oscillator by providing a reactance increase signal when the first count signal is received first, providing a reactance decrease signal when the second count signal is received first, and providing no output signal when both the first count signal and the second count signal are received (during approximately the same time interval).

Also as indicated above, the modulating step may further comprise increasing a previous count to form a current count in response to the reactance increase signal and decreasing the previous count to form the current count in response to the reactance decrease signal. The previous count may be increased or decreased in sequential increments or in binary search increments, for example. The first method then continues by determining whether the current count and the previous count are each a corresponding threshold count; providing an output count equal to the previous count when the current count and the previous count are each a corresponding threshold count; providing the output count equal to the current count when the previous count is not the corresponding threshold count or when the current count is not the corresponding threshold count; and providing the output count as a plurality of coefficients for control of the switching of the plurality of switchable reactance modules.

The first method then provides a comparison signal (step 3320) when the output frequency is not substantially equal to the reference frequency (step 3315). When the output frequency is substantially equal to the reference frequency in step 3315, the first method may end, return step 3345, as the current coefficients of the oscillator are accurate to the desired resolution. As indicated above, one or more reactance stable signals may also be utilized to determine that the calibration process is complete. The first method then determines whether the comparison signal indicates that the output frequency is greater than the reference frequency, step 3325. When the comparison signal indicates the output frequency is greater than the reference frequency in step 3325, the first method then determines a first plurality of coefficients to control switching of a first subset of the plurality of switchable reactance modules to increase a reactance of the oscillator, step 3330. When the comparison signal indicates the output frequency is not greater than the reference frequency in step 3325, the first method then determines a second plurality of coefficients to control switching of a second subset of the plurality of switchable reactance modules to decrease the reactance of the oscillator, step 3335. The first method then determines whether a predetermined period of time (or number of cycles) has elapsed, step 3340, and if so, the first method may end, return step 3345. When a predetermined period of time (or number of cycles) has not elapsed in step 3340, the first method continues to iterate, returning to step 3305.

Figure 34:
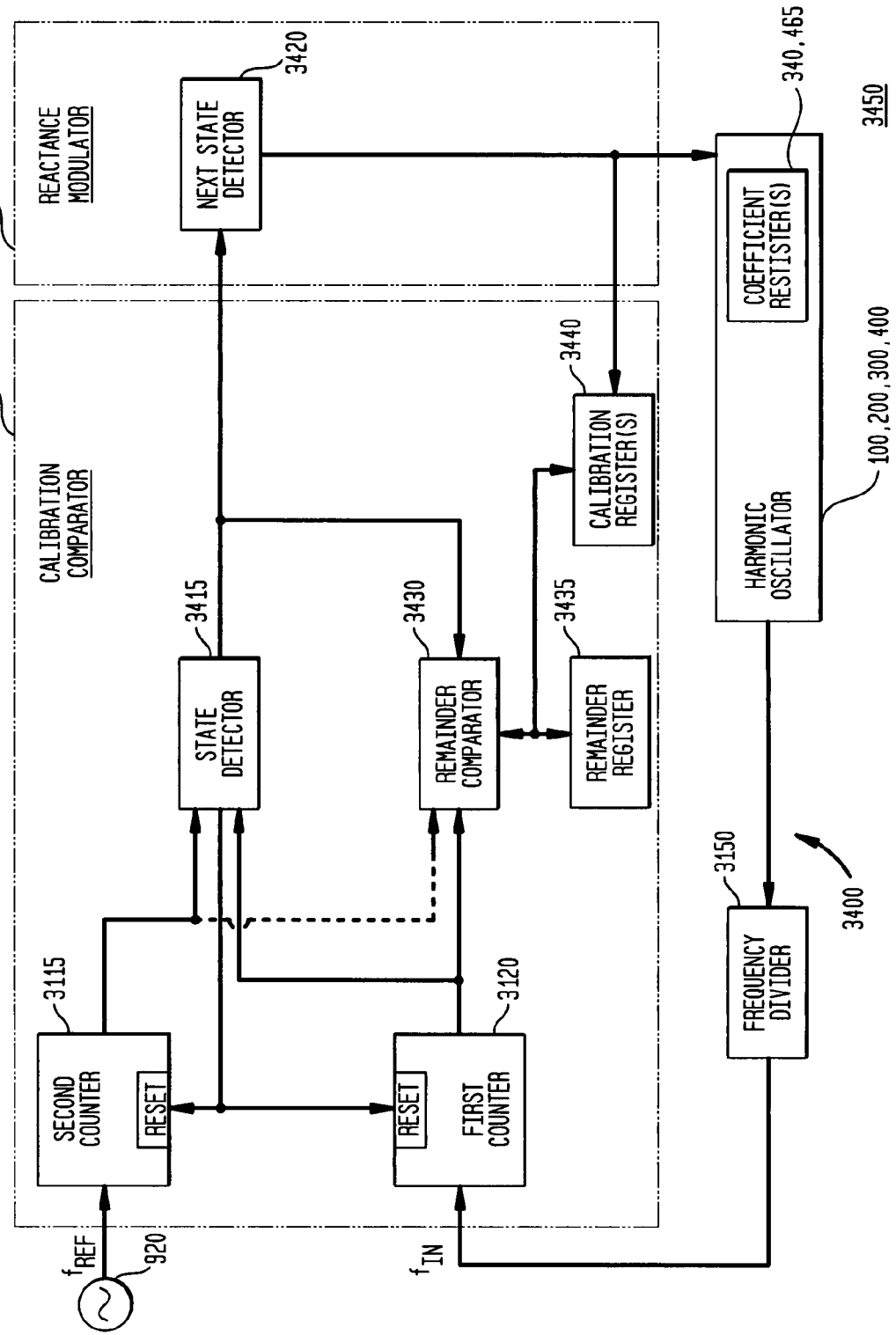
FIG. 34 (or "FIG. 34") is a block diagram illustrating in greater detail an exemplary second frequency calibration module and second frequency calibration system in accordance with the teachings of the present invention.

FIG. 34 is a block diagram illustrating in greater detail an exemplary second frequency calibration module 3400 and second frequency calibration system 3450 in accordance with the teachings of the present invention. Similarly to the exemplary first frequency calibration module and first frequency calibration system, the second frequency calibration module 3400 and second frequency calibration system 3450 also comprise a comparator, referred to as calibration comparator 3405, a reactance modulator 3410, and may also include a frequency divider 3150. The calibration comparator 3405 comprises a first (oscillation frequency) counter 3120, a second (reference frequency) counter 3115, and a state detector 3415. In addition, in a first variation discussed below with reference to FIG. 36, the calibration comparator 3405 also comprises a remainder comparator 3430, a remainder register 3435, and a calibration register 3440. In a second variation discussed below with reference to FIG. 37, these components (remainder comparator 3430, remainder register 3435, calibration register 3440) are not utilized. As previously discussed with reference to FIG. 31, the second frequency calibration system 3450 further comprises a harmonic oscillator (100, 200, 300, 400) having one or more coefficient registers (340, 465). A frequency reference 920, also as previously discussed, is utilized to provide a reference signal having a reference frequency for calibration of the oscillation frequency of the harmonic oscillator (100, 200, 300, 400). For this embodiment, reference to a complete calibration module or complete calibration circuit (3400) will mean and include the circuitry comprising the calibration comparator 3405, and the reactance (or impedance) modulator 3410, and depending on the selected embodiment, may also include the frequency divider 3150 (such as when the frequency from the external frequency reference 920 is lower than the oscillation frequency provided by the harmonic oscillator (100, 200, 300, 400)).

The reactance modulator 3410 may be implemented as a next state detector 3420, such as a finite state machine or any type of processor (described below). The state detector 3415 is also typically implemented as a finite state machine or any type of processor. Both components may also be implemented using other forms of combinational logic and memory, such as state memory, in addition to the use of the registers illustrated. In addition, any distinction between the state detector 3415 and the reactance modulator 3410 (next state detector 3420) as separate components is arbitrary, and they may be implemented together as one larger finite state machine, for example, which performs the functions discussed below. The other components, such as the counters 3115, 3120, the frequency divider 3150, the remainder comparator 3430, and the various registers 3435, 3440 may be implemented as previously discussed or as otherwise known or becomes known in the art. In addition, while the remainder comparator 3430 is illustrated as coupled to the first counter 3120, alternatively, it may be coupled to the second counter 3115 instead (illustrated by the dashed line in FIG. 34), as only one remainder needs to be evaluated in the corresponding (binary search) calibration method described below.

As discussed above, among other components, the harmonic oscillator (100, 200, 300, 400) comprises a plurality of switchable reactance modules and one or more coefficient registers (340, 465), with the plurality of switchable reactance modules having differently or differentially weighted reactances, such as binary-weighted or linearly-weighted, for example. As previously discussed, the plurality of switchable reactance modules, in selected embodiments, may be a plurality of switchable impedance modules, comprising either or both a reactance or a resistance. The oscillator is adapted to provide an oscillation signal having an oscillation frequency, which may be any of the various resonant or oscillator output frequencies discussed with reference to FIG. 14. Also as indicated above, in the event that the oscillation frequency (or the resonant frequency) is comparatively much higher than a reference frequency, which generally will be the case, the oscillation frequency is divided by frequency divider 3150. The frequency divider 3150 is coupled to the oscillator (100, 200, 300, 400) to receive the oscillation signal, and divides the oscillation frequency, providing an output signal having an output frequency which is a rational fraction or rational division/multiple of the oscillation frequency. The frequency divider 3150 may be implemented as known or becomes known in the art; in the exemplary embodiment, the frequency divider 3150 is implemented as an asynchronous or synchronous digital frequency divider, such as using a plurality of flip-flops configured identically or similarly to the plurality of flip-flops 1080 illustrated in FIG. 14, or implemented using fixed, programmable or otherwise configurable counters, for example.

The output signal having the output frequency ($f_{IN}$) is provided to the first counter 3120, while the reference signal having the reference frequency ($f_{REF}$) (from reference oscillator 920) is provided to the second counter 3115, both of which count the transitions (cycles) of the respective signals. In exemplary embodiments, the state detector 3415 implements a first predetermined level of discrimination and may also implement a higher, second predetermined level of discrimination for the frequency calibration process, when necessary or desirable. These first and second predetermined levels of discrimination are illustrated with reference to an exemplary counter register 3460 in FIG. 35. Corresponding to each predetermined level of discrimination is a "terminal count" for the first counter 3120 and/or the second counter 3115, with a first terminal count corresponding to the first predetermined level of discrimination and a second, higher terminal count corresponding to the second predetermined level of discrimination. In accordance with the invention, as the first counter 3120 and the second counter 3115 are allowed to count the respective cycles of the output frequency ($f_{IN}$) (the divided oscillation frequency) and the reference frequency ($f_{REF}$), at least one of the counters 3120, 3115 will reach the terminal count. For purposes of the present invention, when the second counter 3115 (for the reference frequency) reaches the terminal count, it can provide a signal to the state detector 3415 or the state detector 3415 can monitor and determine when the terminal count has been reached; in other embodiments, such a terminal count signal or indicator may also be provided to the first counter 3120 and/or to the remainder comparator 3430. When the terminal count in the second counter 3115 is reached, the first counter 3120 is stopped, and its count (corresponding to the output frequency ($f_{IN}$)) is determined. The signaling to stop the first counter 3120 may be provided directly by the second, reference counter 3115, or indirectly by the state detector 3415, for example, when the second counter 3115 has reached its terminal count. Examining the output frequency ($f_{IN}$) count in the first counter 3120, the state detector 3415 determines whether the output frequency ($f_{IN}$) count was higher (faster) or lower (slower) than the reference frequency ($f_{REF}$) count (i.e., the terminal count). The state detector 3415, in turn, provides a first comparison signal to the reactance modulator 3410 when the output frequency is higher than the reference frequency to increase a reactance of the oscillator, and provides a second comparison signal to the reactance modulator 3410 when the reference frequency is higher than the output frequency to decrease the reactance of the oscillator in response to the second comparison signal. It should be noted that either the first counter 3120 or the second counter 3115 may be selected equivalently and essentially arbitrarily for the determination of reaching the terminal count, with the other counter then being stopped and its count determined to be either higher or lower than the predetermined and known terminal count.

Figure 35:
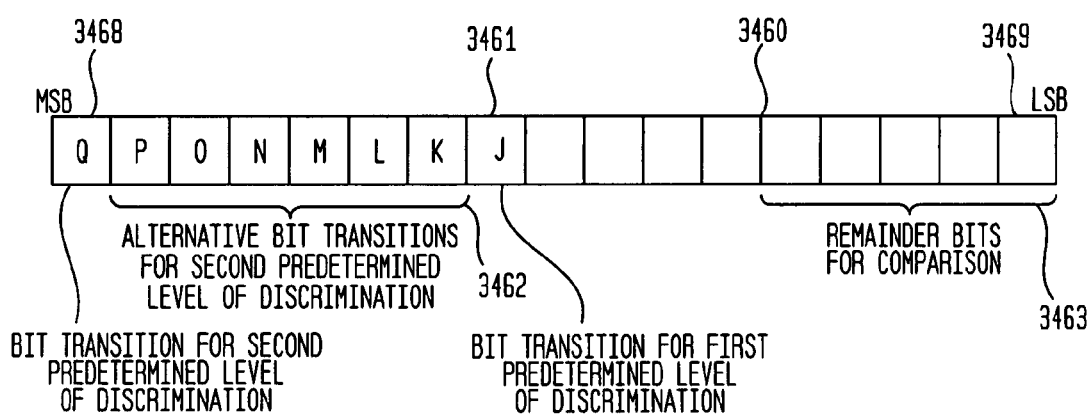
FIG. 35 (or "FIG. 35") is a block diagram illustrating an exemplary counter register in a second frequency calibration module and second frequency calibration system in accordance with the teachings of the present invention.

FIG. 35 is a block diagram illustrating an exemplary counter register 3460 in a second frequency calibration module 3400 and second frequency calibration system 3450 in accordance with the teachings of the present invention. As illustrated in FIG. 35, the first counter 3120 and the second counter 3115 each contain a counter register 3460 or other type of memory having a plurality of "Q" bits, where the $Q^{th}$ bit is the most significant bit ("MSB"). During each iteration of the frequency calibration process, as the respective first counter 3120 and second counter 3115 count the transitions of the output signal and reference signal, respectively, the bits in the counter register 3460 will transition from low to high (logic zero to logic one) and high to low (logic one to logic zero). With both counter registers 3460 initialized or reset to zero, in a first (or coarse) predetermined level of discrimination, a bit transition of a first selected bit (illustrated as the "J$^{th}$" bit position 3461) in the respective counter registers 3460, as a first predetermined terminal count, is used as an indicator of when the selected counter has reached the first predetermined terminal count (e.g., second counter 3115), where the first selected bit is at a bit position less than the MSB, and is sufficiently greater than the least significant bit ("LSB") (3469) to provide a meaningful level of resolution. For example, with the respective counter registers 3460 both reset to zero, the signal (either the output signal or the reference signal) having a higher frequency will be the first to reach the first predetermined terminal count, causing the j$^{th}$ bit to transition from a logic zero to a logic one in the counter register 3460. Monitoring the second counter 3115 to determine this transition, the bits of the register 3460 of the first counter 3120 are then examined to determine whether the output frequency is higher or lower than the reference frequency. Accordingly, to shorten the time of each iteration (recursion or round) of comparison at a selected calibration or resolution level, the first predetermined level of discrimination is utilized, with the transition of the j$^{th}$ bit in a counter register 3460 for the first terminal count of the second counter 3115 being utilized to indicate when to stop the counting by the first counter 3120 and then determine whether the output frequency is higher or lower than the reference frequency, using the (stopped) count of the register 3460 of the first counter 3120.

In selected embodiments, for subsequent iterations to provide higher resolution, the second (or fine) predetermined level of discrimination may be utilized, as necessary or desirable, such as to determine which of two sets of coefficients is the preferable or more accurate set, such as when frequency differences between the two (or more) sets cannot be resolved using the first predetermined terminal count. The second predetermined level of discrimination is implemented using a bit transition of a second selected bit (illustrated as the "Q$^{th}$" bit (MSB) position 3468 or any of the other bits between the Q$^{th}$ and j$^{th}$ bits ("K" through "P") (3462). Monitoring the second counter 3115 to determine this transition of a more significant bit, the bits of the register 3460 of the first counter 3120 are also then examined to determine whether the output frequency is higher or lower than the reference frequency. As illustrated, the Q$^{th}$ bit position is the MSB; in other embodiments, the bit position for the second predetermined level of discrimination may be less than the MSB, as illustrated for the K$^{th}$ through p$^{th}$ bit positions (3462). The bit positions first and second predetermined level of discriminations are selected to provide any specified level of resolution, with higher bit positions providing increased levels of discrimination.

In each iteration of the calibration process, the state detector 3415 is utilized to detect the bit transitions in the second, reference counter 3115 for the first predetermined level of discrimination and, when implemented, the second predetermined level of discrimination, and then examine the count in the first counter 3120 and thereby determine whether the output signal or the reference signal has the higher frequency for the current (or selected) calibration of the harmonic oscillator (100, 200, 300, 400) (as determined by the selected coefficients of the plurality of coefficients stored in the coefficient register(s) 340, 465 which select the various plurality of switchable reactance modules and/or plurality of switchable impedance modules to vary the oscillation frequency). A first or second comparison signal, indicating which of the output signal or the reference signal has the higher frequency (i.e., "won" the counting race) is provided to the next state detector 3420. More specifically, the state detector 3415 is further adapted to provide a first comparison signal when the output signal has the higher frequency, and to provide a second comparison signal when the reference signal has the higher frequency.

Also in each iteration of the frequency calibration process, a difference or "remainder" between the corresponding terminal count and the current count of the first counter 3120 is determined by the remainder comparator 3430, for use in ascertaining whether the output frequency was higher or lower than the reference frequency. For example, at the first predetermined level of discrimination, each counting race ends when the second counter 3115 reaches $2^J$ cycles, as the first predetermined terminal count, and at the second predetermined level of discrimination, each counting race ends when the second counter 3115 reaches $2^Q$ cycles, as the second predetermined terminal count. The count of the first counter 3120 is then examined to determine whether it is higher or lower than $2^J$ cycles or $2^Q$ cycles, respectively, with the difference generally stored as the remainder referred to herein.

In an exemplary embodiment, only a comparatively close remainder is compared and stored, based on examining higher order bit positions. For example, if a higher order bit position indicates that the count in the first counter 3120 is significantly different, a remainder may not be stored. Conversely, when the higher order bit positions indicate that the counts are comparatively close, a remainder will be determined, and compared with any previously stored remainder, with the currently lowest remainder stored (in remainder register 3435), along with the corresponding coefficients which were utilized to produce the corresponding output frequency providing the lowest remainder (in coefficient register(s) 3440). Generally, because remainders are determined and stored in the closer cases, only a selected number of lower order bits (3463) may be evaluated and stored, as illustrated in FIG. 35. The stored remainder is then utilized to discriminate between and select the comparatively better set of coefficients as the set which resulted in the lowest remainder. This is particularly useful when the calibration process utilizes a binary search methodology to determine the coefficients, and in selecting between any two potentially competing sets of coefficients (e.g., determined by the toggling in the sequential method described above).

Following each iteration, the counter registers 3460 of the first and second counters 3120, 3115 are typically reset to zero by the state detector 3415. In an exemplary embodiment discussed below with reference to FIG. 37, in a final iteration, the counter registers 3460 are not reset.

Described another way, one of the first or second counters 3120, 3115 may be utilized to provide a predetermined count of either $2^J$ cycles (for the first predetermined level of discrimination) or $2^Q$ cycles (for the second predetermined level of discrimination). For example, the second counter 3115 may be halted when the reference signal has reached $2^J$ cycles (or $2^Q$ cycles), followed by the state detector 3415 examining the contents of the counter register 3460 of the first counter 3120 to determine whether the output signal was a higher or lower frequency than the reference signal. When the output signal has a higher frequency than the reference signal, the value in the bit range [J (or Q)−1:0] determines, in output signal cycles, how much higher its frequency was during the iteration, and when the output signal has a lower frequency than the reference signal, the two's complement of the value in the bit range [J (or Q)–1:0] (i.e., ![J (or Q)–1:0]+1) determines, in output signal cycles, how much lower its frequency was during the iteration. In this variation, this value in the counter register 3460 (or its two's complement) determines and is stored as a remainder in an exemplary embodiment.

As mentioned above, the smallest (lowest or least) remainder is stored in a remainder register 3435, and the corresponding calibration word (i.e., corresponding coefficients utilized to select the plurality of switchable reactance/impedance modules) utilized in the iteration which produced the smallest remainder is also stored in a calibration register 3440. In the first iteration, this will be the current remainder and current calibration word. In subsequent iterations, the current remainder is compared (in remainder comparator 3430) to the (smallest) remainder which is currently stored in the register 3435; if the current remainder is smaller than the stored remainder, the current remainder and its corresponding calibration word which produced it are then stored (by the remainder comparator 3430) in the respective remainder register 3435 and calibration register 3440, and otherwise, the stored remainder and its corresponding calibration word remain stored. If the current remainder is the same as the stored (smallest) remainder(s), the current remainder and the stored (smallest) remainder(s) are stored, along with their corresponding calibration words (potentially resulting in two or more sets of calibration coefficients for subsequent evaluation and/or selection). In an exemplary embodiment, the calibration word which produced the smallest remainder, at the first or second predetermined level of discrimination, will be utilized to provide the frequency calibration for the second frequency calibration module 3400 and second frequency calibration system 3450.

Regardless of the magnitude of any remainder, based upon whether the frequency of the output signal was higher or lower than the reference signal (as determined by the state detector 3415), the next state detector 3420 determines the next calibration state (plurality of coefficients) to be utilized in the frequency calibration. In an exemplary embodiment, the next state detector 3420 utilizes a binary search algorithm, as known to those having skill in the art. For the first iteration, as there are no previous calibration states, the upper and lower calibration word bounds are utilized, such that the frequency calibration begins with an initial calibration state of approximately the middle of the highest and lowest available calibrations. The next state detector 3420 typically utilizes a pointer register to keep track of the current state within the binary search. The pointer value, along with the current calibration word and whether the output signal frequency was higher or lower than the reference signal frequency, determines the next calibration word. In this instance, a k-bit calibration word requires only k binary search iterations in order to determine one of the best calibration words.

As mentioned above, because the best or better calibration coefficients may have been determined comparatively early in the binary search process, the currently lowest remainder and the corresponding calibration coefficients are stored and utilized for comparison. At the end of the binary search, depending upon the resolution, a single set of coefficients or more than one set of coefficients will have provided the calibration of the oscillator (100, 200, 300, 400) which produced the lowest remainder. When a single set of calibration coefficients provided the calibration of the oscillator (100, 200, 300, 400) which produced the lowest remainder, that set may be selected for the calibration, and the calibration is complete. When more than one set of coefficients provided the same, lowest remainder, then depending upon the required accuracy of the oscillator (100, 200, 300, 400): (1) one set of these coefficients may be selected arbitrarily; or (2) additional iterations are performed at a higher resolution, to discriminate between and find the more accurate single set of coefficients from among those sets selected at the lower resolution, as described below.

As indicated above, the initial iterations begin using a first (or coarse) predetermined level of discrimination (or resolution), and depending upon whether the outcome produced a single set or multiple sets of coefficients providing the lowest remainder, then may be followed by subsequent iterations utilizing a second (or fine) predetermined level of discrimination (or resolution), especially to discriminate between two possible final sets of coefficients. The second predetermined level of discrimination, which provides for counting to a higher amount, allows for discrimination between calibrations which produce output signal frequencies which are comparatively close. The first and second predetermined levels of discrimination may be determined based upon both the target output or oscillation signal frequency, which will determine the requisite number of bits for the counter register 3460, and any error specification, i.e., any amount by which the oscillation frequency (as represented in divided form by the output signal frequency) may be allowed to deviate from the target frequency, represented by the reference signal frequency (e.g., ±y ppm).

As indicated above, in a first variation, utilizing the stored remainder, following k (or fewer) iterations at the first and second predetermined levels of discrimination, the calibration word which produced the smallest remainder has been stored in the calibration register 3440, and is selected to provide frequency calibration for the harmonic oscillator (100, 200, 300, 400), i.e., providing the plurality of coefficients for selection of the plurality of switchable reactance/impedance modules. In determining the smallest remainder, however, fewer than all bits from the corresponding counter register 3460 of the first or second counter 3120, 3115 may be utilized, depending upon the degree of accuracy required or specified. For example, results of iterations (counting races) may be ignored where a remainder is larger than a (third) predetermined level, such that the corresponding calibration word is not a contender for the best calibration word. Such conditions may be implemented with combinational or finite state machine logic, with the result that not all bits contained in the counter registers 3460 will need to be compared to determine the smallest remainder.

For example, in an embodiment discussed above where the first counter 3120 may be halted when the second (reference) counter had reached a first or second terminal count (representing $2^J$ cycles (or $2^Q$ cycles) of the reference signal), followed by the state detector 3415 examining the contents of the counter register 3460 of the first counter 3120 to determine whether the output signal was a higher or lower frequency than the reference signal, we may assume that a remainder larger than fifteen would indicate that the corresponding calibration word is not a contender for the best calibration word. In this example, values in a counter register 3460 of the first counter 3120 may be ignored where (1) the $J^{th}$ or $Q^{th}$ bit equals one ([J (or Q)]=1), indicating the output signal frequency is higher than the reference signal frequency, but at least one bit of [J (or Q)–1:4] equals one; or (2) the $J^{th}$ or $Q^{th}$ bit equals zero ([J (or Q)]=0), indicating the output signal frequency is lower than the reference signal frequency, but at least one bit of [J (or Q)–1:4] equals zero. Accordingly, for a Q-bit counter register 3460, considerably fewer than Q–1 bits need to be compared for determining the lowest remainder.

In a second variation, when there are a final two sets of coefficients being evaluated to provide the best calibration, a stored remainder is not required to be utilized to determine which calibration word is to be utilized. Rather, as another option discussed in greater detail below with reference to FIG. 37, utilizing iterations at the first (or coarse) predetermined level of discrimination, the best two possible calibration contenders are determined. Subsequently, two additional iterations are performed using the second (or fine) predetermined level of discrimination, which then provides the best calibration word.

In addition, it will be apparent to those of skill in the art that the iterations of the frequency calibration process may utilize next state determinations other than based upon binary searches. For example, in other exemplary embodiments, the frequency calibration process may commence from either a maximum or minimum reactance level (i.e., a calibration word of all zeroes or all ones), and proceed sequentially, decrementing or incrementing the calibration word until the desired level of accuracy is reached.

Not separately illustrated in FIG. 34, synchronization logic may also be included within the calibration comparator 3405 and/or reactance modulator 3410, to avoid the possibility of metastable states causing logic errors. For example, hold and clear signals to the first counter 3120 may be synchronized with the harmonic oscillator (100, 200, 300, 400) to avoid such potential problems. In addition, signals based on monitored transitions in the counter register 3460 of the second counter 3115, such as a signal indicating a selected bit transition has occurred, may also be synchronized with other components, such as the state detector, which may be clocked using the reference signal frequency. In addition, to improve the accuracy of the results without increasing the number of bits utilized in the calibration registers 3440, the various counting races (iterations) are started and stopped at about the same time, as much as reasonably practicable, such as within plus or minus one-half of a clock cycle.

Figure 36B:
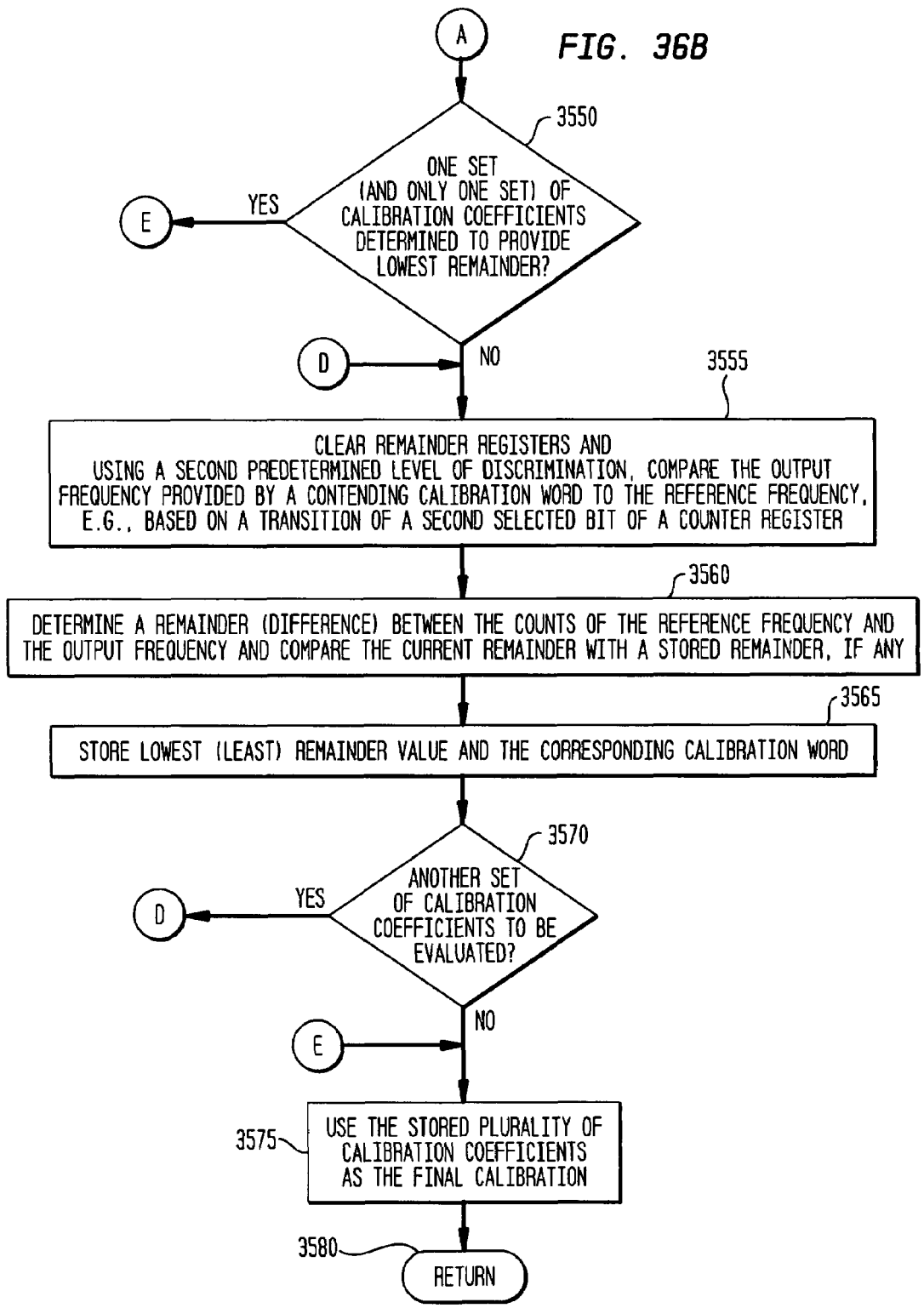
FIG. 36 (or "FIG. 36") is a flow diagram illustrating an exemplary second frequency calibration method in accordance with the teachings of the present invention.

FIG. 36 is a flow diagram illustrating an exemplary second frequency calibration method in accordance with the teachings of the present invention. Beginning with start step 3500, an initial plurality of calibration coefficients are determined, step 3505. Using the initial plurality of calibration coefficients for the harmonic oscillator (100, 200, 300, 400), the oscillation frequency is divided to provide an output signal having an output frequency, step 3510. Using a first predetermined level of discrimination, the output signal frequency is compared to reference signal frequency, typically based on a transition of a selected bit of a counter register (e.g., the Jth bit in second counter 3115), step 3515. A remainder of the current iteration is also determined, step 3520, as discussed above. The current remainder is compared with a stored remainder, if any, and the remainder having the lowest value and the corresponding calibration word (plurality of coefficients) are stored, step 3525. When the search for accurate calibration coefficients has been completed, such as when a binary search has been completed, the method may proceed to step 3550, and otherwise proceeds to step 3535 for an additional iteration. When the output signal frequency is higher than the reference signal frequency in step 3535, a next calibration word (plurality of coefficients) is determined to increase the reactance (or impedance) switched to the harmonic oscillator (100, 200, 300, 400), step 3545. When the output signal frequency is not higher than the reference signal frequency in step 3535, a next calibration word (plurality of coefficients) is determined to decrease the reactance (or impedance) switched to the harmonic oscillator (100, 200, 300, 400), step 3540. Following steps 3540 and 3545, the next calibration word is evaluated, returning to step 3515 and the method iterates, repeating steps 3515-3545 as the case may be. (Implicit in each iteration, and not separately specified, is that any counters (first counter 3120 and second counter 3115) are reset prior to commencing the next iteration).

When the search has been completed at the first predetermined level of discrimination in step 3530, the method proceeds to step 3550, and determines whether one (and only one) set of calibration coefficients has been determined to be optimal and provide the lowest remainder. When only one set of calibration coefficients has resulted, the method may proceed to step 3575, and use this stored plurality of calibration coefficients as the final or complete calibration for the oscillator (100, 200, 300, 400). When there is more than one set of calibration coefficients in step 3550, the method proceeds to step 3555, clears the remainder register, and using a second predetermined level of discrimination, the output signal frequency is compared to reference signal frequency, also typically based on a transition of a selected bit of a counter register (e.g., the $Q^{th}$ bit). A remainder of the current iteration at the second predetermined level of discrimination is also determined, as discussed above, and the current remainder is compared with a stored remainder, if any, step 3560. The remainder having the lowest value and the corresponding calibration word (plurality of coefficients) are stored, step 3565. When there is another contending set of calibration coefficients remaining to be evaluated, step 3570, the method returns to step 3555 and iterates, comparing the output frequency provided by the next contending set of calibration coefficients with the reference frequency, and so on.

When there are no more contending set of calibration coefficients remaining to be evaluated in step 3570, whichever set of calibration coefficients producing the lowest remainder will have been stored as such (calibration register(s) 3440). Accordingly, the method may then proceed to step 3575, and use the stored calibration word as the final calibration for the plurality of coefficients for the switchable reactances and/or impedances selectively couplable to the harmonic oscillator (100, 200, 300, 400). Following step 3575, the method may end, return step 3580.

FIG. 37 is a flow diagram illustrating an exemplary third frequency calibration method in accordance with the teachings of the present invention, and may be utilized as a variation to determine the optimal set of calibration coefficients when there is more than one contending set, following step 3550 (of FIG. 36). Similarly, this alternative methodology may also be utilized when the calibration coefficients are evaluated sequentially. For example, utilizing a maximum calibration word (providing the most reactance and the lowest output signal frequency), the calibration word may be decremented sequentially until the output signal frequency is greater than the reference signal frequency. Also for example, utilizing a minimum calibration word (providing the least reactance and the highest output signal frequency), the calibration word may be incremented sequentially until the output signal frequency is less than the reference signal frequency. In either case, two possible calibration words are available as final candidates, namely, the ultimate or first calibration word at which the transition first occurred (namely, when the output signal frequency first exceeded the reference signal frequency, or vice-versa), and the prior, penultimate or second calibration word. For example, it is possible that the second, penultimate calibration word may provide an output signal frequency which is closer to the reference signal frequency, but not sufficiently close to have caused a transition in the counter bit of interest, such as the $j^{th}$ bit for the first predetermined level of discrimination. In the first methodology described above, it is possible that the calibration process could toggle back and forth between these adjacent sets of calibration coefficients.

Accordingly, when the final two calibration word candidates have been determined, referred to as the ultimate and penultimate calibration words (or sets of calibration coefficients), the third exemplary method proceeds to clear the remainder registers and counter registers, step 3605, and then will re-run two iterations (counting races) utilizing the second, finer predetermined level of discrimination. Specifically, in step 3610, using a second predetermined level of discrimination, and using the first (e.g., ultimate) calibration word, another iteration is performed, namely, the output signal frequency is compared to the reference signal frequency, to determine whether the output signal frequency is higher or lower than the reference signal frequency, typically based on a transition of a selected bit of corresponding counter registers (e.g., the $Q^{th}$ bit). More specifically, the corresponding cycles of the output signal and the reference signal are counted until the first occurrence of a bit transition of a second selected bit (at the "$Q^{th}$" bit position) in the respective counter registers 3460, indicating which of the two signals has a comparatively higher frequency. For example, with the respective counter registers 3460 both reset to zero, the signal (either the output signal or the reference signal) having a higher frequency will be the first to cause the $Q^{th}$ bit to transition from a logic zero to a logic one in the counter register 3460. For whichever signal had the lower frequency, the corresponding counter register 3460 of the respective first or second counter 3120, 3115 will have a difference value, namely, a value which is somewhat less than the transition value (of, in this instance, 100. . . 000 for Q bits), such as 0111 . . . 110101, for example.

Next, in step 3615, without resetting the counter registers 3460 of the first and second counters 3120, 3115, and using the second predetermined level of discrimination and the second (e.g., penultimate) calibration word, another iteration is performed, namely, the output signal frequency is compared to the reference signal frequency, to determine whether the output signal frequency is higher or lower than the reference signal frequency, also typically based on a transition of a selected bit of corresponding counter registers (e.g., the $Q^{th}$ bit). In this case, as the counters were not reset, the transition of the selected bit of interest (e.g., the $Q^{th}$ bit) will be from a logic one to a logic zero. More specifically, the corresponding cycles of the output signal and the reference signal are counted until the first occurrence of a bit transition of the selected bit (at the "$Q^{th}$" bit position) in the respective counter registers 3460. In this case, however, whichever signal previously had the lower frequency started from a deficit, namely, the difference value, with this gap or difference needing to be overcome for that signal to cause the transition in the selected bit of interest and "win" the second race (iteration).

As a first example, we can assume that in step 3610, using the first calibration word, the output signal frequency was higher than the reference signal frequency, i.e., the harmonic oscillator (100, 200, 300, 400) won the counting race, and accordingly, there is a deficit remaining in the counter register 3460 of the second counter 3115. Then, in step 3615, using the second (penultimate) calibration word for the iteration, in which the output signal frequency has been decreased, there are two possible outcomes. First, if the reference signal is the first to cause the bit transition and "win" the second race, then it more than made up for its starting deficit, indicating that the frequency of the harmonic oscillator (100, 200, 300, 400) has been lowered too much using the second (penultimate) calibration word, and that first (ultimate) calibration word provided an output signal frequency closer to the reference signal frequency. Second, if the output signal is the first to cause the bit transition and "win" the second race, then this second (penultimate) calibration word is the better choice, as the output signal frequency was lower, yet the reference signal was unable to make up for its starting deficit, indicating that the previous frequency of the harmonic oscillator (100, 200, 300, 400) using the first (ultimate) calibration word was too much higher than the reference signal frequency.

As a second example, we can assume that in step 3610, using the first calibration word, the output signal frequency was lower than the reference signal frequency, i.e., the reference signal won the counting race, and accordingly, there is a deficit remaining in the counter register 3460 of the first counter 3120. Then, in step 3645, using the second (penultimate) calibration word for the iteration, in which the output signal frequency has been increased, there are two possible outcomes. First, if the output signal is the first to cause the bit transition and "win" the second race, then it more than made up for its starting deficit, indicating that the frequency of the harmonic oscillator (100, 200, 300, 400) has been increased too much using the second (penultimate) calibration word, and that first (ultimate) calibration word provided an output signal frequency closer to the reference signal frequency. Second, if the reference signal is the first to cause the bit transition and "win" the second race, then this second (penultimate) calibration word is the better choice, as the output signal frequency was higher, yet the output signal was unable to make up for its starting deficit, indicating that the previous frequency of the harmonic oscillator (100, 200, 300, 400) using the first (ultimate) calibration word was too much lower than the reference signal frequency.

Accordingly, following step 3615, in step 3620, when the output signal frequency using the first (ultimate) calibration word is higher than the output signal frequency using the second (penultimate) calibration word, such as in the first example above, the method proceeds to step 3625. In step 3625, the third method determines whether the reference signal first caused the transition in the selected bit (e.g., $Q^{th}$) in the corresponding counter registers 3460. When the reference signal first caused the transition in the selected bit, then the third method selects the first (ultimate) calibration word as the final calibration word (for the plurality of coefficients), step 3640. When the reference signal did not cause the transition in the selected bit, then the third method selects the second (penultimate) calibration word as the final calibration word (for the plurality of coefficients), step 3635.

In step 3620, when the output signal frequency using the first (ultimate) calibration word is not higher than the output signal frequency using the second (penultimate) calibration word, such as in the second example above, the method proceeds to step 3630. In step 3630, the third method also determines whether the reference signal first caused the transition in the selected bit (e.g., $Q^{th}$) in the corresponding counter registers 3460. When the reference signal first caused the transition in the selected bit, then the third method selects the second (penultimate) calibration word as the final calibration word (for the plurality of coefficients), step 3635. When the reference signal did not cause the transition in the selected bit, then the third method selects the first (ultimate) calibration word as the final calibration word (for the plurality of coefficients), step 3640. Following steps 3635 or 3640, the third calibration method may end, return step 3645.

Figure 38:
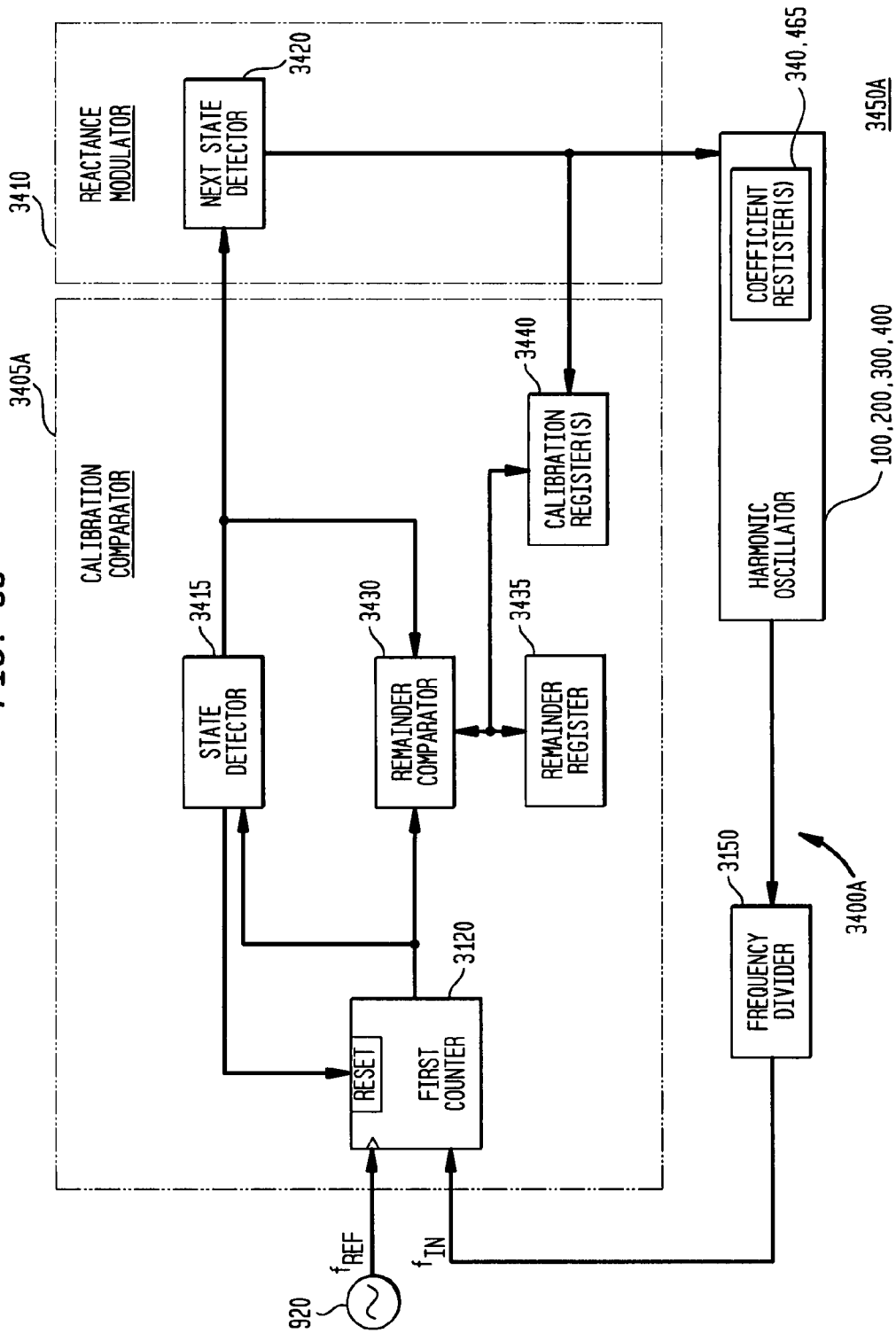
FIG. 38 (or "FIG. 38") is a block diagram illustrating in greater detail an exemplary third frequency calibration module and third frequency calibration system in accordance with the teachings of the present invention.

FIG. 38 is a block diagram illustrating in greater detail an exemplary third frequency calibration module 3400A and third frequency calibration system 3450A in accordance with the teachings of the present invention. Third frequency calibration module 3400A differs from the second frequency calibration module 3400 insofar as: (1) the third frequency calibration module 3400A includes only one counter, first counter 3120, rather than two counters; and (2) the first counter 3120 is clocked or otherwise started and stopped using the frequency reference 920. Rather than having two counters 3120 and 3115 counting the output signal frequency and the reference signal frequency, respectively, in third frequency calibration module 3400A, the count of the output signal frequency provided by the first counter 3120 will be based upon the number of cycles of the output signal which may be counted during a predetermined number of cycles of the known reference signal. More particularly, a rising or a falling edge of the frequency reference 920 will start and stop the first counter 3120. When the first counter 3120 is started by the frequency reference 920, it will begin counting the cycles of the output signal, and will continue counting until another transition (or known number of cycles) of the frequency reference 920 stops the counter. For example, one transition of the frequency reference 920 may start the counting by the first counter 3120, and a next transition of the frequency reference 920 may stop the counting of the first counter 3120.

As the reference signal has a known frequency and known period, the count value of the first counter 3120 represents the number of cycles of the output signal which occurred during that period of time, and provides another means of comparing the output frequency to a reference frequency, using first or second predetermined levels of discrimination. For calibration of the harmonic oscillator (100, 200, 300, 400) to a selected oscillation frequency using a known reference signal frequency, the frequency count from a calibrated harmonic oscillator (100, 200, 300, 400), which should have occurred during that period of time, is also known. For example, using a comparatively low frequency reference signal of 1 kHz (having a period of 1 ms), calibration of the harmonic oscillator (100, 200, 300, 400) to 40 MHz should (eventually) result in a count of 40,000 during the 1 ms period, which may then be considered to be the known reference count. The actual count of the first counter 3120 may then be compared to the reference count by state detector 3415, and the difference stored in remainder comparator 3450. The lowest remainder then represents the smallest difference between the actual count of the output signal frequency and the expected reference count which should have occurred (based on the known frequency of the reference signal). The calibration word which achieves the lowest remainder is then utilized to provide the calibration of the harmonic oscillator (100, 200, 300, 400), as discussed above. In addition, for increased accuracy as discussed above, a second predetermined level of discrimination may also be implemented, such as by allowing the first counter 3120 to continue counting for a longer period of time (either by using multiple cycles of the reference signal or a lower frequency reference signal, allowing for higher counts to be achieved during the counting period of the first counter 3120).

The advantages of this third frequency calibration module 3400A and third frequency calibration system 3450A include the use of a lower frequency reference signal, which may be easier to generate precisely and may generate less noise, and the use of only one counter (first counter 3120) and potentially simpler comparison logic, providing a savings in IC design, fabrication and chip area.

Referring again to FIGS. 2, 3 and 4, it will be appreciated by those of skill in the art that a highly accurate over PVT, low jitter, free-running and self-referenced oscillator has been described, providing a differential, substantially sinusoidal signal having a selectable and tunable resonant frequency, $f_0$, available at nodes 470 and 475. For many applications, this signal is sufficient, and may be utilized directly (and may be output on bus 125 or 135 of FIG. 1, on line 250 of FIG. 2, or on line 350 of FIG. 3, or between the rails or lines 470 and 475 of FIG. 4). For example, this signal may be utilized as a timing or frequency reference. In accordance with the present invention, additional applications are available, including clock generation (substantially square wave), frequency division, low-latency frequency switching, and mode selection, as described below.

Figure 14:
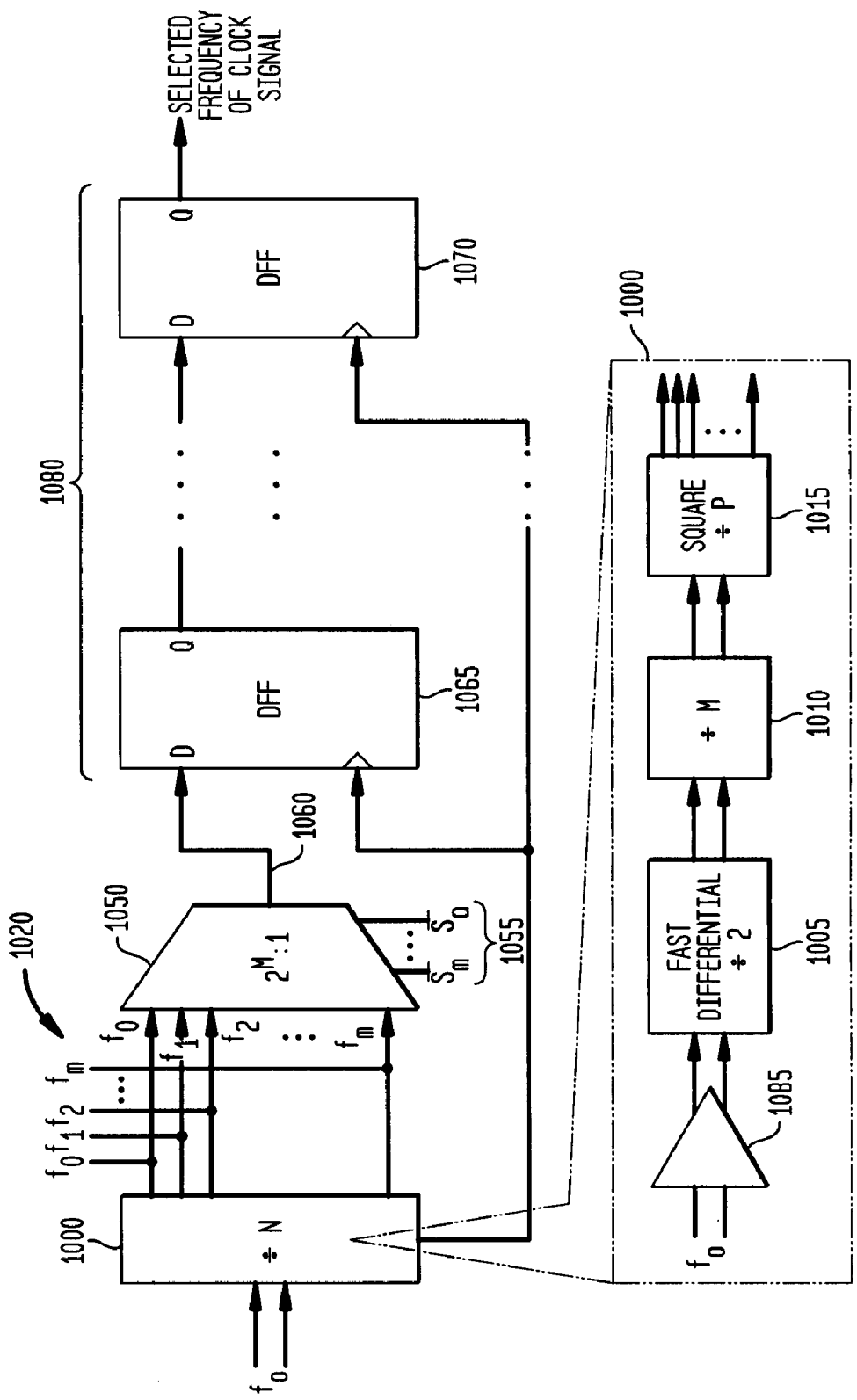
FIG. 14 (or "FIG. 14") is a block diagram illustrating an exemplary frequency divider, square wave generator, asynchronous frequency selector and glitch suppression module in accordance with the teachings of the present invention.

FIG. 14 is a block diagram illustrating an exemplary frequency divider and square wave generator 1000, and an exemplary asynchronous frequency selector 1050, with exemplary glitch suppression module 1080 in accordance with the teachings of the present invention. As indicated above, frequency divider and square wave generator 1000 may be included in or comprise modules 220 and/or 330, and frequency selector 1050 (with or without glitch suppression module 1080) may be included in or comprise modules 205 and/or 335.

Referring to FIG. 14, the output signal from the oscillator, namely, a differential and substantially sinusoidal signal having a frequency $f_0$, such as output on line 250 of FIG. 2, or line 350 of FIG. 3, or between the rails or lines 470 and 475 of FIG. 4, is input into frequency divider and square wave generator 1000. The frequency of this substantially sinusoidal signal is divided by any one or more arbitrary values "N" into "m" different frequencies (including $f_0$, where appropriate), and converted to substantially square wave signals, resulting in a plurality of substantially square wave signals having m+1 different available frequencies, output on lines or bus 1020 as frequencies $f_0, f_1, f_2$, through $f_m$. Any of these substantially square wave signals having m+1 different available frequencies are selectable asynchronously through exemplary asynchronous frequency selector 1050 which, as illustrated, may be embodied as a multiplexer. The selection of any of these substantially square wave signals having m+1 different available frequencies may be accomplished through the plurality of selection lines ($S_m$ through $S_0$) 1055, providing a substantially square wave signal having the selected frequency, output on line 1060.

As part of asynchronous frequency selection, glitch suppression is also provided by glitch suppression module 1080, which may be embodied in a plurality of ways, including through the use of one or more exemplary D flip-flops ("DFFs") illustrated in FIG. 14. A glitch could occur in an asynchronous frequency transition in which either a low state or a high state is not maintained for a sufficient period of time and may cause metastability in circuitry which is driven by the output clock signal. For example, an asynchronous frequency transition could result in a low state at a first frequency transitioning into a high state at a second frequency, at a point where the high state is about to transition back to a low state at the second frequency, resulting in a voltage spike or glitch. To avoid potential glitches from being provided as part of an output clock signal, the selected substantially square wave signal (having the selected frequency) is provided on line 1060 to a first DFF 1065 which provides a holding state; if a glitch should occur, it will be held until a clock edge triggering the DFF. To avoid the glitch occurring at the clock edge, the DFFs may be clocked at less than the maximum available frequency, or one or more additional DFFs (such as DFF 1070) may be employed, as during the wait for another clock signal, the Q output from the DFF 1065 will have stabilized to either a first state (high or low) or a second state (low or high), such as to either the power or ground rail. It has been shown by the inventors that 2 DFFs are sufficient, with additional DFFs potentially being added as may be desired, but with additional DFFs causing increased switching latency. While illustrated utilizing exemplary DFFs, other flip-flops or counters may be utilized, and those of skill in the art will recognize myriad other equivalent implementations which will achieve this result, and all such variations are within the scope of the invention.

Figure 15:
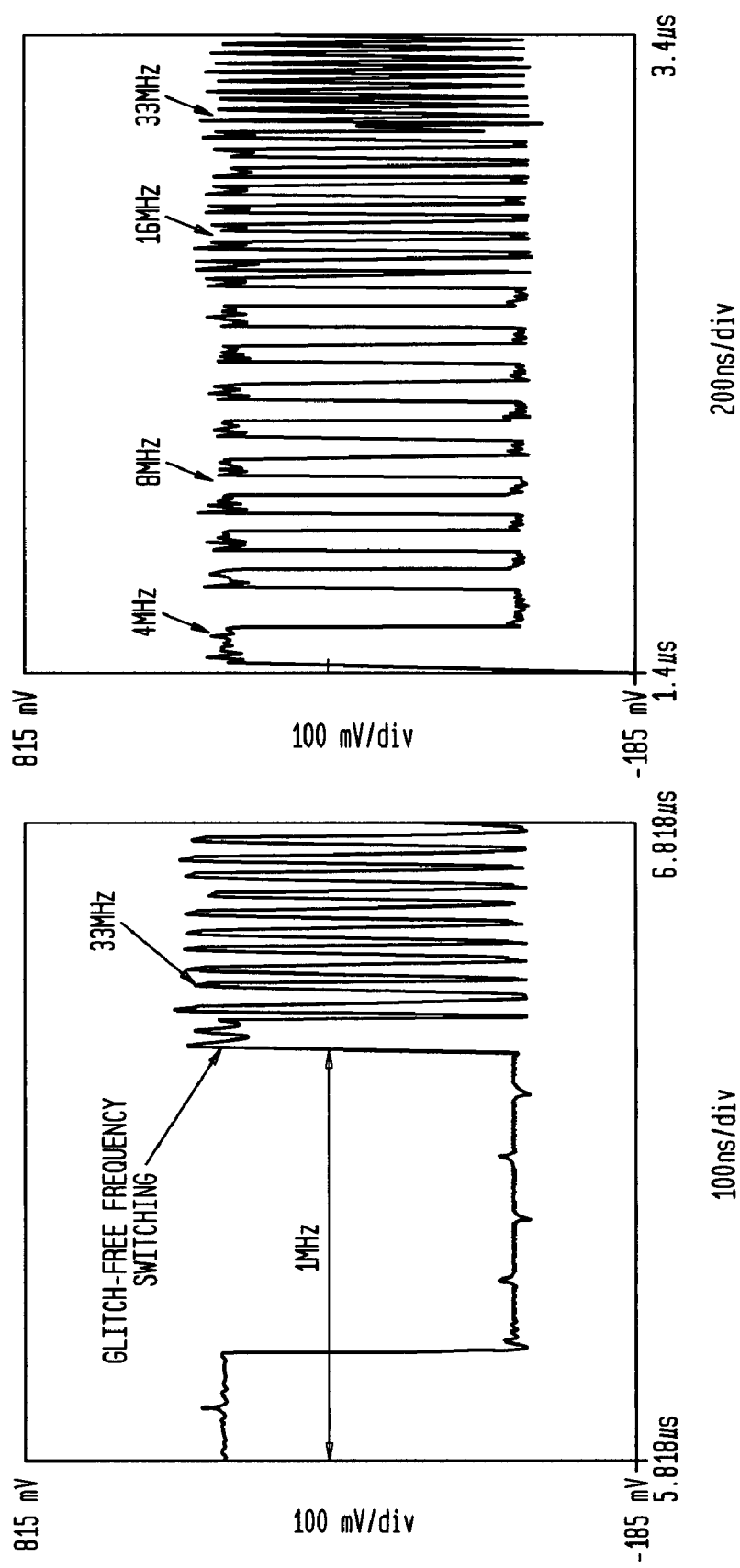
FIG. 15 (or "FIG. 15") is a graphical diagram illustrating exemplary low latency frequency switching in accordance with the teachings of the present invention.

Such exemplary low latency frequency switching in accordance with the teachings of the present invention is illustrated in FIG. 15. FIG. 15 is also illustrative of "substantially" square waves of the present invention, which are typical of actual square waves utilized in various technologies, exhibiting reasonable variation, undershoots and overshoots at their respective high and low states (and not the perfect "flatness" of textbook examples). FIG. 15, part A, illustrates asynchronous glitch-free switching from 1 MHz to 33 MHz, while part B illustrates measured glitch-free switching from 4 MHz to 8 MHz, then to 16 MHz, and then to 33 MHz.

Figure 16:
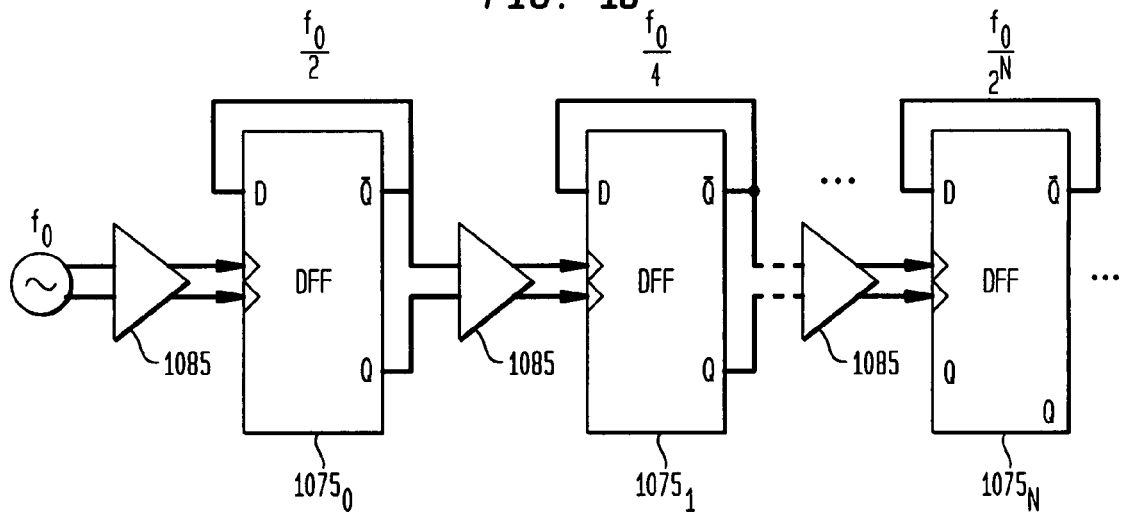
FIG. 16 (or "FIG. 16") is a block diagram illustrating an exemplary frequency divider in accordance with the teachings of the present invention.

Referring again to FIG. 14, the frequency divider and square wave generator 1000 may be implemented in innumerable ways, such as differential or single-ended, with the illustrated divider being merely exemplary. As the output from the oscillator illustrated in FIG. 4 is differential (across lines or rails 470 and 475), the first divider 1005 is also differential and provides complementary outputs, to present a substantially constant load to the oscillator and to maintain phase alignment, and is fast, to support high frequencies such as in the GHz range. In addition, it may be necessary or advisable to reject any relaxation mode oscillation of the first divider 1005. The second divider 1010 may also be differential and provide any arbitrary frequency division (divide by "M"), such as dividing by an integer, a multiple of two, a rational number, or any other amount or number, etc. Topologies or configuration for such dividers are known in the art, and any such divider may be utilized. Such dividers, for example and without limitation, may be a sequence (multiple stages) of counters or flip-flops 1075, such as those flip-flops illustrated in FIG. 16, which provide frequency division in powers or multiples of 2, with the output of each stage providing a different frequency and further providing a clock signal for the next stage and also fed back to its own input, as illustrated. As illustrated, a plurality of frequencies are then available for output on lines or bus 1020, such as $f_0/2, f_0/4$, and so on, through $f_0/2^N$. In addition, as illustrated, buffers 1085 may also be utilized, from the oscillator to the first divider 1005, to provide sufficient voltage to drive the first divider 1005, and also between second divider 1010 stages, to isolate state-dependent load variation which could also affect signal rise and fall times.

It should also be noted that the use of the various flip-flops has also provided a substantially square wave, as any substantially sinusoidal signal has been provided to clock a flip flop, whose output is then pulled to a high or low voltage. Other square wave generators may also be utilized, as known or becomes known in the art. In the illustrated embodiments, to maintain phase alignment, differential signals are maintained through the last division. Following the last frequency division, the plurality of signals (each having a different frequency) are then squared (in module 1015) to provide substantially an evenly divided (e.g., 50:50) duty cycle, such that the time in which the signal is in a first (high) state is substantially equal to the time in which the signal is in a second (low) state.

Figure 17:
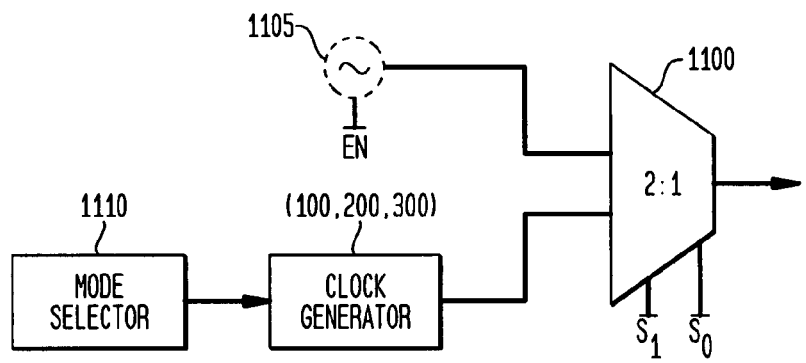
FIG. 17 (or "FIG. 17") is a block diagram illustrating an exemplary power mode selection module in accordance with the teachings of the present invention.

FIG. 17 is a block diagram illustrating an exemplary mode selection module in accordance with the teachings of the present invention. There are circumstances in which a highly-accurate, high performance reference, such as a clock generator (100, 200 or 300) of the invention, is unnecessary, such as in a low power, standby mode. In these circumstances, in accordance with the invention, either no clock output is provided, or a low power, reduced performance clock 1105 output is provided. For example, at comparatively low frequencies, a low performance ring oscillator may provide suitable performance with low power consumption. As illustrated in FIG. 17, for these conditions, the output of the low power oscillator 1105 may be selected (through multiplexer 1100), and provided as a clock output to other circuitry. At higher frequencies, however, such low performance oscillators consume considerably more power, typically significantly more than the oscillator of the present invention. There is typically a "break-even" point as a function of frequency, after which the clock generator (100, 200 or 300) provides both higher performance and lower power consumption, and may be selected (through multiplexer 1100), and provided as a clock output to other circuitry. As a consequence, the clock generator (100, 200 or 300) may also be utilized to provide a low power mode.

In addition, using mode selector 1110, other modes may be selected, such as a no power mode, rather than merely a low-frequency or sleep mode, as the clock generator (100, 200 or 300) may be restarted comparatively rapidly, or a pulsed mode, in which the clock generator (100, 200 or 300) is repeatedly stopped and restarted, periodically or non-periodically, in bursts or intervals. Various reference modes are discussed below.

In sharp contrast to the prior art, this pulsed clocking using the clock generator and/or timing/frequency reference (100, 200 or 300) of the present invention provides power savings or conservation. While more power may be consumed during a given burst, as the clock has a comparatively high frequency, more instructions are processed in that interval, followed by no or limited power dissipation during the non-pulse or off interval, resulting in higher MIPS/mW compared to a continuously running clock. In contrast, due to the comparatively long start-up time and locking of prior art clocks, such pulsed clocking results in more power consumption and less efficiency in the prior art.

Figure 18:
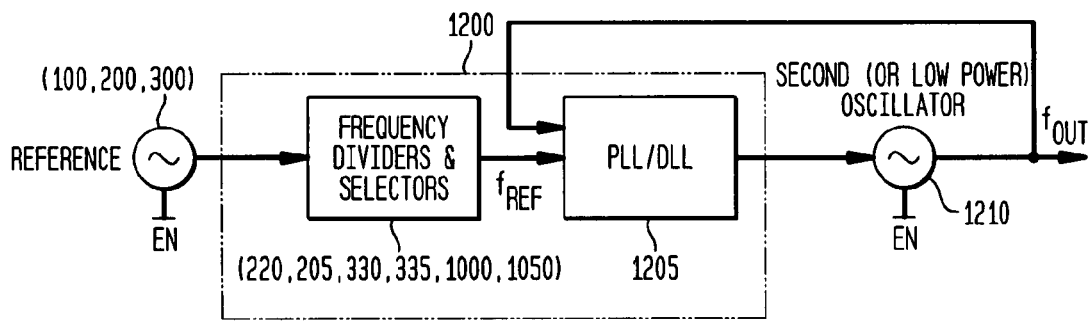
FIG. 18 (or "FIG. 18") is a block diagram illustrating an exemplary synchronization module for a second oscillator in accordance with the teachings of the present invention.

FIG. 18 is a block diagram illustrating an exemplary synchronization module 1200 for a second oscillator in accordance with the teachings of the present invention. As mentioned above, the clock generator and/or timing/frequency reference (100, 200 or 300) may provide a reference mode to synchronize other oscillators or clocks, which may or may not be low power, such as second oscillator 1210 (e.g., ring, relaxation, or phase shift oscillators). An output signal from the clock generator and/or timing/frequency reference (100, 200 or 300) is further frequency divided as needed to form a plurality of available reference frequencies, with a reference frequency selected from this plurality of frequencies. This may be accomplished using the modules discussed above, such as by using the existing frequency dividers (220, 330, 1000, for example), and then providing the reference signal from the frequency selector 1050 (or 205 or 335). For example, referring to FIG. 3, mode selector 345 may select a reference mode and provide the output reference signal from frequency selector 335 to a second oscillator (with synchronization module) 375. A synchronization module, such as PLL, FLL, or DLL 1205, is then utilized to synchronize the output signal from the second oscillator 1210 to the reference signal provided by clock generator and/or timing/frequency reference (100, 200 or 300). In addition to a mode of continuous synchronization, a pulsed-synchronization may also be provided, in which the clock generator and/or timing/frequency reference (100, 200 or 300) provides a pulsed output, and synchronization occurs during the interval of these pulses, as a synchronization interval.

Figure 19:
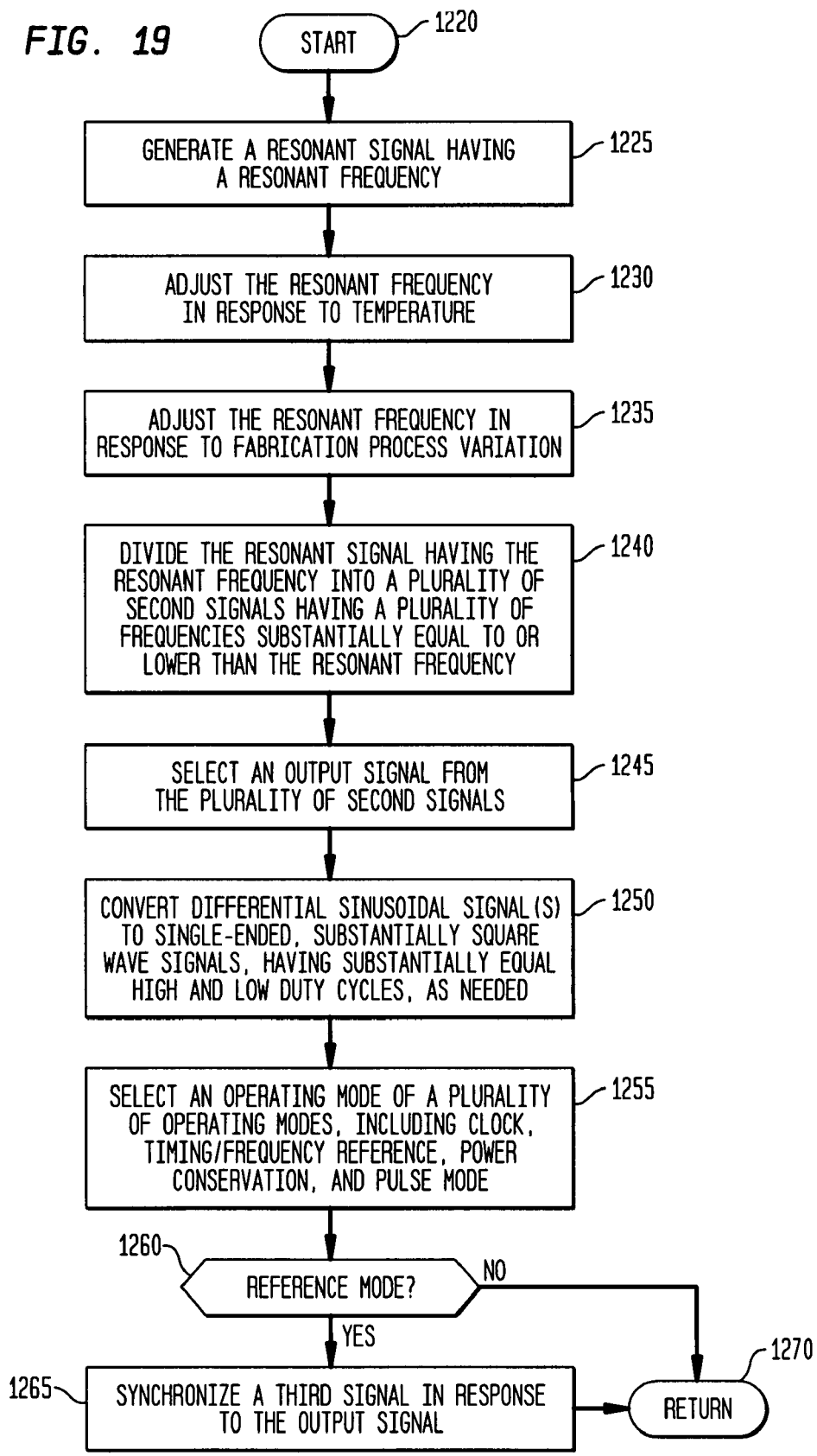
FIG. 19 (or "FIG. 19") is a flow diagram illustrating an exemplary method in accordance with the teachings of the present invention.

FIG. 19 is a flow diagram illustrating an exemplary method in accordance with the teachings of the present invention, and provides a useful summary. The method begins with start step 1220, such as through clock generator and/or timing/frequency reference (100, 200 or 300) start-up. It should be noted that while illustrated in FIG. 19 as consecutive steps, these steps may occur in any order, and generally may occur concurrently as the clock generator and/or timing/frequency reference (100, 200 or 300) operates. Referring to FIG. 19, a resonant signal having a resonant frequency is generated, step 1225, such as through LC tank 405 or resonator 310. The resonant frequency is adjusted in response to temperature, step 1230, such as through a temperature compensator 315, which adjusts current and frequency. The resonant frequency is adjusted in response to fabrication process variation, step 1235, such as through process variation compensator 320. As indicated above, step 1235 may be performed as a first calibration step, followed by the temperature adjustment of step 1230. The resonant signal having the resonant frequency is divided into a plurality of second signals having a corresponding plurality of frequencies, in which the plurality of frequencies are substantially equal to or lower than the resonant frequency, step 1240, such as through frequency divider 330 or 1000). An output signal is selected from the plurality of second signals, step 1245, such as through frequency selector 335 or 1050, for example. Depending upon the selected embodiment or mode, the selected output signal may be provided directly, for example, as a reference signal.

In other embodiments, such as when the output signal is a differential rather than single-ended signal, and when the resonant signal is a substantially sinusoidal signal, the method continues with converting the differential, substantially sinusoidal signal to a single-ended, substantially square wave signal having a substantially equal high and low duty cycle, as needed, step 1250, such as to generate a clock output signal using modules 330 or 1000, for example. An operating mode is also selected from a plurality of operating modes, step 1255, where the plurality of operating modes can be selected from a group comprising a clock mode, a timing and frequency reference mode, a power conservation mode, and a pulsed mode, for example, such as using mode selector 225 or 345. When a reference mode is selected in step 1255, in step 1260, the method proceeds to step 1265, to synchronize a third signal (e.g., from a second oscillator) in response to the output signal, such as illustrated in FIG. 18. Following steps 1260 or 1265, the method may end or repeat (continue) (such as with the clock generator and/or timing/frequency reference (100, 200 or 300) running continuously), return step 1270.

Although the invention has been described with respect to specific embodiments thereof, these embodiments are merely illustrative and not restrictive of the invention. In the description herein, numerous specific details are provided, such as examples of electronic components, electronic and structural connections, materials, and structural variations, to provide a thorough understanding of embodiments of the present invention. One skilled in the relevant art will recognize, however, that an embodiment of the invention can be practiced without one or more of the specific details, or with other apparatus, systems, assemblies, components, materials, parts, etc. In other instances, well-known structures, materials, or operations are not specifically shown or described in detail to avoid obscuring aspects of embodiments of the present invention. In addition, the various Figures are not drawn to scale and should not be regarded as limiting.

Reference throughout this specification to "one embodiment", "an embodiment", or a specific "embodiment" means that a particular feature, structure, or characteristic described in connection with the embodiment is included in at least one embodiment of the present invention and not necessarily in all embodiments, and further, are not necessarily referring to the same embodiment. Furthermore, the particular features, structures, or characteristics of any specific embodiment of the present invention may be combined in any suitable manner and in any suitable combination with one or more other embodiments, including the use of selected features without corresponding use of other features. In addition, many modifications may be made to adapt a particular application, situation or material to the essential scope and spirit of the present invention. It is to be understood that other variations and modifications of the embodiments of the present invention described and illustrated herein are possible in light of the teachings herein and are to be considered part of the spirit and scope of the present invention.

It will also be appreciated that one or more of the elements depicted in the Figures can also be implemented in a more separate or integrated manner, or even removed or rendered inoperable in certain cases, as may be useful in accordance with a particular application. Integrally formed combinations of components are also within the scope of the invention, particularly for embodiments in which a separation or combination of discrete components is unclear or indiscernible. In addition, use of the term "coupled" herein, including in its various forms such as "coupling" or "couplable", means and includes any direct or indirect electrical, structural or magnetic coupling, connection or attachment, or adaptation or capability for such a direct or indirect electrical, structural or magnetic coupling, connection or attachment, including integrally formed components and components which are coupled via or through another component.

A "controller" or "processor" as used herein may be any type of controller or processor, and may be embodied as one or more controllers, processors, or finite state machines adapted to perform the functionality discussed herein. As the term controller or processor is used herein, a processor may include use of a single integrated circuit ("IC"), or may include use of a plurality of integrated circuits or other components connected, arranged or grouped together, such as controllers, microprocessors, digital signal processors ("DSPs"), parallel processors, multiple core processors, custom ICs, application specific integrated circuits ("ASICs"), field programmable gate arrays ("FPGAs"), adaptive computing ICs, associated memory (such as RAM, DRAM and ROM), finite state machines, and other ICs and components. As a consequence, as used herein, the term processor (or controller) should be understood to equivalently mean and include a single IC, or arrangement of custom ICs, ASICs, processors, microprocessors, controllers, FPGAs, adaptive computing ICs, finite state machines. or some other grouping of integrated circuits which perform the functions discussed below, with associated memory or registers, such as microprocessor memory or additional RAM, DRAM, SDRAM, SRAM, MRAM, ROM, FLASH, EPROM or $E^2$PROM. A processor (or controller), with its associated memory, may be adapted or configured (via programming, FPGA interconnection, or hard-wiring) to perform the methodology of the invention, as discussed below. For example, the methodologies may be programmed and stored, in a processor (or controller) with its associated memory or registers and other equivalent components, as a set of program instructions or other code (or equivalent configuration or other program) for subsequent execution when the processor is operative (i.e., powered on and functioning). Equivalently, when the processor (or controller) may implemented in whole or part as FPGAs, custom ICs and/or ASICs, the FPGAs, custom ICs or ASICs also may be designed, configured and/or hard-wired to implement the methodologies of the invention.

Memory or registers may be embodied in any number of forms, including within machine-readable data storage medium, memory device or other storage or communication device for storage or communication of information, currently known or which becomes available in the future, including, but not limited to, a memory integrated circuit ("IC"), or memory portion of an integrated circuit (such as the resident memory within a controller 160, 260 or processor IC), whether volatile or non-volatile, whether removable or non-removable, including without limitation RAM, FLASH, DRAM, SDRAM, SRAM, MRAM, FeRAM, ROM, EPROM or $E^2$PROM, or any other form of memory device, such as a magnetic hard drive, an optical drive, a magnetic disk or tape drive, a hard disk drive, other machine-readable storage or memory media such as a floppy disk, a CDROM, a CD-RW, digital versatile disk (DVD) or other optical memory, or any other type of memory, storage medium, or data storage apparatus or circuit, which is known or which becomes known, depending upon the selected embodiment. In addition, such computer readable media includes any form of communication media which embodies computer readable instructions, data structures, program modules or other data in a data signal or modulated signal, such as an electromagnetic or optical carrier wave or other transport mechanism, including any information delivery media, which may encode data or other information in a signal, wired or wirelessly, including electromagnetic, optical, acoustic, RF or infrared signals, and so on. The memory or registers may be adapted to store various look up tables, parameters, coefficients, other information and data, programs or instructions (software), and other types of tables such as database tables.

As indicated above, processor (or controller) is programmed, using software and data structures of the invention, for example, to perform the methodology of the present invention. As a consequence, the system and method of the present invention may be embodied as software which provides such programming or other instructions, such as a set of instructions and/or metadata embodied within a computer readable medium, discussed above. Such software may be in the form of source or object code, by way of example and without limitation. Source code further may be compiled into some form of instructions or object code (including assembly language instructions or configuration information). The software or source code of the present invention may be embodied as any type of code, such as C, C++, SystemC, LISA, XML, Java, Brew, or any other type of programming language which performs the functionality discussed herein, including various hardware definition or hardware modeling languages (e.g., Verilog, VHDL, RTL) and resulting database files (e.g., GDSII). As a consequence, a "construct", "program construct", "software construct" or "software", as used equivalently herein, means and refers to any programming language, of any kind, with any syntax or signatures, which provides or can be interpreted to provide the associated functionality or methodology specified (when instantiated or loaded into a processor or computer and executed).

Furthermore, any signal arrows in the drawings/Figures should be considered only exemplary, and not limiting, unless otherwise specifically noted. Combinations of components of steps will also be considered within the scope of the present invention, particularly where the ability to separate or combine is unclear or foreseeable. The disjunctive term "or", as used herein and throughout the claims that follow, is generally intended to mean "and/or", having both conjunctive and disjunctive meanings (and is not confined to an "exclusive or" meaning), unless otherwise indicated. As used in the description herein and throughout the claims that follow, "a", "an", and "the" include plural references unless the context clearly dictates otherwise. Also as used in the description herein and throughout the claims that follow, the meaning of "in" includes "in" and "on" unless the context clearly dictates otherwise.

The foregoing description of illustrated embodiments of the present invention, including what is described in the summary or in the abstract, is not intended to be exhaustive or to limit the invention to the precise forms disclosed herein. From the foregoing, it will he observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

The invention claimed is:

1. A method for frequency calibration of a reference oscillator, the reference oscillator providing an oscillation signal, the method comprising:
    using the oscillation signal, providing an output signal having an output frequency;
    using a first predetermined level of discrimination, comparing the output frequency to a reference frequency;
    providing a first comparison signal when the output frequency is higher than the reference frequency;
    providing a second comparison signal when the output frequency is lower than the reference frequency; and
    determining a plurality of coefficients to increase a reactance of the reference oscillator in response to the first comparison signal or to decrease the reactance of the reference oscillator in response to the second comparison signal.

2. The method of claim 1, wherein the step of providing the output signal further comprises:
    using the oscillation signal having an oscillation frequency, multiplying or dividing the oscillation frequency by a rational number to provide the output signal having the output frequency.

3. The method of claim 1, wherein the comparing step further comprises:
    counting cycles of the output signal and the reference signal;
    determining when a first predetermined terminal count has been reached by the reference signal; and
    determining a difference between an output signal count and the first predetermined terminal count.

4. The method of claim 1, wherein the comparing step further comprises:
    counting cycles of the output signal and the reference signal;
    determining when a first predetermined terminal count has been reached by the output signal; and
    determining a difference between a reference signal count and the first predetermined terminal count.

5. The method of claim 1, wherein the comparing step further comprises:
    counting cycles of the output signal during a predetermined period of time; and
    determining a remainder as a difference between an output signal count and a predetermined reference count.

6. The method of claim 5, further comprising:
following the comparison, determining a lowest remainder and storing a corresponding plurality of coefficients which produced the output frequency having the lowest remainder.

7. The method of claim 6, further comprising:
following a last comparison, selecting the plurality of coefficients which produced the output frequency having the lowest remainder and providing the plurality of coefficients as the frequency calibration of the reference oscillator.

8. The method of claim 1, further comprising:
counting cycles of the output signal and the reference signal; and
determining a remainder as a cycle count difference between the reference frequency and the output frequency.

9. The method of claim 8, further comprising:
following the comparison, determining a lowest remainder and storing a corresponding plurality of coefficients which produced the output frequency having the lowest remainder.

10. The method of claim 9, further comprising:
following a last comparison, selecting the plurality of coefficients which produced the output frequency having the lowest remainder and providing the plurality of coefficients as the frequency calibration of the reference oscillator.

11. The method of claim 1, further comprising:
using a second predetermined level of discrimination, comparing the output frequency to the reference frequency and providing the first comparison signal when the output frequency is higher than the reference frequency or providing the second comparison signal when the output frequency is lower than the reference frequency.

12. The method of claim 11, wherein the comparing step further comprises:
counting cycles of the output signal and the reference signal;
determining when a second predetermined terminal count has been reached by the reference signal; and
determining a difference between an output signal count and the second predetermined terminal count.

13. The method of claim 11, wherein the comparing step further comprises:
counting cycles of the output signal and the reference signal;
determining when a second predetermined terminal count has been reached by the output signal; and
determining a difference between a reference signal count and the second predetermined terminal count.

14. The method of claim 11, wherein the comparing step further comprises:
counting cycles of the output signal during a predetermined period of time; and
determining a remainder as a difference between an output signal count and a second predetermined reference count.

15. The method of claim 1, further comprising:
for each comparison, providing the plurality of coefficients in binary search increments or in sequential increments.

16. The method of claim 1, further comprising:
selecting a first plurality of coefficients and a second plurality of coefficients, the second plurality of coefficients being an adjacent state of the first plurality of coefficients;
using a second predetermined level of discrimination and the first plurality of coefficients, performing a first comparison of the output frequency to the reference frequency by correspondingly counting cycles of the output signal and the reference signal to form a plurality of corresponding counts until a corresponding count of the plurality of corresponding counts has a first transition to the second predetermined level of discrimination; and
using the second predetermined level of discrimination and the second plurality of coefficients, and commencing with the previous corresponding counts, performing a second comparison of the output frequency to the reference frequency by correspondingly counting cycles of the output signal and the reference signal until a corresponding count of the plurality of corresponding counts has a second transition to the second predetermined level of discrimination.

17. The method of claim 16, further comprising:
when the output signal provided using the first plurality of coefficients has a frequency higher than the output signal provided using the second plurality of coefficients, and when the reference signal corresponding count has provided the second transition, selecting the first plurality of coefficients as the frequency calibration of the oscillator, and when the output signal corresponding count has provided the second transition, selecting the second plurality of coefficients as the frequency calibration of the oscillator.

18. The method of claim 16, further comprising:
when the output signal provided using the first plurality of coefficients has
a frequency lower than the output signal provided using the second plurality of coefficients, and when the reference signal corresponding count has provided the second transition, selecting the second plurality of coefficients as the frequency calibration of the oscillator, and when the output signal corresponding count has provided the second transition, selecting the first plurality of coefficients as the frequency calibration of the oscillator.

19. The method of claim 1, further comprising:
switching a fixed capacitance of the reference oscillator to increase or decrease the reactance of the reference oscillator.

20. The method of claim 1, further comprising:
modifying a control voltage of a variable reactance of the reference oscillator to increase or decrease the reactance of the reference oscillator.

21. A frequency calibration system, the system couplable to an oscillator to receive a reference signal having a reference frequency, the system comprising:
a reference oscillator comprising at least one reactance and a coefficient register, the reference oscillator to provide an oscillation signal having an oscillation frequency;
a frequency divider couplable to the reference oscillator, the frequency divider to provide an output signal having an output frequency;
a comparator coupled to the frequency divider, the comparator to compare the output frequency to the reference frequency using a first predetermined level of discrimination, to provide a first comparison signal when the output frequency is higher than the reference frequency, and to provide a second comparison signal when the output frequency is lower than the reference frequency; and
a reactance modulator coupled to the comparator and couplable to the reference oscillator, the reactance modulator to determine and provide to the coefficient register a plurality of coefficients to increase a reactance of the reference oscillator in response to the first comparison signal or to decrease the reactance of the reference oscillator in response to the second comparison signal.

22. The system of claim 21, wherein the frequency divider is further to multiply or divide the oscillation frequency by a rational number to provide the output signal having the output frequency.

23. The system of claim 21, wherein the comparator further comprises:
a first counter to count cycles of the output signal;
a second counter to count cycles of the reference signal; and
a state detector coupled to the first and second counters, the state detector to determine when a first predetermined terminal count has been reached by the reference signal and to determine a difference between an output signal count and the first predetermined terminal count.

24. The system of claim 21, wherein the comparator further comprises:
a first counter to count cycles of the output signal;
a second counter to count cycles of the reference signal; and
a state detector coupled to the first and second counters, the state detector to determine when a first predetermined terminal count has been reached by the output signal and to determine a difference between a reference signal count and the first predetermined terminal count.

25. The system of claim 21, wherein the comparator is further to count cycles of the output signal and the reference signal and to determine a remainder as a cycle count difference between a first predetermined terminal count and either a reference frequency count or an output frequency count.

26. The system of claim 25, wherein the comparator further comprises:
a remainder register; and
a remainder comparator, the remainder comparator to compare a first remainder with a second remainder, to determine a lowest remainder, and to store in the remainder register the plurality of coefficients which produced the output frequency having the lowest remainder.

27. The system of claim 26, wherein the reactance modulator is further to select the plurality of coefficients which produced the output frequency having the lowest remainder and provide the plurality of coefficients as the frequency calibration of the oscillator.

28. The system of claim 21, wherein the comparator further comprises:
a first counter to count cycles of the output signal; and
a state detector coupled to the first counter, the state detector to determine a remainder as a difference between an output signal count and a predetermined reference count.

29. The system of claim 28, wherein the comparator further comprises:
a remainder register; and
a remainder comparator, the remainder comparator to compare a first remainder with a second remainder, to determine a lowest remainder, and to store in the remainder register the plurality of coefficients which produced the output frequency having the lowest remainder.

30. The system of claim 29, wherein the reactance modulator is further to select the plurality of coefficients which produced the output frequency having the lowest remainder and provide the plurality of coefficients as the frequency calibration of the oscillator.

31. The system of claim 21, wherein the comparator is further to compare the output frequency to the reference frequency using a second predetermined level of discrimination, and to provide the first comparison signal when the output frequency is higher than the reference frequency or provide the second comparison signal when the output frequency is lower than the reference frequency.

32. The system of claim 31, wherein the comparator further comprises:
a first counter to count cycles of the output signal;
a second counter to count cycles of the reference signal; and
a state detector coupled to the first and second counters, the state detector to determine when a second predetermined terminal count has been reached by the reference signal and to determine a difference between an output signal count and the second predetermined terminal count.

33. The system of claim 31, wherein the comparator further comprises:
a first counter to count cycles of the output signal;
a second counter to count cycles of the reference signal; and
a state detector coupled to the first and second counters, the state detector to determine when a second predetermined terminal count has been reached by the output signal and to determine a difference between a reference signal count and the second predetermined terminal count.

34. The system of claim 31, wherein the comparator further comprises:
a first counter to count cycles of the output signal; and
a state detector coupled to the first counter, the state detector to determine a remainder as a difference between an output signal count and a second predetermined reference count.

35. The system of claim 21, wherein the reactance modulator is further to provide the plurality of coefficients in binary search increments or in sequential increments.

36. The system of claim 21, wherein the comparator is further to select a first plurality of coefficients and a second plurality of coefficients, the second plurality of coefficients being an adjacent state of the first plurality of coefficients; to use a second predetermined level of discrimination and the first plurality of coefficients to perform a first comparison of the output frequency to the reference frequency by correspondingly counting cycles of the output signal and the reference signal to form a plurality of corresponding counts until a corresponding count of the plurality of corresponding counts has a first transition to the second predetermined level of discrimination; and to use the second predetermined level of discrimination and the second plurality of coefficients, and commencing with the previous corresponding counts, to perform a second comparison of the output frequency to the reference frequency by correspondingly counting cycles of the output signal and the reference signal until a corresponding count of the plurality of corresponding counts has a second transition to the second predetermined level of discrimination.

37. The system of claim 36, wherein when the output signal provided using the first plurality of coefficients has a frequency higher than the output signal provided using the second plurality of coefficients, the reactance modulator is further to select the first plurality of coefficients as the frequency calibration of the oscillator when the reference signal corresponding count has provided the second transition, and to select the second plurality of coefficients as the frequency calibration of the oscillator when the output signal corresponding count has provided the second transition.

38. The system of claim 36, wherein, when the output signal provided using the first plurality of coefficients has a frequency lower than the output signal provided using the second plurality of coefficients, the reactance modulator is farther to select the second plurality of coefficients as the frequency calibration of the oscillator when the reference signal corresponding count has provided the second transition, and to select the first plurality of coefficients as the frequency calibration of the oscillator when the output signal corresponding count has provided the second transition.

39. The system of claim 21, wherein the at least one reactance comprises a plurality of switchable reactance modules, each switchable reactance module of the plurality of switchable reactance modules comprises a first fixed reactance and a second fixed reactance, and wherein each switchable reactance module is responsive to a corresponding coefficient of the plurality of coefficients to switch between the first fixed reactance and the second fixed reactance.

40. The system of claim 21, wherein the at least one reactance comprises at least one variable reactance responsive to a control voltage selected by at least one, corresponding coefficient of the plurality of coefficients.

41. An apparatus for frequency calibration of a free-running, reference harmonic oscillator, the oscillator to provide an oscillation signal having an oscillation frequency, the oscillator comprising at least one reactance and a coefficient register, the apparatus couplable to receive a reference signal having a reference frequency, the apparatus comprising:
  a frequency divider couplable to the oscillator, the frequency divider to provide an output signal having an output frequency;
  a comparator coupled to the frequency divider, the comparator to compare the output frequency to the reference frequency using a first predetermined level of discrimination, to provide first comparison signal when the output frequency is higher than the reference frequency, and to provide a second comparison signal when the output frequency is lower than the reference frequency; and
  a reactance modulator coupled to the comparator and couplable to the oscillator, the reactance modulator to determine and provide to the coefficient register a plurality of coefficients to increase a reactance of the oscillator in response to the first comparison signal or to decrease the reactance of the oscillator in response to the second comparison signal.

42. The apparatus of claim 41, wherein the frequency divider is further to multiply or divide the oscillation frequency by a rational number to provide the output signal having the output frequency.

43. The apparatus of claim 41, wherein the comparator further comprises:
  a first counter to count cycles of the output signal;
  a second counter to count cycles of the reference signal; and
  a state detector coupled to the first and second counters, the state detector to determine when a first predetermined terminal count has been reached by the reference signal and to determine a difference between an output signal count and the first predetermined terminal count.

44. The apparatus of claim 41, wherein the comparator further comprises:
  a first counter to count cycles of the output signal;
  a second counter to count cycles of the reference signal; and
  a state detector coupled to the first and second counters, the state detector to determine when a first predetermined terminal count has been reached by the output signal and to determine a difference between a reference signal count and the first predetermined terminal count.

45. The apparatus of claim 41, wherein the comparator is further to count cycles of the output signal and the reference signal and to determine a remainder as a cycle count difference between a first predetermined terminal count and either a reference frequency count or an output frequency count.

46. The apparatus of claim 45, wherein the comparator further comprises:
  a remainder register; and
  a remainder comparator, the remainder comparator to compare a first remainder with a second remainder, to determine a lowest remainder, and to store in the remainder register the plurality of coefficients which produced the output frequency having the lowest remainder.

47. The apparatus of claim 46, wherein the reactance modulator is further to select the plurality of coefficients which produced the output frequency having the lowest remainder and provide the plurality of coefficients as the frequency calibration of the oscillator.

48. The apparatus of claim 41, wherein the comparator is further to count cycles of the output signal and to determine a remainder as a cycle count difference between an output signal count and a predetermined reference count.

49. The apparatus of claim 41, wherein the comparator is further to compare the output frequency to the reference frequency using a second predetermined level of discrimination, and to provide the first comparison signal when the output frequency is higher than the reference frequency or provide the second comparison signal when the output frequency is lower than the reference frequency.

50. The apparatus of claim 49, wherein the comparator further comprises:
  a first counter to count cycles of the output signal;
  a second counter to count cycles of the reference signal; and
  a state detector coupled to the first and second counters, the state detector to determine when a second predetermined terminal count has been reached by the reference signal and to determine a difference between an output signal count and the second predetermined terminal count.

51. The apparatus of claim 49, wherein the comparator further comprises:
  a first counter to count cycles of the output signal;
  a second counter to count cycles of the reference signal; and
  a state detector coupled to the first and second counters, the state detector to determine when a second predetermined terminal count has been reached by the output signal and to determine a difference between a reference signal count and the second predetermined terminal count.

52. The apparatus of claim 49, wherein the comparator further comprises:
  a first counter to count cycles of the output signal; and
  a state detector coupled to the first counter, the state detector to determine a remainder as a difference between an output signal count and a predetermined reference count.

53. The apparatus of claim 41, wherein the reactance modulator is further to provide the plurality of coefficients in binary search increments or in sequential increments.

54. The apparatus of claim 41, wherein the comparator is further to select a first plurality of coefficients and a second plurality of coefficients, the second plurality of coefficients being an adjacent state of the first plurality of coefficients; to use a second predetermined level of discrimination and the first plurality of coefficients to perform a first comparison of the output frequency to the reference frequency by correspondingly counting cycles of the output signal and the reference signal to form a plurality of corresponding counts until a corresponding count of the plurality of corresponding counts has a first transition to the second predetermined level of discrimination; and to use the second predetermined level of discrimination and the second plurality of coefficients, and commencing with the previous corresponding counts, to perform a second comparison of the output frequency to the reference frequency by correspondingly counting cycles of the output signal and the reference signal until a corresponding count of the plurality of corresponding counts has a second transition to the second predetermined level of discrimination.

55. The apparatus of claim 54, wherein, when the output signal provided using the first plurality of coefficients has a frequency higher than the output signal provided using the second plurality of coefficients, the reactance modulator is further to select the first plurality of coefficients as the frequency calibration of the oscillator when the reference signal corresponding count has provided the second transition, and to select the second plurality of coefficients as the frequency calibration of the oscillator when the output signal corresponding count has provided the second transition.

56. The apparatus of claim 54, wherein when the output signal provided using the first plurality of coefficients has a frequency lower than the output signal provided using the second plurality of coefficients, the reactance modulator is further to select the second plurality of coefficients as the frequency calibration of the oscillator when the reference signal corresponding count has provided the second transition, and to select the first plurality of coefficients as the frequency calibration of the oscillator when the output signal corresponding count has provided the second transition.

57. The apparatus of claim 41, wherein the reactance modulator is further to modify an impedance of the oscillator in response to the first comparison signal or in response to the second comparison signal.

58. The apparatus of claim 41, wherein the reactance modulator is further to modify a resistance of the oscillator in response to the first comparison signal or in response to the second comparison signal.

59. A frequency calibration system, the system couplable to a first reference oscillator to receive a reference signal having a reference frequency, the system comprising:
an independent, calibrated reference harmonic oscillator, the harmonic oscillator comprising a plurality of reactances and a coefficient register, the harmonic oscillator to provide an oscillation signal having an oscillation frequency;
a frequency divider coupled to the harmonic oscillator, the frequency divider to provide an output signal having an output frequency which is a rational multiple or fraction of the oscillation frequency;
a comparator coupled to the frequency divider, the comparator to compare the output frequency to the reference frequency using a first predetermined level of discrimination, to compare the output frequency to the reference frequency using a second predetermined level of discrimination, and to provide a first comparison signal when the output frequency is higher than the reference frequency or provide a second comparison signal when the output frequency is lower than the reference frequency, the comparator further adared to determine a remainder as a cycle count difference between the reference frequency and the output frequency, to determine a lowest remainder, and to store a corresponding plurality of coefficients which produced the output frequency having the lowest remainder; and
a reactance modulator coupled to the comparator and to the oscillator, the reactance modulator to determine and provide to the coefficient register a plurality of coefficients to increase a reactance of the oscillator in response to the first comparison signal or to decrease the reactance of the oscillator in response to the second comparison signal, the reactance modulator further to select the plurality of coefficients which produced the output frequency having the lowest remainder and provide the plurality of coefficients as the frequency calibration of the harmonic oscillator.

\* \* \* \* \*

UNITED STATES PATENT AND TRADEMARK OFFICE
CERTIFICATE OF CORRECTION

| | | |
|---|---|---|
| PATENT NO. | : 7,548,125 B2 | Page 1 of 1 |
| APPLICATION NO. | : 11/805427 | |
| DATED | : June 16, 2009 | |
| INVENTOR(S) | : Carichner et al. | |

It is certified that error appears in the above-identified patent and that said Letters Patent is hereby corrected as shown below:

In the Patent:
Column 1, Line 44; Please insert the following language before FIELD OF THE INVENTION:

--GOVERNMENT FUNDING

This invention was made with Government support under NSF Grant (EEC) 9986866 awarded by the National Science Foundation. The Government has certain rights in this invention.--

Signed and Sealed this
Sixteenth Day of October, 2012

David J. Kappos
*Director of the United States Patent and Trademark Office*